United States Patent
Satoh et al.

(10) Patent No.: US 6,529,912 B2
(45) Date of Patent: Mar. 4, 2003

(54) DATA COMPRESSING APPARATUS AND A DATA DECOMPRESSING APPARATUS, A DATA COMPRESSING METHOD AND A DATA DECOMPRESSING METHOD, AND A DATA COMPRESSING OR DECOMPRESSING DICTIONARY CREATING APPARATUS AND A COMPUTER READABLE RECORDING MEDIUM STORING A DATA COMPRESSING PROGRAM OR A DATA DECOMPRESSING PROGRAM

(75) Inventors: Noriko Satoh, Kawasaki (JP); Takashi Morihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/096,587

(22) Filed: Jun. 12, 1998

(65) Prior Publication Data

US 2002/0029206 A1 Mar. 7, 2002

(30) Foreign Application Priority Data

Dec. 3, 1997 (JP) ............................... 9-333328

(51) Int. Cl.[7] ............................. G06F 17/30
(52) U.S. Cl. ...................... 707/101; 707/100
(58) Field of Search ................. 707/100, 101

(56) References Cited

U.S. PATENT DOCUMENTS

| 4,843,389 A | | 6/1989 | Lisle et al. ............... 341/106 |
| 4,847,619 A | | 7/1989 | Kato et al. ............... 341/106 |
| 5,373,290 A | * | 12/1994 | Lempel et al. ........... 341/51 |
| 5,442,350 A | * | 8/1995 | Iyer et al. ............... 341/51 |
| 5,684,986 A | * | 11/1997 | Moertl et al. ............ 707/101 |
| 5,838,963 A | * | 11/1998 | Griffiths ................. 707/6 |
| 5,893,102 A | * | 4/1999 | Maimone et al. ......... 707/101 |
| 5,956,504 A | * | 9/1999 | Jagadish et al. ......... 707/101 |
| 6,012,062 A | * | 1/2000 | Jagadish et al. ......... 707/101 |
| 6,047,298 A | * | 4/2000 | Morishita ............... 707/532 |

FOREIGN PATENT DOCUMENTS

| JP | 58-102314 | 6/1983 |
| JP | 62-209948 | 9/1987 |
| JP | 63-148466 | 6/1988 |
| JP | 63-151224 | 6/1988 |
| JP | 1-132222 | 5/1989 |
| JP | 2-034038 | 2/1990 |
| JP | 2-108119 | 4/1990 |
| JP | 2-194772 | 8/1990 |
| JP | 4-299411 | 10/1992 |
| JP | 5-207178 | 8/1993 |
| JP | 6-202844 | 7/1994 |
| JP | 07-064765 | 3/1995 |
| JP | 7-236063 | 9/1995 |

* cited by examiner

*Primary Examiner*—Greta Robinson
(74) *Attorney, Agent, or Firm*—Staas & Halsey LLP

(57) ABSTRACT

A data compressing technique and a data decompressing technique provide a compressing dictionary storing unit for storing a compressing dictionary usable when data to be compressed is compressed, a compressing dictionary use or non-use deciding unit for deciding whether the compressing dictionary is to be used or not when the data to be compressed is compressed, and a coding unit for coding the data to be compressed on the basis of the compressing dictionary when the compressing dictionary use or non-use deciding unit decides the compressing dictionary is to be used, whereas not coding but outputting the data to be compressed when the compressing dictionary use or non-use deciding unit decides the compressing dictionary is not to be used, thereby stably achieving a preferable compression ratio for a small quantity of data such as text data in a text file.

82 Claims, 52 Drawing Sheets

NOTE: St REPRESENTS CATEGORY OF Xt AND S(t-n,t-1) REPRESENTS CATEGORY STRING {St-n, St-n+1,····St-1}

CONTEXT TREE

DATA COMPRESSING APPARATUS AND A DATA DECOMPRESSING APPARATUS, A DATA COMPRESSING METHOD AND A DATA DECOMPRESSING METHOD, AND A DATA COMPRESSING OR DECOMPRESSING DICTIONARY CREATING APPARATUS AND A COMPUTER READABLE RECORDING MEDIUM STORING A DATA COMPRESSING PROGRAM OR A DATA DECOMPRESSING PROGRAM

BACKGROUND OF THE INVENTION (1) Field of the Invention

The present invention relates to a data compressing apparatus and a data decompressing apparatus, a data compressing method and a data decompressing method, a data compressing or decompressing dictionary creating apparatus, and a computer readable recording medium storing a data compressing program or data decompressing program for use when various data such as text data (character codes), image data, etc., is compressed or decompressed.

(2) Description of the Related Art

In recent years, various kinds of data such as character codes, image data, etc., is handled in a computer and a quantity of the data is increasing. Because of this, it is general in the computer that a redundant part in handled data is omitted and compressed so that a storage capacity necessary when the data is managed is decreased, or a transmission rate or transmission efficiency is increased at the time of data communication with a remote place in order to decrease a communication cost.

As data compressing methods, there are, for example, dictionary-based coding in which analogy of inputted data strings is used to code and compress the data strings, and statistical coding in which a frequency of occurrence of inputted data strings is used to code and compress the data strings. Hereinafter, one word of data (one alphabetic character, for example) is referred to as "a character", whereas a train of an arbitrary number of words of data is referred to as "a character string".

In concrete, in the former dictionary-based coding, a predetermined number (code) is assigned to a character or a character string occurring in a data string (data file, for example) that is an object of compression to create a dictionary (code table), and an actually inputted character (character string) is coded on the basis of the dictionary. A character (character string) having a higher probability is generally assigned as a longer character string in the dictionary so that a compression ratio is improved.

LZ77 and LZ78 (refer to "Introduction to Document Data Compression Algorithm", Tomohiko Uematsu, CQ Shuppansha, for example) are representatives of the dictionary coding system.

In LZ 77, characters (character strings) occurring in an inputted data string are stored in a buffer in advance, and a storing position (address) and a length of characters (a character string) in the buffer longest-matching with inputted characters (a character string) that is an object of compression are coded as a code of the inputted character (character string). In LZ78, characters (a character string) occurring in an inputted data string in the past are registered in a dictionary, and a register number of characters (a character string) in the dictionary matching with inputted characters (a character string) that is an object of compression is coded as a code of the inputted characters (character strings).

On the other hand, in the latter statistical coding, a frequency of occurrence of each character (character string) occurring in an inputted data string are calculated, and a shorter code is assigned to a character (character string) having a higher probability so as to improve a compression ratio.

Arithmetic coding (refer to "Arithmetic Coding for Data Compression"/IAN H. WITTEN, et al., Communication of the ACM, Vol.130, No.6, P520–540, "An Adaptive Dependency Source Model for Data Compression Scheme"/D. M. Abrahamson, Communication of the ACM, Vol.132, No.1, P77–83) and Haffman coding (refer to "Dynamic Haffman Coding"/Donald E. Knuth, Journal of Algorithms, Vol.6, P163–180) are representatives of statistical coding.

As statistical coding, there is proposed another system, in which inputted characters are coded into a variable-length code on the basis of, not a probability of one character, but a conditional probability in consideration of dependency between an inputted character and a character immediately before the inputted character (hereinafter, referred to as a context) as shown in FIG. 48, for example, in order to accomplish a higher compression effect (hereinafer, such variable-length coding using a conditional probability in consideration of a context is referred as a context modeling).

In concrete, the context modeling collects a context from an inputted data string (original data), successively registers characters that are objects of coding [refer to FIG. 49($a$)] in a dictionary of a tree structure [hereinafter referred as a context tree, refer to FIG. 49($b$)] counts occurrences of each character each time a character string is inputted which traces characters registered in respective nodes of the context tree to obtain a conditional probability, and codes the original data on the basis of the obtained probability.

Both of dictionary-based coding and statistical coding are classified into three types as shown in items (1) through (3) below according to a way of considering occurrences of a data string that is an object of compression (hereinafter referred as a data string to be compressed):

(1) static coding: coding a character (character string) in a data string to be compressed according to occurrences set in advance irrespective of actual occurrences of the data string to be compressed;

(2) semi-adaptive coding: coding each character (character string) according to occurrences of each character (character string) obtained by scanning all characters (character strings) in a data string to be compressed before compression; and (3) adaptive coding: re-counting occurrences of a character (character string) each time the same character (character string) as a character (character string) inputted in the past is inputted, and coding an inputted character (character string) according to the re-counted occurrences.

In static coding, a computer reads a dictionary set irrespectively of occurrences of an actual data string to be compressed from a memory or the like (set a dictionary: Step 1), fixedly uses the dictionary read out until inputted characters (character strings) end (until judged YES at Step A4) to code each of the inputted characters (character strings) (Steps A2 and A3, NO route at Step A4), as shown in FIG. 50, for example.

On the other hand, in semi-adaptive coding, the computer successively registers data string (characters/character string) to be compressed in a dictionary (Steps B1 and B2, NO route at Step B3), and assigns a code to each of the characters (character strings) registered in the dictionary according to occurrences of the character (character string) to code the dictionary (from YES route at Step B3 to Step B4), as shown in FIG. 51, for example.

The computer then puts back a pointer pointing a character (character string) to be inputted to the head of a data string to be compressed (Step B5), re-inputs the above data string (characters/character strings) to be compressed (Step B6), and codes each of the character (character strings) while referring to the above dictionary (Step B7, NO route at Step B8) until coding of all the data strings to be compressed is completed (until judged YES at Step B8).

In adaptive coding, the computer codes inputted a character (or a character string) referring to a dictionary set in advance (Step C2) when a data string (character or character string) to be compressed is inputted (Step C1) similarly to static coding in the beginning, as shown in FIG. 52, for example. After that, the computer re-counts occurrences of a coded character (character string), registers a code according to the obtained occurrences as a new code of the character (character string) in the dictionary (Step C3), and codes each character (character string) while updating the dictionary (NO route at Step C4) until coding of all the data strings to be compressed is completed (until judged YES at Step C4).

Above static coding performs coding fixedly using a dictionary set in advance. Therefore, the static coding can always achieve a constant compression ratio with respect to data strings to be compressed having similar statistics, and perform a high-speed compressing process. On the other hand, semi-adaptive coding and adaptive coding create or update a dictionary according occurrences of an actually inputted data string to be compressed so as to assign a code conforming to the actual data string to be compressed to the data string to be compressed. Therefore, it is possible to achieve a remarkable compression ratio even if a large quantity of data more than several megabytes or data having different statistics is compressed.

Above semi-adaptive coding and adaptive coding can achieve a good compression ratio when a large quantity of data of several megabytes as described above. However, when compressing a small quantity of data of several kilobytes such as text data in a text file, above semi-adaptive coding and adaptive coding cannot assign an appropriate code according to occurrences to each character (character string) since every character (character string) occurs only a few times in a data string (text file) to be compressed.

When a small quantity of data of several kilobytes is compressed, semi-adaptive coding and adaptive coding cannot achieve a high compression ratio.

On the other hand, above static coding can achieve a constant compression ratio irrespective of a data size of a data string to be compressed. However, a code to be assigned to each character (character string) occurring in the data string to be compressed is fixedly one so that a quantity of data having been compressed is possibly larger than a quantity of original data when data having different statistics from codes assigned in advance is compressed.

SUMMARY OF THE INVENTION

In the light of the above problems, an object of the present invention is to provide a data compressing technique which can stably achieve a preferable compression ratio for a small quantity of data such as text data in a text file and achieve a high compression ratio for data having different statistics, and a decompressing technique which can decompress compressed data obtained in the above compressing technique.

The present invention therefore provide a data compressing apparatus for coding data to be compressed to compress the same comprising a compressing dictionary storing unit for storing a compressing dictionary usable when the data to be compressed is compressed, a compressing dictionary use or non-use deciding unit for deciding whether the compressing dictionary is to be used or not when the data to be compressed is compressed, and a coding unit for coding the data to be compressed on the basis of the compressing dictionary when the compressing dictionary use or non-use deciding unit decides the compressing dictionary is to be used, whereas not coding but outputting said data to be compressed when the compressing dictionary use or non-use deciding unit decides the compressing dictionary is not to be used.

The present invention also provides a data compressing method for coding data to be compressed to compress the same comprising the steps of a deciding step of deciding whether a compressing dictionary is to be used or not when the data to be compressed is compressed, a coding step of coding the data to be compressed on the basis of the compressing dictionary when decided the compressing dictionary is to be used at the deciding step, and a data outputting step of not coding but outputting the data to be compressed when decided the compressing dictionary is not to be used at the deciding step.

The data compressing apparatus and the data compressing method according to this invention decide whether a compressing dictionary is to be used when data to be compressed is compressed, and code the data to be compressed on the basis of the compressing dictionary, or not code but output the data to be compressed, according to the decision. When a compression ratio is degraded if the coding is performed using a dictionary, data to be compressed is not coded (compressed) so that degradation of the compression ratio can be prevented. Whereby, it is possible to achieve a compression effect above a certain level at any time.

The above data compressing apparatus may have a compressed data dividing unit for dividing the data to be compressed into predetermined character data groups, wherein the coding unit codes the data to be compressed by the character data group obtained by the compressed data dividing unit.

If data to be compressed is divided into predetermined character data groups when the data to be compressed is coded and coded (compressed) by divided character data group, it is possible to code plural character data as a bunch at a time so that the coding process can be largely sped up as compared with a case where data to be compressed is coded by one character data.

If the above data to be compressed is document-form data, the above compressed data dividing unit may have a word dictionary storing unit for storing a word dictionary in which desired words are registered as the character data groups occurring in the document-form data, and a word dividing unit for dividing the data to be compressed into words on the basis of the word registered in the word dictionary in-the word dictionary storing unit.

Whereby, it is possible to divide data to be compressed (document-form data) into data units that are "words" having respective meanings and code the data, so as to limit the number of sorts of codes to be assigned to the data to be compressed. Whereby, a quantity of codes having been coded is decreased and a compression ratio is improved. If data to be compressed is coded by word, a decoding process on the decompressing side becomes easy and can be performed at a high speed.

If the above data to be compressed is document-form data, the above compressed data dividing unit may have a word category dictionary storing unit for storing a word category dictionary in which a desired word as each of the character data groups occurring in the document-form data and category information on the word are registered, and a word dividing unit for dividing the data to be compressed into words on the basis of the words registered in the word category dictionary in the word category dictionary storing unit, and a category information adding unit for adding the category information corresponding to each of the words obtained by the word dividing unit on the basis of the category information registered in the word category dictionary.

In the above case, it is possible to group words according to the category information so that the number of sorts of codes to be assigned to the words is decreased and a code to be assigned to each of the words is shortened. Accordingly, a quantity of codes having been coded is decreased and a compression ratio is improved. On the decompressing side, it is possible to readily specify a word to be decoded according to the above category information, which leads to speeding-up of the decoding process.

The above data compressing apparatus may further have a characteristic extracting unit for extracting character data inherent to the data to be compressed as characteristic data of the data to be compressed, and a compressing inherent dictionary creating unit for assigning a predetermined code to each of the characteristic data extracted by the characteristic extracting unit to create a compressing inherent dictionary inherent to the data to be compressed, wherein the coding unit codes the data to be compressed on the basis of the compressing inherent dictionary created by the compressing inherent dictionary creating unit and the compressing dictionary in the compressing dictionary storing unit.

In the above case, the data to be compressed is coded on the basis of both the compressing inherent dictionary and the compressing dictionary. It is thereby possible to largely decrease a probability of coding data to be compressed not registered in the dictionary, which leads to an improvement of the compression ratio.

The above data compressing apparatus may further have an inherent dictionary information outputting unit for outputting information on the compressing inherent dictionary to a decompressing side for the data to be compressed.

On the decompressing side, it is thereby possible to accurately decode (decompress) compressed data having been coded according to the compressing inherent dictionary originally created on the compressing side.

The above data compressing apparatus may still further have a compressing dictionary updating unit for updating the compressing dictionary on the basis of data to be compressed having been coded in the coding unit, wherein the coding unit codes the data to be compressed on the basis of the compressing dictionary updated by the compressing dictionary updating unit.

Whereby, it is possible to always provide a compressing dictionary suitable for data to be compressed that is an object of the next coding, which leads to a further improvement of the compression ratio.

The above compressing dictionary use or non-use deciding unit may decide whether the compressing dictionary is to be used or not on the basis of data contents type information representing a type of data contents of the data to be compressed.

In the above case, without actually detecting contents of data to be compressed, it is possible to simply decide use or non-use of the compressing dictionary. If content (characteristic) of data to be compressed on the basis of the above data contents type information, it is possible to quickly determine whether use of the compressing dictionary is effective when the data to be compressed is coded so as to decide the compressing dictionary is to be used or not. Accordingly, it is possible to achieve a compression effect above a certain level while speeding up the whole coding process.

The above compressing dictionary use or non-use deciding unit may decide whether the compressing dictionary is to be used or not according to whether specific character data occurs in the data to be compressed or not.

In the above case, it is possible to simply decide whether the compressing dictionary is to be used or not only by actually detecting contents of the data to be compressed and determining whether specific character data occurs in the data to be compressed so that a characteristic of the actual data to be compressed is quickly determined. It is therefore possible to achieve a compression effect above a certain level while improving reliability and a processing speed of the coding process.

The above compressing dictionary use or non-use deciding unit may decide whether the compressing dictionary is to be used or not according to occurrence frequency of specific character data in the data to be compressed.

If it is decided that the compressing dictionary is to be used on data to be compressed having a characteristic that specific character data frequently occurs therein, for example, a shorter code may be assigned to specific character data of a high occurrence frequency using the compressing dictionary. It is therefore possible to certainly achieve a compression effect above a certain level.

The above compressing dictionary use or non-use deciding unit may alternatively decide whether the compressing dictionary is to be used or not according to a quantity of compressed data having been coded by the coding unit.

In the above case, if it is decided that the compressing dictionary is not to be used for data to be compressed having a characteristic that a quantity of compressed data having been coded is larger than a quantity of original data, it is possible to largely decrease a probability of degrading a compression efficiency so that a compression effect above a certain level is ensured.

The above data compressing apparatus may further have a dictionary use or non-use information outputting unit for outputting information on use or non-use of the compressing dictionary decided by the compressing dictionary use or non-use deciding unit to a decompressing side for the data to be compressed.

In the above case, the decompressing side can quickly determine whether inputted compressed data has been coded using the compressing dictionary, which largely contributes to speeding-up of the decoding process.

The present invention further provides a data compressing apparatus for coding data to be compressed to compress the same comprising a compressing dictionary storing unit for storing plural kinds of compressing dictionaries usable when the data to be compressed is compressed, a compressing dictionary selecting unit for selecting a compressing dictionary to be used among the plural kinds of compressing dictionaries on the basis of data contents type information representing a type of data contents of the data to be compressed, and a coding unit for coding the data to be compressed on the basis of the compressing dictionary selected by the compressing dictionary selecting unit.

The present invention also provides a data compressing method for coding data to be compressed to compress the same comprising the steps of a dictionary selecting step of selecting a compressing dictionary to be used among plural kinds of compressing dictionaries on the basis of data contents type information representing a type of data contents of the data to be compressed, and a coding step of coding the data to be compressed on the basis of the compressing dictionary selected at the dictionary selecting step.

According to the data compressing apparatus and the data compressing method of this invention, a compressing dictionary to be used is selected among plural kinds of compressing dictionaries on the basis of the data contents type information representing a type of data contents of data to be compressed, and the data to be compressed is coded on the basis of the selected compressing dictionary. Only by inputting the above data contents type information, it is possible to quickly select and use a compressing dictionary suitable for contents (characteristic) of data to be compressed to code the data to be compressed. It is therefore possible to certainly achieve a high compression effect for data to be compressed having different characteristics while improving the processing speed of the whole compressing process.

The present invention still further provides a data compressing apparatus for coding data to be compressed to compress the same comprising a compressing dictionary storing unit for storing plural kinds of compressing dictionaries usable when the data to be compressed is compressed, a compressing dictionary selecting unit for selecting a compressing dictionary including specific character data of high occurrence frequency in the data to be compressed among the plural kinds of compressing dictionaries, and a coding unit for coding the data to be compressed on the basis of the compressing dictionary selected by the compressing dictionary selecting unit.

The present invention also provides a data compressing method for coding data to be compressed to compress the same comprising the steps of a dictionary selecting step of selecting a compressing dictionary including specific character data of high occurrence frequency in the data to be compressed among plural kinds of compressing dictionaries, and a coding step of coding the data to be compressed on the basis of the compressing dictionary selected at the dictionary selecting step.

According to the data compressing apparatus and the data compressing method of this invention, a compressing dictionary including character data of high occurrence frequency in data to be compressed is used to code the data to be compressed at any time so that a compression effect can be further improved. Since a dictionary is selected depending on whether the dictionary includes character data of high occurrence frequency in data to be compressed, the dictionary selecting process can be sped up, thus the whole coding process can be sped up.

The present invention still further provides a data compressing apparatus for coding data to be compressed to compress the same comprising a compressing dictionary storing unit for storing plural kinds of compressing dictionaries usable when the data to be compressed is compressed, a coding unit for coding the data to be compressed using any one of the plural kinds of compressing dictionaries, and a compressing dictionary selecting unit for selecting a compressing dictionary to be used among the plural kinds of compressing dictionaries according to a quantity of compressed data having been coded by the coding unit.

The present invention also provides a data compressing method of coding data to be compressed to compress the same comprising the steps of a coding step of compressing data to be compressed, and a dictionary selecting step of selecting a compressing dictionary to be used among plural kinds of compressing dictionaries according to a quantity of compressed data coded at the coding step.

According to the data compressing apparatus and the data compressing method of this invention, a compressing dictionary to be used is selected among plural kinds of compressing dictionaries according to a quantity of compressed data that is data to be compressed having been coded. It is therefore possible to select the most suitable compressing dictionary in consideration of a quantity of compressed data having been coded at any time, thus increase a compression effect more certainly.

Each of the above data compressing apparatus may further have a compressed data dividing unit for dividing the data to be compressed into predetermined character data groups, wherein the coding unit codes the data to be compressed by the character data group obtained by the compressed data dividing unit on the basis of the compressing dictionary selected by the compressing dictionary selecting unit.

In the above case, it is possible to code plural character data as a bunch at a time so that the coding (compressing) process after a dictionary is selected can be sped up as compared with a case where data to be compressed is coded by one character data.

If the above data to be compressed is document-form data, the compressed data dividing unit may have a word dictionary storing unit for storing a word dictionary in which desired words as the character data groups occurring in the document-form data are registered, and a word dividing unit for dividing the data to be compressed into words on the basis of the words registered in the word dictionary in the word dictionary storing unit.

In the above case, data to be compressed (document-form data) is divided into data units that are "words" having respective meanings and coded, whereby the number of sorts of codes to be assigned to the data to be compressed is limited. Accordingly, a quantity of codes after the coding process is performed using a selected compressing dictionary is decreased, thus a compression ratio is improved. If the data to be compressed is coded by word, the decompressing process on the decompressing side can be easy and sped up.

If the above data to be compressed is document-form data, the above compressed data dividing unit may alternatively have a word category dictionary storing unit for storing a word category dictionary in which a desired word as each of the character data groups occurring in the document-form data and category information on the word are registered, a word dividing unit for dividing the data to be compressed into words on the basis of the words registered in the word category dictionary in the word category dictionary storing unit, and a category information adding unit for adding the category information corresponding to each of the words obtained by the word dividing unit on the basis of the category information registered in the word category dictionary.

In the above case, words can be groups according to the category information. It is therefore possible to decrease the number of sorts of codes to be assigned to the words and shorten a code to be assigned to each of the words so that a quantity of codes having been coded using a selected compressing dictionary is further decreased, thus a compression ratio is improved. The decompressing side can thereby easily specify a word to be decoded according to the above category information, which leads to speeding-up of the decoding process.

Each of the above data compressing apparatus may further have a characteristic extracting unit for extracting character data inherent to the data to be compressed as characteristic data of the data to be compressed, and a compressing inherent dictionary creating unit for assigning a predetermined code to each of the characteristic data extracted by the characteristic extracting unit to create a compressing inherent dictionary inherent to the data to be compressed, wherein the coding unit codes the data to be compressed on the basis of the compressing inherent dictionary created by the compressing inherent dictionary creating unit and the compressing dictionary selected by the compressing dictionary selecting unit.

In the above case, data to be compressed is coded on the basis of both a compressing inherent dictionary and a compressing dictionary selected as above so that a probability of coding data to be compressed not registered in the dictionary is largely decreased, thus a compression ratio is further improved.

In this case, the above data compressing apparatus may have an inherent dictionary information outputting unit for outputting information on the compressing inherent dictionary to a decompressing side for the data to be compressed.

In the above case, the decompressing side can accurately decode (decompress) compressed data having been coded according to a compressing inherent dictionary originally created on the compressing side.

Each of the data compressing apparatus may further have a compressing dictionary updating unit for updating the compressing dictionary on the basis of data to be compressed having been coded by code in the coding unit, wherein the coding unit codes the data to be compressed on the basis of the compressing dictionary updated by the compressing dictionary updating unit.

In the above case, since the above compressing dictionary selected and used in the coding is updated on the basis of compressed data that is data to be compressed having been coded by code, it is possible to provide a plurality of compressing dictionaries suitable for the data to be compressed that is an object of the next coding as the coding process is proceeded so that a compression ratio is further improved.

In the above case, the above data compressing apparatus may have a selected dictionary information outputting unit for outputting selected dictionary information on the compressing dictionary selected by the compressing dictionary selecting unit to a decompressing side for the data to be compressed.

In this case, the decompressing side can quickly determine whether inputted compressed data has been coded using any one of the plural kinds of compressing dictionaries, which largely contributes to speeding-up of the decoding process.

The present invention still further provides a data decompressing apparatus for decompressing compressed data to decode the same comprising a decompressing dictionary storing unit for storing a decompressing dictionary usable when the compressed data is decompressed, a decompressing dictionary use or non-use deciding unit for deciding whether the decompressing dictionary is to be used or not when the compressed data is decompressed, and a decoding unit for decoding the compressed data on the basis of the decompressing dictionary when the decompressing dictionary use or non-use deciding unit decides the decompressing dictionary is to be used, whereas not decoding but outputting the compressed data when the decompressing dictionary use or non-use deciding unit decides the decompressing dictionary is not to be used.

The present invention also provides a data decompressing method for decoding compressed data to decompress the same comprising the steps of a receiving step of receiving dictionary use or non-use information on whether a decompressing dictionary is to be used or not when the compressed data is decompressed from a compressing side, a deciding step of deciding whether the decompressing dictionary is to be used according to the dictionary use or non-use information received at the receiving step, a decoding step of decoding the compressed data on the basis of the decompressing dictionary when decided the decompressing dictionary is to be used at the deciding step, and a data outputting step of not decoding but outputting the compressed data when decided the decompressing dictionary is not to be used at the deciding step.

According to the data decompressing apparatus and the data decompressing method of this invention, whether a decompressing dictionary is to be used when compressed data is decompressed is determined when the compressed data is decompressed, and the compressed data is decoded on the basis of the decompressing dictionary, or the compressed data is not decoded but outputted, according to a result of the decoding. It is therefore possible to omit unnecessary decoding process depending on a state of compression (including a time of non-compression) of compressed data so that the decoding process is performed very efficiently.

The above decoding unit may decode the compressed data by predetermined character data group on the basis of the decompressing dictionary.

In the above case, plural character data can be decoded as a bunch at a time so that the decoding (decompressing) process is largely sped up as compared with a case where the compressed data is decoded by one character data.

If data to be compressed that is the compressed data before compressed is document-form data, the character data group maybe a desired word in the document-form data, whereby the compressed data is decoded by word unit that is "a word" having own meaning. Thus, the decoding process can be performed at a high speed.

If the compressed data is decoded on the basis of the category information on the above word, a word to be decoded can be readily specified on the basis of the above category information, which leads to further speeding-up of the decoding process.

The above decompressing apparatus may further have a decompressing inherent dictionary storing unit for storing a dictionary having character data inherent to data to be compressed that is the compressed data before compressed as characteristic data of the compressed data, in which a predetermined code is assigned to each of the characteristic data as decompressing dictionary, wherein the decoding unit decodes the compressed data on the basis of the decompressing inherent dictionary in the decompressing inherent dictionary storing unit and the decompressing dictionary in the decompressing dictionary storing unit.

The above data decompressing apparatus decodes compressed data on the basis of both the decompressing inherent dictionary and the decompressing dictionary. Accordingly, it is possible to largely decrease a probability of decoding data to be compressed not registered in the dictionary, thus improve a decoding efficiency.

The above decompressing inherent dictionary storing unit may receive information on a compressing inherent dictionary created by extracting character data inherent to the data to be compressed as characteristic data of the data to be compressed and assigning a predetermined code to each of the characteristic data from a compressing side having generated the compressed data to store the decompressing inherent dictionary.

In the above case, a dictionary having the same contents as an inherent dictionary having been used on the compressing side can be created as the above decompressing inherent dictionary so that compressed data having been coded on the basis of a compressing inherent dictionary originally created on the compressing side can be decoded very accurately.

The above data decompressing apparatus may further have a decompressing dictionary updating unit for updating the decompressing dictionary on the basis of a result of decoding by the decoding unit, wherein the decoding unit decodes the compressed data on the basis of the decompressing dictionary updated by the decompressing dictionary updating unit.

In the above case, it is possible to provide a decompressing dictionary suitable for compressed data that is an object of the next decoding at any time, which leads to an improvement of the decoding efficiency.

The above decompressing dictionary use or non-use deciding unit may decide whether the decompressing dictionary is to be used or not according to information on use or non-use of a compressing dictionary received from a compressing side having generated the compressed data.

In the above case, it is possible to quickly determine whether the inputted compressed data has been coded using a compressing dictionary, which largely contributes to speeding-up of the decoding process.

The present invention still further provides a data decompressing apparatus for decoding compressed data to decompress the same comprising a decompressing dictionary storing unit for storing plural kinds of decompressing dictionaries usable when the compressed data is decompressed, a decompressing dictionary selecting unit for receiving selected dictionary information on a compressing dictionary selected on the basis of data contents type information representing a type of data contents of data to be compressed from a compressing side having generated the compressed data to select a decompressing dictionary to be used among the plural kinds of decompressing dictionaries on the basis of the received selected dictionary information, and a decoding unit for decoding the compressed data on the basis of the decompressing dictionary selected by the decompressing dictionary selecting unit.

The present invention also provides a data decompressing method for decoding compressed data to decompress the same comprising the steps of a receiving step of receiving selected dictionary information on a compressing dictionary selected on the basis of data contents type information representing a type of data contents of data to be compressed from a compressing side having generated the compressed data, a dictionary selecting step of selecting a decompressing dictionary to be used among plural kinds of decompressing dictionaries on the basis of the selected dictionary information received at the receiving step, and a decoding step of decoding the compressed data on the basis of the decompressing dictionary selected at the dictionary selecting step.

According to the data decompressing apparatus and the data decompressing method of this invention, the decompressing side receives the selected dictionary information on a compressing dictionary selected on the basis of the data contents type information representing a type of data contents of data to be compressed from a compressing side, selects a decompressing dictionary to be used among plural kinds of decompressing dictionaries on the basis of the received selected dictionary information, and decodes the compressed data on the basis of the selected decompressing dictionary. It is therefore possible to quickly select a decompressing dictionary having the same contents as a compressing dictionary selected on the basis of the above data contents type information on the compressing side at any time so as to accurately decode (decompress) the compressed data.

The present invention still further provides a decompressing apparatus for decoding compressed data to decompress the same comprising a decompressing dictionary storing unit for storing plural kinds of decompressing dictionaries usable when the compressed data is decompressed, a decompressing dictionary selecting unit for receiving selected dictionary information on a compressing dictionary selected as a compressing dictionary including specific character data of high occurrence frequency in data to be compressed from a compressing side having generated the compressed data to select a decompressing dictionary to be used among the plural kinds of decompressing dictionaries on the basis of the received selected dictionary information, and a decoding unit for decoding the compressed data on the basis of the decompressing dictionary selected by the decompressing dictionary selecting unit.

The present invention also provides a data decompressing method for decoding compressed data to decompress the same comprising the steps of a receiving step of receiving selected dictionary information on a compressing dictionary selected as a compressing dictionary including specific character data of high occurrence frequency in data to be compressed from a compressing side having generated the compressed data, a dictionary selecting step of selecting a decompressing dictionary to be used among plural kinds of decompressing dictionaries on the basis of the selected dictionary information received at the receiving step, and a decoding step of decoding the compressed data on the basis of the decompressing dictionary selected at the dictionary selecting step.

According to the data decompressing apparatus and the data decompressing method of this invention, the decoding side receives the selected dictionary information on a compressing dictionary selected as a compressing dictionary including specific character data of high occurrence frequency from the compressing side, selects a decompressing dictionary to be used among plural kinds of decompressing dictionaries on the basis of the received selected dictionary information, and decodes compressed data on the basis of the decompressing dictionary. It is therefore possible to quickly select a decompressing dictionary having the same contents as a compressing dictionary selected as a compressing dictionary including specific character data of high occurrence frequency on the compressing side, so as to accurately decode (decompress) the compressed data.

The present invention still further provides a data decompressing apparatus for decoding compressed data to decompress the same comprising a decompressing dictionary storing unit for storing plural kinds of dictionaries usable when the compressed data is decompressed, a decompressing dictionary selecting unit for receiving selected dictionary information on a compressing dictionary selected according to a quantity of compressed data having been coded from a compressing side having generated the compressed data to select a decompressing dictionary to be used among the plural kinds of decompressing dictionaries on the basis of the received selected dictionary information, and a decoding unit for decoding the compressed data on the basis of the decompressing dictionary selected by the decompressing dictionary selecting unit.

The present invention also provides a data decompressing method for decoding compressed data to decompress the same comprising the steps of a receiving step of receiving selected dictionary information on a compressing dictionary selected according to a quantity of compressed data having been coded from a compressing side having generated the compressed data, a dictionary selecting step of selecting a decompressing dictionary to be used among plural kinds of decompressing dictionaries on the basis of the selected dictionary information received at the receiving step, and a decoding step of decoding the compressed data on the basis of the decompressing dictionary selected at the dictionary selecting step.

According to the data decompressing apparatus and the data decompressing method of this invention, the decoding side receives the selected dictionary information on a compressing dictionary selected according to a quantity of compressed data having been coded from the compressing side, selects a decompressing dictionary to be used among plural kinds of decompressing dictionaries on the basis of the received selected dictionary information, and decodes compressed data on the basis of the decompressing dictionary. It is therefore possible to quickly select a decompressing dictionary having the same contents as a compressing dictionary selected according to a quantity of compressed data having been coded on the compressing side at any time so as to accurately decode (decompress) the compressed data.

The above decoding unit may decode the compressed data by predetermined character data group on the basis of the decompressing dictionary selected by the decompressing dictionary selecting unit.

In the above case, the compressed data is decoded by plural character data as a bunch at a time so that the decoding (decompressing) process after a dictionary is selected is performed at a higher speed, as compared with a case where the compressed data is decoded by one character data.

If data to be compressed that is the compressed data before compressed is document-form data, the character data group maybe a desired word in the document-form data. In this case, the compressed data can be decoded by word unit that is "a word" having own meaning so that the decoding process can be performed at a high speed.

The above decoding unit may decode the compressed data on the basis of category information on the word.

In the above case, it is possible to readily specify a word to be decoded on the basis of the above category information so that the decoding process is further sped up.

The above decompressing apparatus may further have a decompressing inherent dictionary storing unit for storing a dictionary having character data inherent to data to be compressed that is the compressed data before compressed as characteristic data of the compressed data, in which a predetermined code is assigned to each of the characteristic data as decompressing dictionary, wherein the decoding unit decodes the compressed data on the basis of the decompressing inherent dictionary in the decompressing inherent dictionary storing unit and the decompressing dictionary selected by the decompressing dictionary selecting unit.

Each of the above data decompressing dictionary decodes compressed data on the basis of both an inherent dictionary in which a predetermined code is assigned to each of character (characteristic) data inherent to data to be compressed that is the compressed data before compressed and a decompressing dictionary selected as above. It is therefore possible to largely decrease a probability of data to be compressed not registered in the selected dictionary, thus further improve the decoding efficiency.

The above decompressing inherent decompressing dictionary storing unit may receive information on a compressing inherent dictionary created by extracting character data inherent to the data to be compressed as characteristic data of the data to be compressed and assigning a predetermined code to each of the characteristic data from a compressing side having generated the compressed data to store the decompressing inherent dictionary.

In the above case, a dictionary having the same contents as an inherent dictionary used on the compressing side is generated on the decompressing side, so that data to be compressed having been coded according to the compressing inherent dictionary originally created on the compressing side can be decoded very accurately.

Each of the above data decompressing apparatus may further have a decompressing dictionary updating unit for updating the decompressing dictionary on the basis of a result of decoding by the decoding unit, wherein the decoding unit decodes the compressed data on the basis of the decompressing dictionary updated by the decompressing dictionary updating unit.

In the above case, as the decoding process is proceeded, it is possible to provide plural kinds o decompressing dictionaries suitable for compressed data that is an object of the next decoding, which leads to further improvement of the decoding efficiency.

The present invention still further provides a data compressing or decompressing dictionary creating apparatus for creating a dictionary used when data to be compressed is compressed or compressed data is decompressed comprising an occurrence frequency counting unit for counting an occurrence frequency of each character data occurring in data for creating a dictionary, a high occurrence frequency character data detecting unit for detecting character data whose occurrence frequency is higher than predetermined frequency on the basis of the occurrence frequency of each of the character data counted by the occurrence frequency counting unit, a code assigning unit for assigning a predetermined code to each of the high occurrence frequency character data detected by the high occurrence frequency character data detecting unit, and a dictionary generating unit for combining each of the high occurrence frequency character data with the code and outputting a combination thereof, thereby generating the dictionary.

According to the above data compressing or decompressing dictionary creating apparatus of this invention, a predetermined code is assigned to each of character data whose occurrence frequency is higher than predetermined frequency on the basis of occurrence frequency of each character data occurring in data for creating a dictionary, and the character data of high occurrence frequency is combined with the code and outputted, whereby a data compressing or decompressing dictionary is automatically created. It is therefore possible to omit labor to create the dictionary.

The present invention still further provides a data compressing or decompressing dictionary creating apparatus for creating a dictionary used when data to be compressed is compressed or compressed data is decompressed comprising a data dividing unit for diving data for creating a dictionary into predetermined character data groups, an occurrence frequency counting unit for counting an occurrence frequency of each of the character data groups obtained by the data dividing unit, a high occurrence frequency character data group detecting unit for detecting a character data group whose occurrence frequency is higher than predetermined frequency on the basis of the occurrence frequency of each of the character data groups counted by the occurrence frequency counting unit, a code assigning unit for assigning a predetermined code to the high occurrence frequency character group detected by the high occurrence frequency character group, and a dictionary generating unit for combining the high occurrence frequency character group with the code and outputting a combination thereof, thereby generating the dictionary.

According to the above data compressing or decompressing dictionary creating apparatus of this invention, a predetermined code is assigned to character group whose occurrence frequency is higher than predetermined occurrence frequency on the basis of occurrence frequency of each character data group obtained by dividing data for creating a dictionary, and the high occurrence frequency character data group is combined with the code and outputted, whereby a dictionary suitable for coding and decoding of data by the character data group can be automatically created. It is therefore possible to omit a labor to create the dictionary corresponding to character data groups.

If the data for creating a dictionary is document-form data, the character group may be a desired word in the document-form data. In which case, since a dictionary most suitable for a coding process and a decoding process by data unit that is "a word" having own meaning is created, the coding process for data to be compressed and the decoding process for compressed data are largely sped up.

At this time, the code assigning unit may add category information on the word to the word. In which case, the words can be grouped according to the category information so that the number of sorts of codes to be assigned to the words is decreased, and a code to be assigned to each word is shortened. It is therefore possible to decrease a size of the dictionary.

By using the dictionary, a quantity of codes after the coding process is decreased and a compression ratio is increased on the compressing (coding) side. On the decompressing side, a word to be decoded can be readily specified according to the category information, which leads to speeding-up of the decoding process.

The present invention still further provides a recording medium readable by a computer in which a data compressing program for coding data to be compressed to compress the same is recorded characterized in that the data compressing program makes the computer function as a compressing dictionary storing unit for storing a compressing dictionary usable when the data to be compressed is compressed, a compressing dictionary use or non-use deciding unit for deciding whether the compressing dictionary is to be used or not when the data to be compressed is compressed, and a coding unit for coding the data to be compressed on the basis of the compressing dictionary when the compressing dictionary use or non-use deciding unit decides the compressing dictionary is to be used, whereas not coding but outputting the data to be compressed when the compressing dictionary use or non-use deciding unit decides the compressing dictionary is not to be used.

The present invention still further provides a recording medium readable by a computer in which a data compressing program for coding data to be compressed to compress the same is recorded characterized in that the data compressing program makes the computer function as a compressing dictionary storing unit for storing plural kinds of compressing dictionaries usable when the data to be compressed is compressed, a compressing dictionary selecting unit for selecting a compressing dictionary to be used among the plural kinds of compressing dictionaries on the basis of data contents type information representing a type of data contents of the data to be compressed, and a coding unit of coding the data to be compressed on the basis of the compressing dictionary selected by the compressing dictionary selecting unit.

The present invention still further provides a recording medium readable by a computer in which a data compressing program for coding data to be compressed to compress the same is recorded characterized in that the data compressing program makes the computer function as a compressing dictionary storing unit for storing plural kinds of compressing dictionaries usable when the data to be compressed is compressed, a compressing dictionary selecting unit for selecting a compressing dictionary including specific character data of high occurrence frequency in the data to be compressed among the plural kinds of compressing dictionaries, and a coding unit for coding the data to be compressed on the basis of the compressing dictionary selected by the compressing dictionary selecting unit.

The present invention still further provides a recording medium readable by a computer in which a data compressing program for coding data to be compressed to compress the same is recorded characterized in that the data compressing program makes the computer function as a compressing dictionary storing unit for storing plural kinds of compressing dictionaries usable when the data to be compressed is compressed, a coding unit for coding the data to be compressed using any one of the plural kinds of compressing dictionaries, and a compressing dictionary selecting unit for selecting a compressing dictionary to be used among the plural kinds of compressing dictionaries according to a quantity of compressed data having been coded by the coding unit.

In the above recording medium readable by a computer in which a data compressing program is recorded according to this invention, a program for realizing the above data compressing apparatus (data compressing method) is recorded. Only by reading the program recorded in the recording medium by a computer, the computer may function as the above data compressing apparatus. Therefore, generalization or spread of the above data compressing apparatus is largely expected.

The present invention further provides a recording medium readable by a computer in which a data decompressing program for decoding compressed data to decompress the same characterized in that the data decompressing program makes the computer function as a decompressing dictionary storing unit for storing a decompressing dictionary usable when the compressed data is decompressed, a decompressing dictionary use or non-use deciding unit for deciding whether the decompressing dictionary is to be used or not when the compressed data is decompressed, and a decoding unit for decoding the compressed data on the basis of the compressing dictionary when the decompressing dictionary use or non-use deciding unit decided the decompressing dictionary is to be used, whereas not decoding but outputting the compressed data when the decompressing dictionary use or non-use deciding unit decides the decompressing dictionary is not to be used.

The present invention still further provides a recording medium readable by a computer in which a data decompressing program for decoding compressed data to decompress the same characterized in that the data decompressing program makes the computer function as a decompressing dictionary storing unit for storing plural kinds of decompressing dictionaries usable when the compressed data is decompressed, a decompressing dictionary selecting unit for receiving selected dictionary information on a compressing dictionary selected on the basis of data contents type information representing a type of data contents of data to be compressed from a compressing side having generated the compressed data to select a decompressing dictionary to be used among the plural kinds of decompressing dictionaries on the basis of the received selected dictionary information, and a decoding unit for decoding the compressed data on the basis of the decompressing dictionary selected by the decompressing dictionary selecting unit.

The present invention still further provides a recording medium readable by a computer in which a data decompressing program for decoding compressed data to decompress the same characterized in that the data decompressing program makes the computer function as a decompressing dictionary storing unit for storing plural kinds of decompressing dictionaries usable when the compressed data is decompressed, a decompressing dictionary selecting unit for receiving selected dictionary information on a compressing dictionary selected as a compressing dictionary including specific character data frequently occurring in data to be compressed from a compressing side having generated the compressed data to select a decompressing dictionary to be used among the plural kinds of decompressing dictionaries on the basis of the received selected dictionary information, and a decoding unit for decoding the compressed data on the basis of the decompressing dictionary selected by the decompressing dictionary selecting unit.

The present invention still further provides a recording medium readable by a computer in which a data decompressing program for decoding compressed data to decompress the same characterized in that the data decompressing program makes the computer function as a decompressing dictionary storing unit for storing plural kinds of decompressing dictionaries usable when the compressed data is decompressed, a decompressing dictionary selecting unit for receiving selected dictionary information on a compressing dictionary selected according to a quantity of compressed data having been coded from a compressing side having generated the compressed data to select a decompressing dictionary to be used among the plural kinds of decompressing dictionaries on the basis of the received selected dictionary information, and a decoding unit for decoding the compressed data on the basis of the decompressing dictionary selected by the decompressing dictionary selecting unit.

In the recording medium readable by a computer in which a data decompressing program is recorded according to this invention, a program for realizing the above data decompressing apparatus (data decompressing method) is recorded. Only reading the program recorded in the recording medium by a computer, it is possible to function the computer as the above data decompressing apparatus. Therefore, generalization or spread of the above data decompressing apparatus is largely expected.

DESCRIPTION OF THE PREFERRED EMBODIMENTS (A) Description of a First Embodiment of the Invention Hereinafter, description will be made of a first embodiment of this invention with reference to the drawings.

Figure 2:
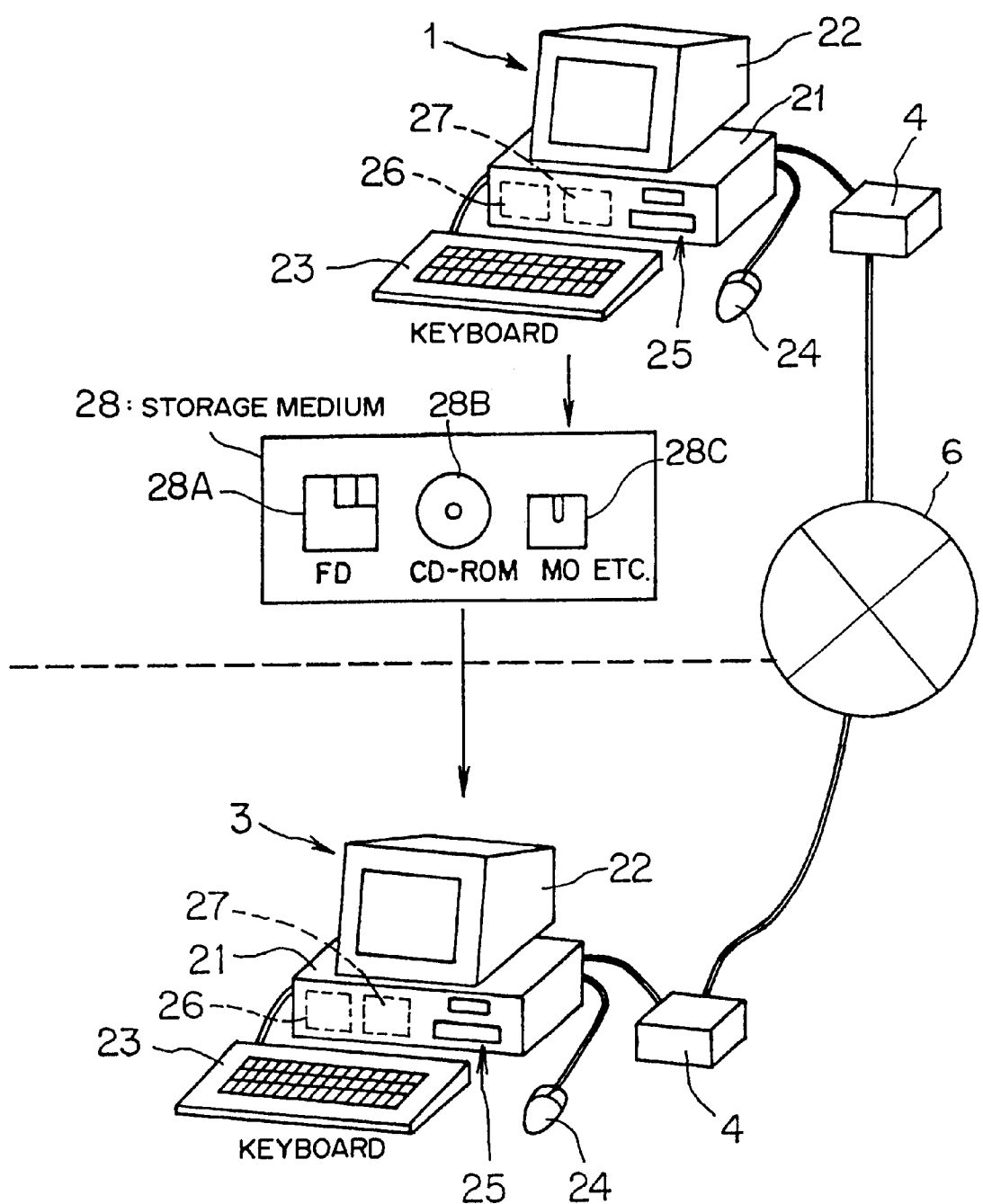
FIG. 2 is a block diagram showing a computer system to which the data compressing apparatus and a data decompressing apparatus according to the first embodiment of this invention are applied.

FIG. 2 is a block diagram showing a computer system to which a data compressing apparatus and a data decompressing apparatus according to the first embodiment of this invention are applied. In the system according to this embodiment, each of personal computers 1 and 2 is connected to a certain network 6 such as Internet or the like via a network connecting apparatus 4 such as a modem, a TA (Terminal Adapter) or the like, as shown in FIG. 2.

Each of the personal computers 1 and 3 has, as shown in FIG. 2, a personal computer main body 21, a display (display screen) 22, a keyboard 23 and a mouse (pointing device) 24, etc. The user can make a desired document or program with an editor in the personal computer 1 or 3, store the made document data or program data as a document file or a program execute file in a hard disk (storage apparatus) 27 in the main body 21 through a process by a CPU (Central Processing Unit) 26, or provide the document data or the program data (transfer the file) to another personal computer 3 or 1 over the network 6.

When the above document data or program data is stored in the hard disk 27 or transferred over the network 6, it is generally desirable that the data is coded, compressed, and stored/transferred in order to save a memory capacity, or decrease a data transmission quantity or a data transmission time, then the compressed data is decompressed (decoded) when displayed on the display 22 or printed out.

According to this embodiment, a data compressing program or a data decompressing program is stored in, for example, the hard disk 27, and the CPU 26 operates according to the program, whereby the personal computer 1 or 3 is used as a data compressing apparatus which codes and compresses document data (data to be compressed) or a decompressing apparatus which decodes and decompresses coded and compressed data (compressed data).

The user can make each of the above data compressing program and the data decompressing program using an editor or the like of the personal computer 1 or 3, or receive the program made in another personal computer 3 or 1 over the network 6 and store it in the hard disk 27. Alternatively, the user can retain (install) the program in the hard disk 27 by reading the program stored in advance in one of various types of storage medium 28 such as a floppy disk (FD) 28a, a CD-ROM 28B, an MO (magneto-optic disk) 28C and the like by CPU 26 through a disk drive 25. Whereby, the CPU (computer) 26 can function as a data compressing apparatus or a data decompressing apparatus, which leads to improvement or spread of the data compressing apparatus and the data decompressing apparatus.

Hereinafter, the above data compressing apparatus will be referred to as a compressing side, whereas the data decompressing apparatus will be referred to as a decompressing side. Besides, description will be hereinafter made on an assumption that the personal computer 1 is used as the data compressing apparatus, whereas the personal computer 3 is used as the data decompressing apparatus (that is, the CPU 26 of the personal computer 1 functions as the data compressing apparatus, whereas the CPU 26 of the personal computer 3 functions as the data decompressing apparatus), for the sake of convenience.

(a) Description of the Compressing Side (Data Compressing Apparatus)

Figure 1:
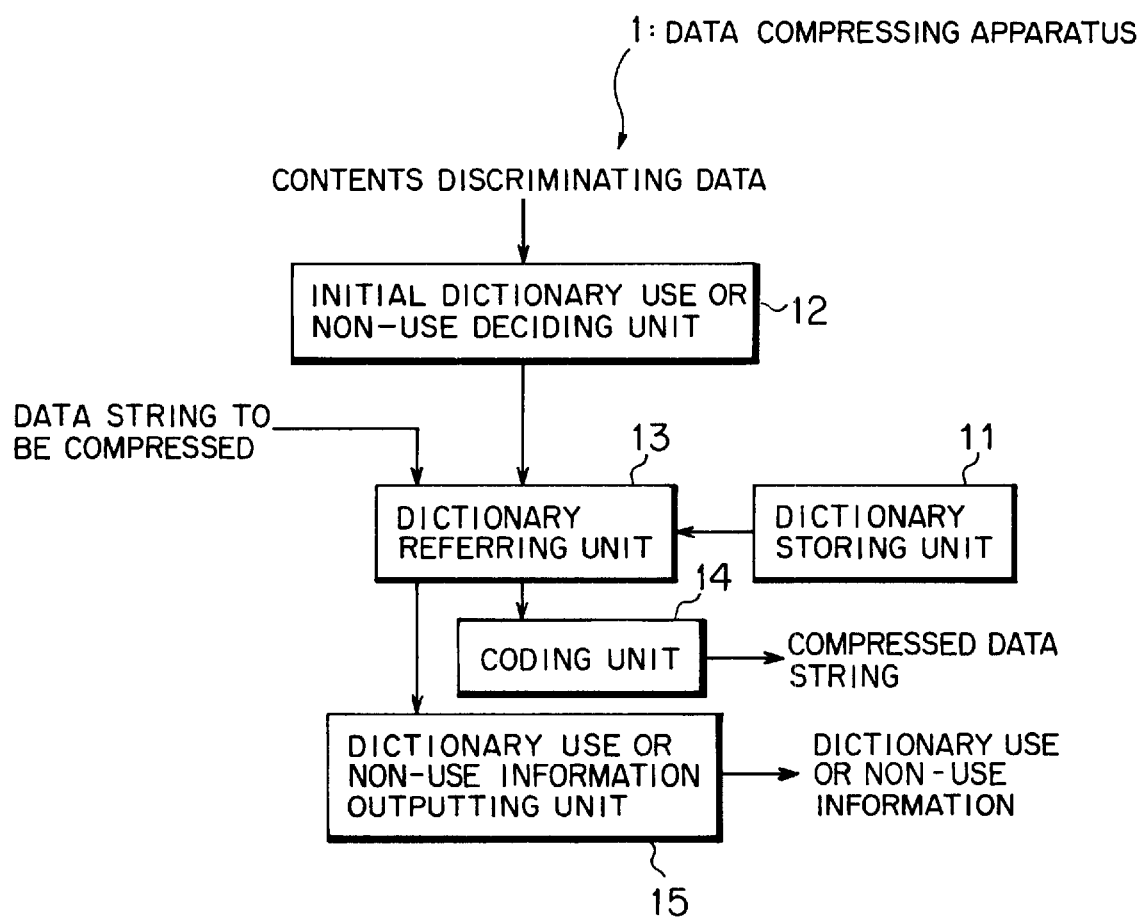
FIG. 1 is a block diagram showing a structure of a data compressing apparatus according to a first embodiment of this invention.

FIG. 1 is a block diagram showing a structure of a data compressing apparatus 1 according to the first embodiment of this invention. The data compressing apparatus 1 shown in FIG. 1 has a dictionary storing unit 11, an initial dictionary use or non-use deciding unit 12, a dictionary referring unit 13, a coding unit 14 and a dictionary use or non-use information outputting unit 15.

The dictionary storing unit (compressing dictionary storing unit) 11 stores a dictionary (compressing dictionary) which can be used when document data inputted as data (strings) to be compressed is compressed. In the dictionary, a predetermined code is assigned to each character of a high probability of occurring in data to be compressed. Incidentally, a storage area for the dictionary storing unit 11 may be secured in the above hard disk 27 or prepared as an exclusive memory area.

The initial dictionary use or non-use deciding unit (compressing dictionary use or non-use deciding unit) 12 decides whether the above compressing dictionary stored in the dictionary storing unit 11 is to be used or not when the above data to be compressed is compressed. Here, the initial dictionary use or non-use deciding unit 12 decides use or non-use of the above compressing dictionary according to contents of the data to be compressed (text file data, execute file data, or the like).

Because of this, the initial dictionary use or non-use deciding unit 12 is inputted a file name (or a header file) of file data inputted as data to be compressed as data contents type information showing a type contents of the data to be compressed. The deciding unit 12 decides whether the compressing dictionary is to be used or not depending on what is an extension ("tex" when the file name is "File1.tex", or "exe" when the file name is "File2.exe") generally given to the inputted file name.

In the case where a dictionary for text file data is stored as the above compressing dictionary in the dictionary storing unit 11, the initial dictionary use or non-use deciding unit 12 decides the dictionary in the dictionary storing unit 11 is to be used when an extension of an inputted file name is "tex" representing a text file, whereas decides the dictionary is not to be used when the extension is other than "tex" ("exe" or the like)

The dictionary referring unit 13 refers to (reads out) the above compressing dictionary stored in the dictionary storing unit 11 when the above initial dictionary use or non-use deciding unit 12 decides use of the compressing dictionary. The coding unit 14 codes the data to be compressed on the basis of the compressing dictionary read out from the dictionary storing unit 11 by the dictionary referring unit 13 when the above deciding unit 12 decides use of the compressing dictionary. When the deciding unit 12 decides non-use of the compressing dictionary, the coding unit 14 outputs the data to be compressed, not coding it.

The dictionary use or non-use information outputting unit 15 outputs information about use or non-use of the compressing dictionary (for example, use: 11, or non-use: 00) decided by the above initial dictionary use or non-use deciding unit 12. Incidentally, the dictionary use or non-use information outputting unit 15 is provided in order that the decompressing side may readily discriminate whether compressed data that is an object of decompression has been coded using the compressing dictionary or not. Therefore, the dictionary use or non-use information outputting unit 15 is not an essential element for a coding process (can be omitted).

Figure 3:
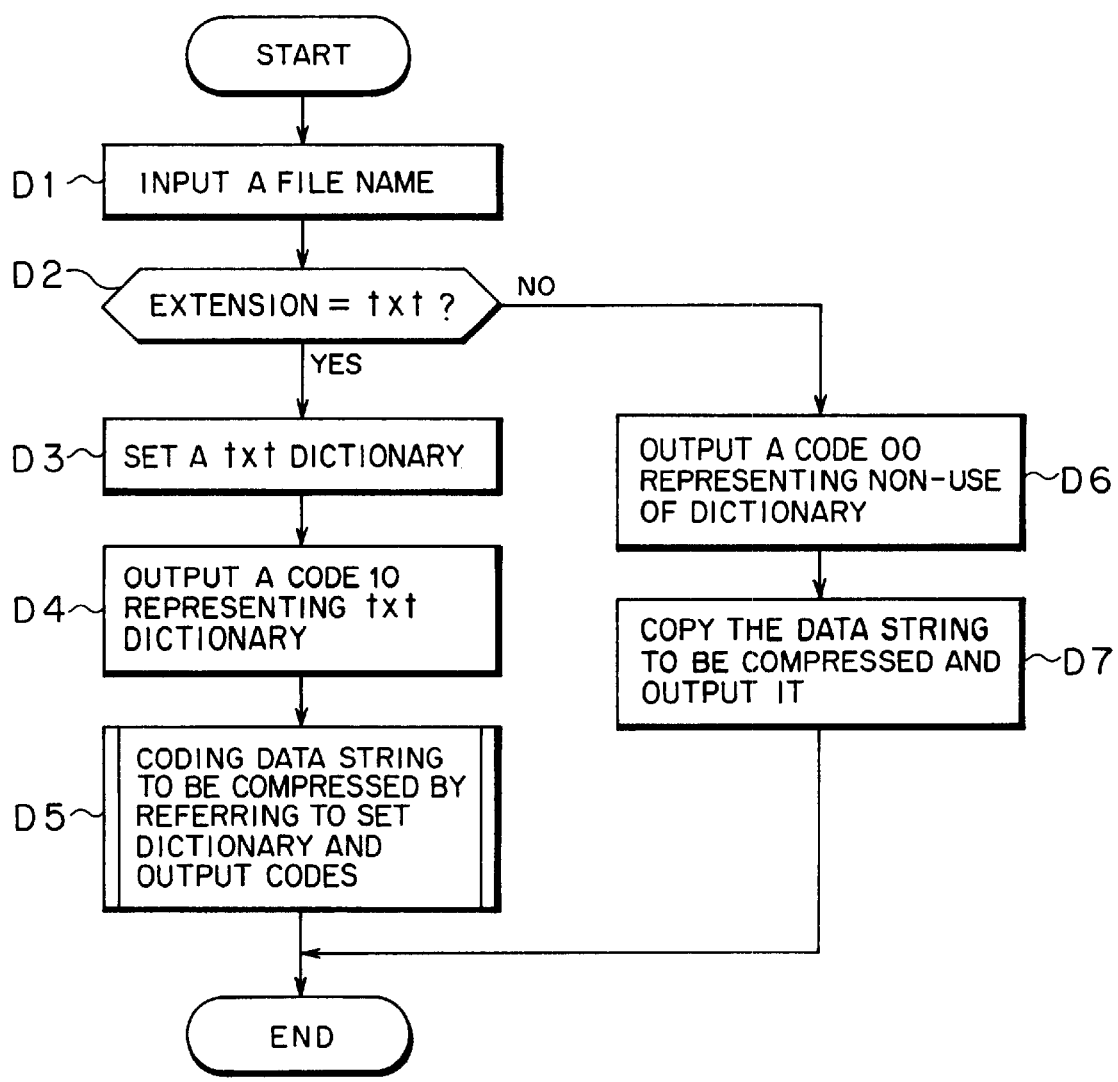
FIG. 3 is a flowchart for illustrating an operation of the data compressing apparatus according to the first embodiment.

Next, an operation (data compressing method) of the data compressing apparatus 1 having the above structure according to the first embodiment will be described in detail with reference to a flowchart (Steps D1 through D7) shown in FIG. 3.

When a file name is inputted to the data compressing apparatus 1 (Step D1), the initial dictionary use or non-use deciding unit 12 determines whether an extension of the inputted file name is an extension "txt" representing a text file or not (deciding step: Step D2). If the extension is "txt" as a result (if judged YES at Step D2), the initial dictionary use or non-use deciding unit 12 decides use of the compressing dictionary, and notifies the dictionary referring unit 13 of it.

When receiving the notification, the dictionary referring unit 13 reads out the compressing dictionary (dictionary for text file data) stored in the dictionary storing unit 11 so that the coding unit 14 can refer to the compression dictionary (set the dictionary: Step D3). When the dictionary is set, the dictionary use or non-use information outputting unit 15 outputs a code (11, for example) representing use of the compressing dictionary as dictionary use or non-use information to the decoding side, which will be described later (Step D4). At this time, the coding unit 14 codes the data to be compressed according to the compressing dictionary set by the dictionary referring unit 13 to compress the same (coding step: Step D5).

In concrete, the coding process is performed in either (1) statistical coding utilizing the context modeling described before or (2) dictionary-based coding.

(1) In the Case of Statistical Coding

Figure 4:
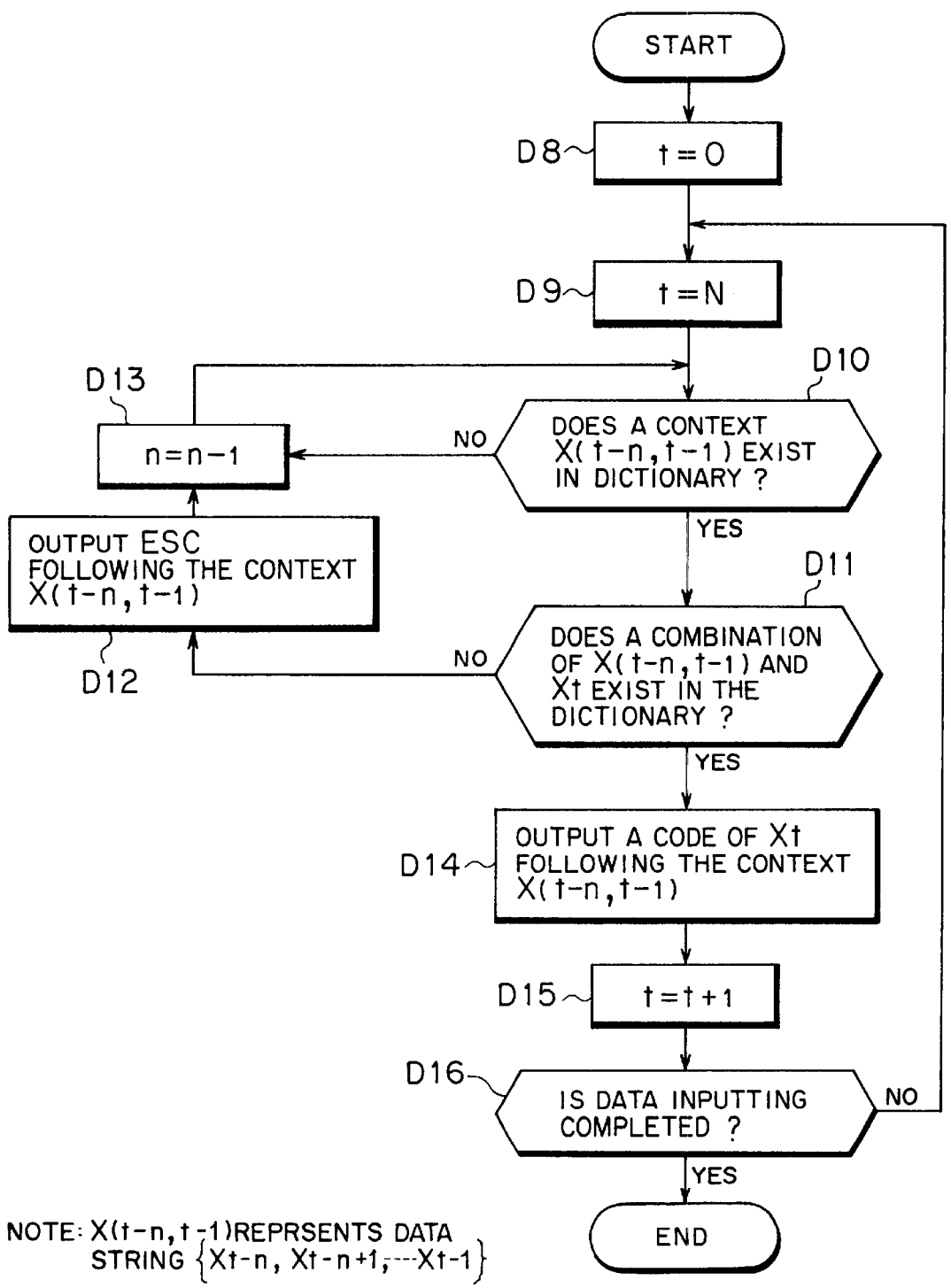
FIG. 4 is a flowchart for illustrating an operation (statistical coding) of a coding unit of the data compressing apparatus according to the first embodiment.

The coding unit 14, as shown in FIG. 4, for example, initializes a parameter t for retrieving a context (character string) $X(t-n, t-1)$ ($t=0$) (Step D8), and sets a parameter n for retrieving a longest matching character (data) string in the context $X(t-n, t-1)$ to a maximum order (a maximum number of characters consisting of the context) of the context $X(t-n, t-1)$ (Step D9). Wherein, the above t, n and N are natural numbers, and the above $X(t-n, t-1)$ represents a data string $\{X_{t-n}, X_{t-n+1}, \ldots, X_{t-1}\}$ (where $X_t$ represents one character).

The coding unit 14 determines whether a certain context $X(t-n, t-1)$ exists in the compressing dictionary set as above (Step D10). If the context X does not exist in the compressing dictionary, the coding unit 14 repeats retrieval of the context X (t−n, t−1) while decrementing the parameter n (n=n−1) (descending the order of the context) until detecting the context X (t−n, t−1) (from No route at Step D10 to Step D13).

If the context X (t−n, t−1) exists in the dictionary, the coding unit 14 further determines whether a context consisting of the context X (t−n, t−1) and an inputted character (data to be compressed) Xt added thereto has already existed in the above compressing dictionary or not (from YES route at Step D10 to Step D11). If the context does not exist in the compressing dictionary, the coding unit 14 outputs ESC (escape code) following the context X (t−n, t−1) (from NO route at Step D11 to Step D12), descends the order of the context (Step D13), and repeats the above process until detecting the combination (context) of the context X (t−n, t−1) and the inputted character Xt.

Namely, the coding unit 14 in the probability statistical coding retrieves the context X (t−n, t−1) in the dictionary (context tree) while descending the order of the context X (t−n, t−1) one by one until determining that the context (character string) X (t−n, t−1) that is an object of coding exists in the dictionary, thereby retrieving a character string in the dictionary longest-matching with a character string (t, t+1) that is an object of the coding.

When a combination of the context X (t−n, t−1) and the inputted character Xt is detected (exists in the compressing dictionary), the coding unit 14 outputs a code of the character Xt following the context X (t−n, t−1) (from YES route at Step D11 to Step D14). After that, the coding unit 14 increments the parameter t (t=t+1: Step D15), and successively codes an inputted character Xt while altering the context X (t−n, t−1) that is an object of the retrieval (NO route at Step D16) until coding of all inputted data is completed (until judged YES at Step D16).

(2) In the Case of Dictionary-based Coding

Figure 5:
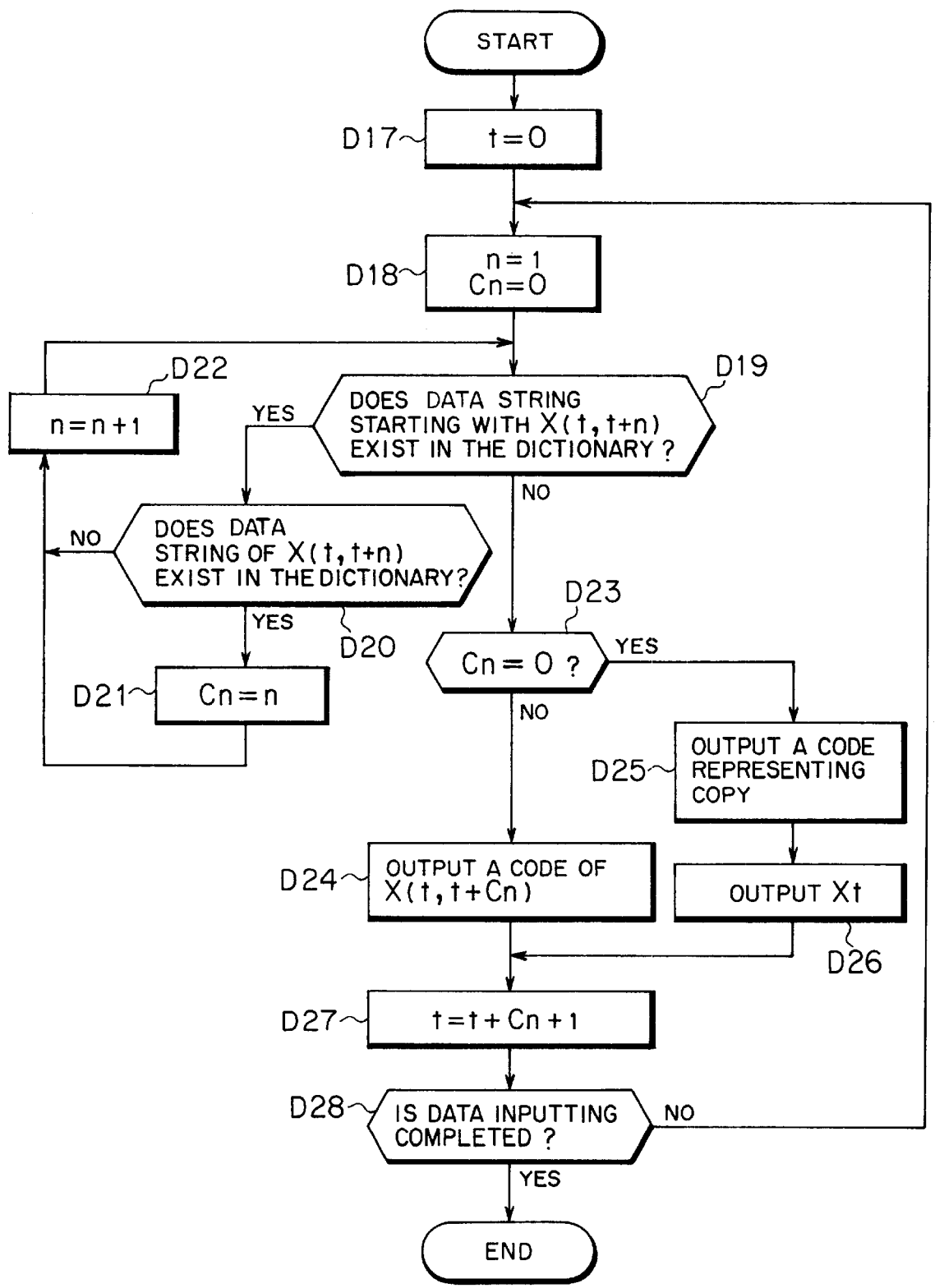
FIG. 5 is a flowchart for illustrating an operation (dictionary-based coding) of the coding unit of the data compressing apparatus according to the first embodiment.

When dictionary-based coding is applied, the coding unit 14, as shown in FIG. 5, for example, initializes parameters t and n for altering a character string X (t, t+1) that is an object of retrieval, and the number of extended characters Cn of the character string X (t, t+n) (where t, n, Cn are natural numbers) (t=0, N−1, Cn=0: Steps D17 and D18). In this case, the above X (t, t+n) represents a data string {$X_t$, $X_{t+1}$, ..., $X_{t+1}$} (where $X_t$ represents one character), as well.

The coding unit 14 determines whether a character string starting with an inputted character string (data string that is an object of retrieval) X (t, t+n) to be coded exists in the compressing dictionary set as above (Step D19). If the character string exists in the compressing dictionary, the coding unit 14 further determines whether the character string is the same as the character string X (t, t+n) that is an object of retrieval [whether the data string X (t, t+n) exists in the dictionary or not] (from YES route at Step D19 to Step D20).

If the character string X (t, t+n) that is an object of retrieval itself exists in the dictionary as a result, the coding unit 14 sets the number of extended characters Cn to a value of the above parameter n (Step D21), increments n (n=n+1) (Step D22) to increase (extends) the data string X (t, t+n) that is an object of retrieval by one character, and again determines whether the extended character string X (t, t+n) exists in the dictionary or not.

The coding unit 14 applied dictionary-based coding retrieves the character string X that is an object of coding in the dictionary while extending the character string (t, t+n) one character by one character until it is determined that the character string X (t, t+n) does not exist in the dictionary, thereby retrieving a character string in the dictionary longest-matching with the character string (t, t+n) that is an object of coding.

The coding unit 14 next determines whether the number of extended characters Cn=0 if it is determined that the character string X (t, t+n) does not exist in the dictionary (from NO route at Step D19 to Step D23). If Cn≠0 as a result, the coding unit 14 outputs a code in the dictionary corresponding to the extended character string X (t, t+Cn) (from NO route at Step D23 to Step D24). If Cn=0, it means that it is determined that the character string X (t, t+n) exists in the dictionary as the character string X (t, t+n) could not be extended any character so that the coding unit 14 outputs a code representing copy (from YES route at Step D23 to Step D25), and outputs a character Xt before extended (Step D26)

The coding unit 14 increments the parameter t (t=t+Cn+1) (Step D27), thereby successively coding an inputted character string X (t, t+n) while altering the character string X that is an object of retrieval (No route at Step D28) until coding of all inputted data is completed (until judged YES at Step D28).

If an extension of the inputted file name is not the extension "txt" representing a text file at above Step D2 (if judged NO at Step D2), the initial dictionary use or non-use deciding unit 12 determines that there is a good possibility of a quantity of compressed (coded) data being larger than a quantity of original data if file data (data to be compressed) whose extension is not "txt" is coded using a dictionary for text file data, so as to decide non-use of the compressing dictionary, and notifies the dictionary referring unit 13 of it.

The dictionary referring unit 13 transfers this notification to the dictionary use or non-use information outputting unit 15 and the coding unit 14. When receiving the notification, the dictionary use or non-use information outputting unit 15 outputs a code representing non-use of the compressing dictionary (00, for example) as dictionary use or non-use information to the decoding side (Step D6). The coding unit 14 does not code the data to be compressed, but copies the data and output it (data outputting step: Step D7).

Namely, the data compressing apparatus 1 (data compressing method) according to the first embodiment determines that a coding using a dictionary for text file data prepared in advance can achieve a good compression ratio if inputted data to be compressed is text file data, and codes the data to be compressed. If the inputted data to be compressed is not text file data, the data compressing apparatus 1 determines that a coding using the above dictionary produces a poor compression ratio so as not to code the data to be compressed.

In the case where a coding using a dictionary produces a poorer compression efficiency, for example, a quantity of compressed data becomes larger than a quantity of original data, the data to be compressed is not coded (compressed) so that degradation of the compression efficiency can be prevented. Therefore, it is possible to ensure a compression efficiency above a certain level.

(b) Description of the Decoding Side (Data Decompressing Apparatus)

Figure 6:
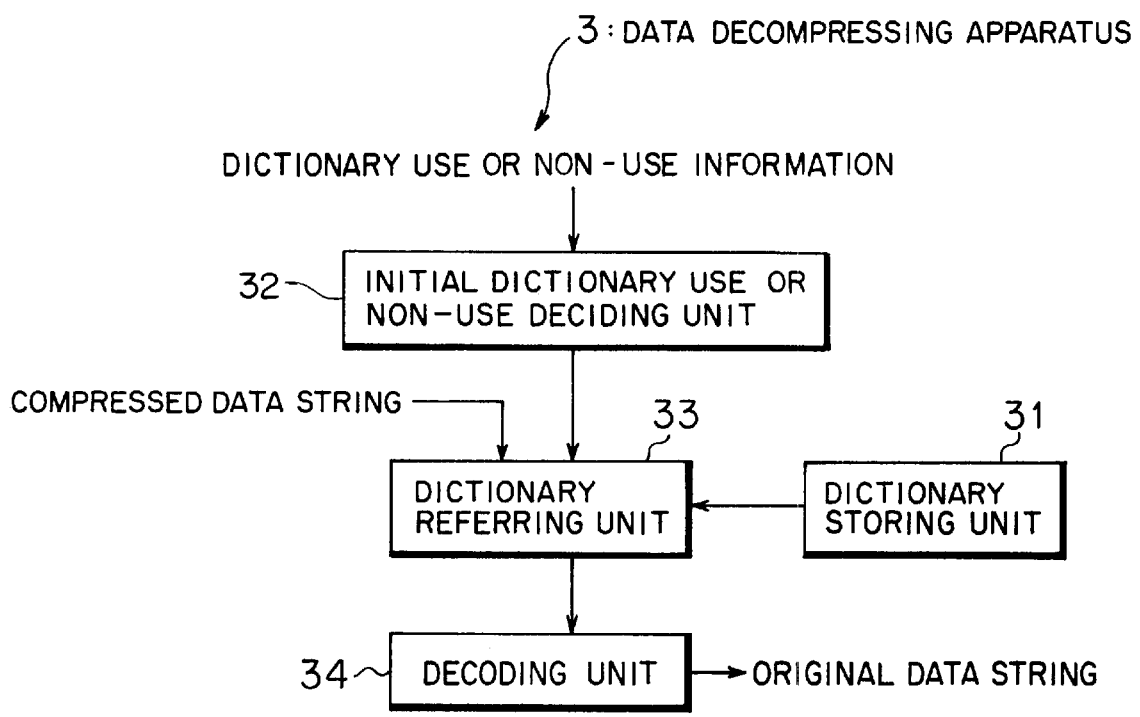
FIG. 6 is a block diagram showing a structure of a data decompressing apparatus according to the first embodiment.

FIG. 6 is a block diagram showing a structure of a data decompressing apparatus 3 according to the first embodiment. The data decompressing apparatus 3 shown in FIG. 6 decompresses (decodes) compressed data (codes) compressed in the above-described data compressing apparatus 1. The data decompressing apparatus 3 has a dictionary storing unit 31, an initial dictionary use or non-use deciding unit 32, a dictionary referring unit 33, and a decoding unit 34.

The dictionary storing unit (decompressing dictionary storing unit) 31 stores a decompressing dictionary which can be used when compressed data compressed by the data compressing apparatus 1 is decompressed. In the dictionary storing unit 31, there is stored a dictionary having the same contents as the dictionary stored in the dictionary storing unit 11 of the data compressing apparatus 1 as a decompressing dictionary. A storage area for the dictionary storing unit 31 may be ensured in the hard disk 27, or prepared as an exclusive memory area.

The initial dictionary use or non-use deciding unit (decompressing dictionary use or non-use deciding unit) 32 decides whether or not the above decompressing dictionary stored in the dictionary storing unit 31 is used when the above compressed data is decompressed. Here, whether or not the decompressing dictionary is used is decided according to received information about use or non-use of the compressing dictionary (use: 11, non-use: 00) outputted from the dictionary use or non-use information outputting unit 15 of the data compressing apparatus 1.

When the initial dictionary use or non-use deciding unit 32 decides use of the decompressing dictionary, the dictionary referring unit 33 reads out the decompressing dictionary from the dictionary storing unit 31. When the initial dictionary use or non-use deciding unit 32 decides use of the decompressing dictionary, the decoding unit 34 decodes the compressed data on the basis of the decompressing dictionary read out by the dictionary referring unit 33. When the initial dictionary use or non-use deciding unit 32 decodes non-use of the decompressing dictionary, the decoding unit 34 does not decode the compressed data, but outputs it.

Next, an operation of the data decompressing apparatus 3 having the above structure according to the first embodiment will be described in detail with reference to flowcharts (Steps E1 through E19) shown in FIGS. 7 through 9.

Figure 7:
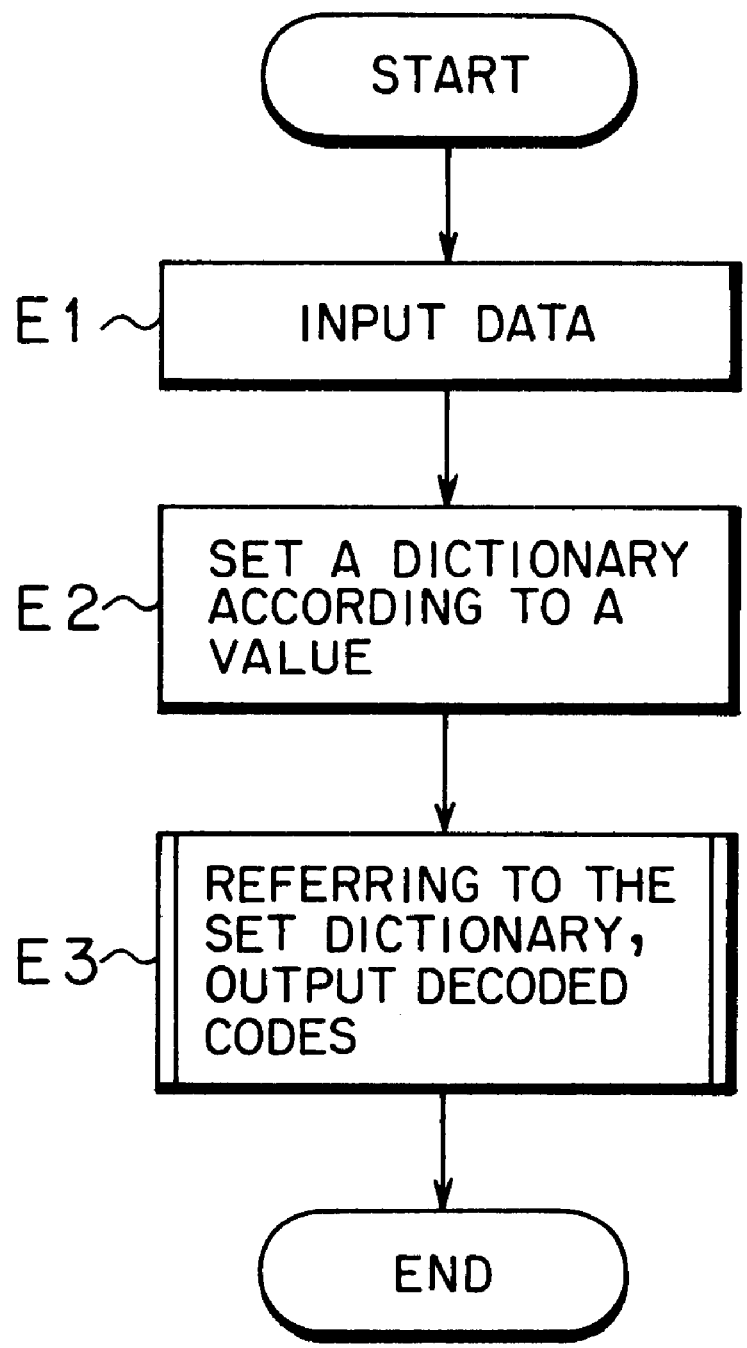
FIG. 7 is a flowchart for illustrating an operation of the data decompressing apparatus according to the first embodiment.

As shown in FIG. 7, when receiving dictionary use or non-use information from the data compressing apparatus 1 (receiving step: Step E1), the initial dictionary use or non-use deciding unit 32 in the data decompressing apparatus 3 decides use or non-use of the decompressing dictionary according to the received dictionary use or non-use information (deciding step). If the dictionary use or non-use information is a code (11) representing use of the compressing dictionary, for example, the deciding unit 32 decides use of the decompressing dictionary. If the dictionary use or non-use information is a code (00) representing non-use of the compressing dictionary, the deciding unit 32 decides non-use of the decompressing dictionary.

When the deciding unit 32 decides use of the decompressing dictionary, the dictionary referring unit 33 reads out the decompressing dictionary from the dictionary storing unit 31 (setting the dictionary: Step E2). The decoding unit 34 decodes the compressed data according to the decompressing dictionary set by the dictionary referring unit 33 (decoding step: Step E3).

Here, a decoding system in the decoding unit 34 is decided according to a coding system for the compressed data (coding system having been employed in the coding unit 14 of the data compressing apparatus 1).

(1) In the Case Where the Compressing Side Employs Statistical Coding

Figure 8:
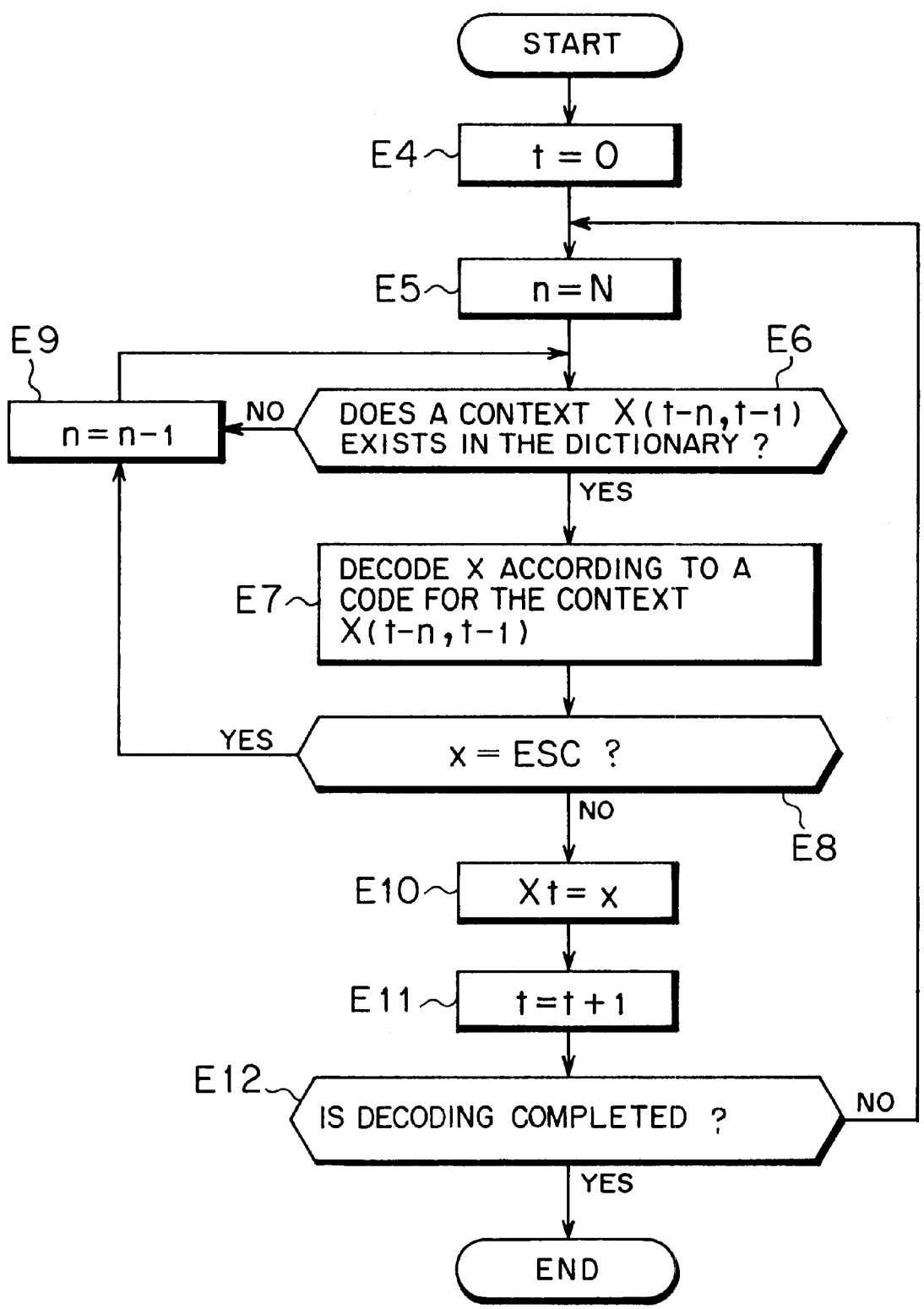
FIG. 8 is a flowchart for illustrating an operation (statistical decoding) of a decoding unit of the data decompressing apparatus according to the first embodiment.

In this case, the decoding unit 34, as shown in FIG. 8, for example, initializes the parameter t for retrieving a context (character string) X (t−n, t−1) (step E4), besides setting a parameter n for retrieving a longest-matching character string in the context X (t−n, t−1) to a maximum order (a maximum number of characters consisting of the context) N of the context X (t−n, t−1) (step E5). Wherein, the above t, n and N are natural numbers, and the above X (t−n, t−1) represents a character string $\{X_{t-n}, X_{t-n+1}, \ldots, X_{t-1}\}$ (where $X_t$ represents one character).

The decoding unit 34 determines whether or not a certain context (t−n, t−1) that is an object of decoding exists in the decompressing dictionary set as above (Step E6). If not, the decoding unit 34 repeats retrieval of the context X (t−n, t−1) while decrementing the parameter n (n=n−1) (descending the order of the context) until detecting the context X (t−n, t−1) (from NO route at Step E6 to Step E9).

When detecting the context X (t−n, t−1), the decoding unit 34 decodes a longest-matching character x according to a code corresponding to the context X (t−n, t−1) (from YES route at Step E6 to Step E7), and determines whether the decoded longest-matching character x is ESC or not (escape code) (Step E8) If the decoded character x is ESC as a result (if judged YES at Step E8), the decoding unit 34 repeats retrieval of the context X (t−n, t−1) while decrementing the parameter n until decoding a character other than ESC (from YES route at Step E8 to Step E9).

If the decoded character is other than ESC, the decoding unit 34 outputs the decoded character x as a decoded character Xt (Xt=x: from NO route at Step E8 to Step E10). The decoding unit 34 increments the parameter t (t=t+1: Step E11), and successively decoded inputted compressed data while altering the context X (t−n, t−1) that is an object of retrieval (NO route at Step E12) until the decoding is completed (until judged YES at Step E12).

(2) In the Case Where the Compressing Side Employs Dictionary-based Coding

Figure 9:
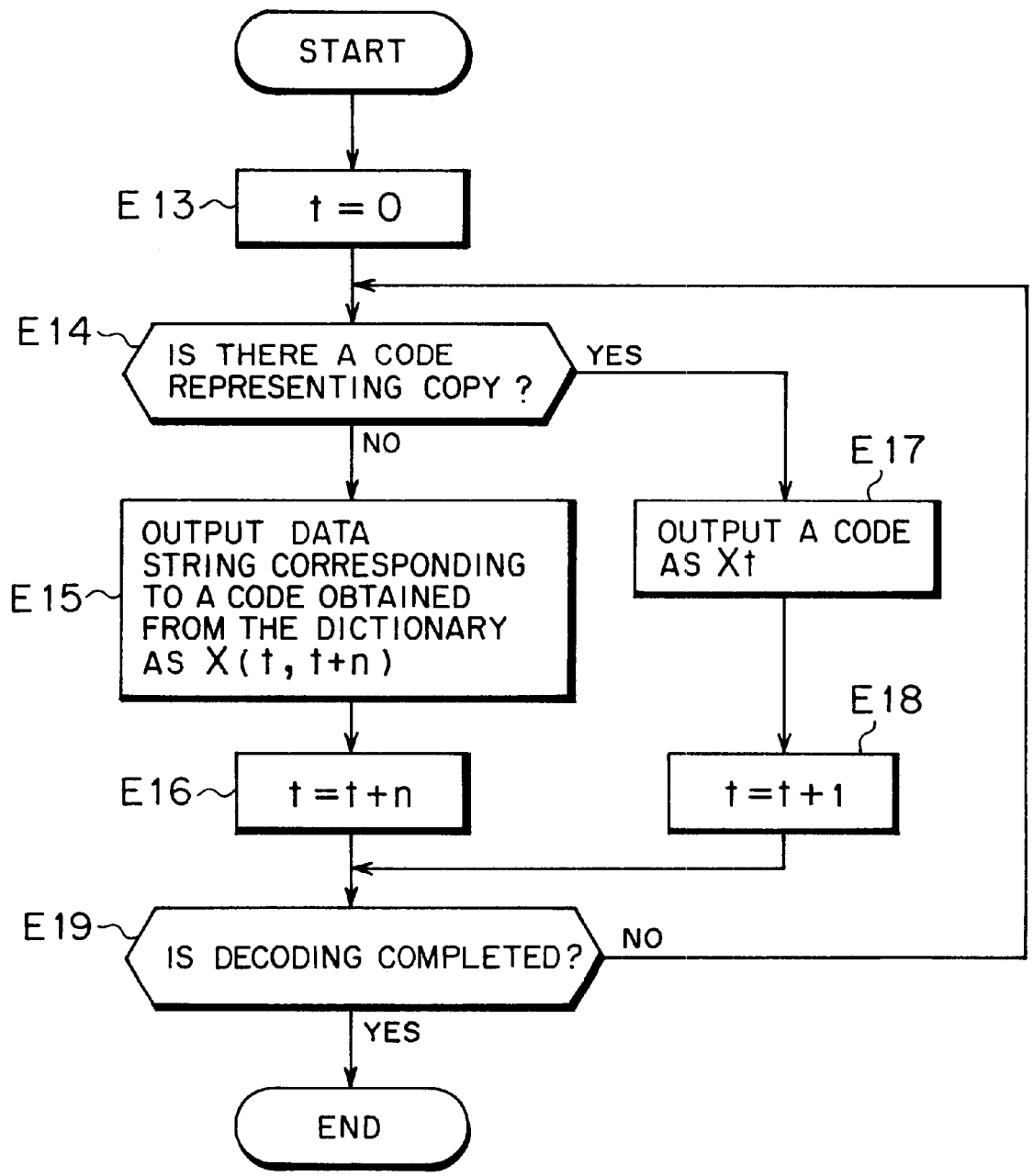
FIG. 9 is a flowchart for illustrating an operation (dictionary-based decoding) of the decoding unit of the data decompressing apparatus according to the first embodiment.

In this case, the decoding unit 34, as shown in FIG. 9, for example, initializes a parameter t (t=0) (Step E13), then determines whether or not an inputted code (compressed data) is a code representing copy (Step E14).

If the inputted code is not a code representing copy as a result, the decoding unit 34 obtains a character string corresponding to the inputted code from the decompressing dictionary and outputs it as a decoded character string X (t, t+n) (from NO route at Step E14 to Step E15), and increments the parameter t by n (t=t+n: Step E16)

If the inputted code is a code representing copy, the decoding unit 34 outputs the inputted code as a decoded code as it is (from YES route at Step E14 to Step E17), then increments the parameter t (t=t+n: Step E18).

The decoding unit 34 successively decodes inputted compressed data (NO route at Step E19) until decoding of all compressed data is completed (until judged YES at Step E19).

If the above initial dictionary use or non-use deciding unit 32 decides no-use of the decompressing dictionary, the dictionary referring unit 33 notifies the decoding unit 34 of it. The decoding unit 34 does not decode the compressed data (original data having not been actually compressed on the compressing side), but outputs it as it is (data outputting step).

The data decompressing apparatus 3 (data decompressing method) according to the first embodiment decides whether or not the decompressing dictionary is used according to the dictionary use or non-use information received from the compressing side when decompressing compressed data. According to a result of the decision, the decompressing apparatus 3 decodes the compressed data on the basis of the decompressing dictionary, or does not decode the compressed data but outputs it. It is therefore possible to select decoding or non-decoding of the compressed data.

Accordingly, it is possible to cut unnecessary decoding process depending on a condition of compression of the compressing data (including the time of non-compression) so that the decoding process can be performed very efficiently. The decompressing apparatus 3 can quickly determine whether or not the inputted compressed data has been coded using the dictionary when compressed to decide use or non-use of the decompressing dictionary. This largely contributes to speed-up of the decoding process.

Figure 10:
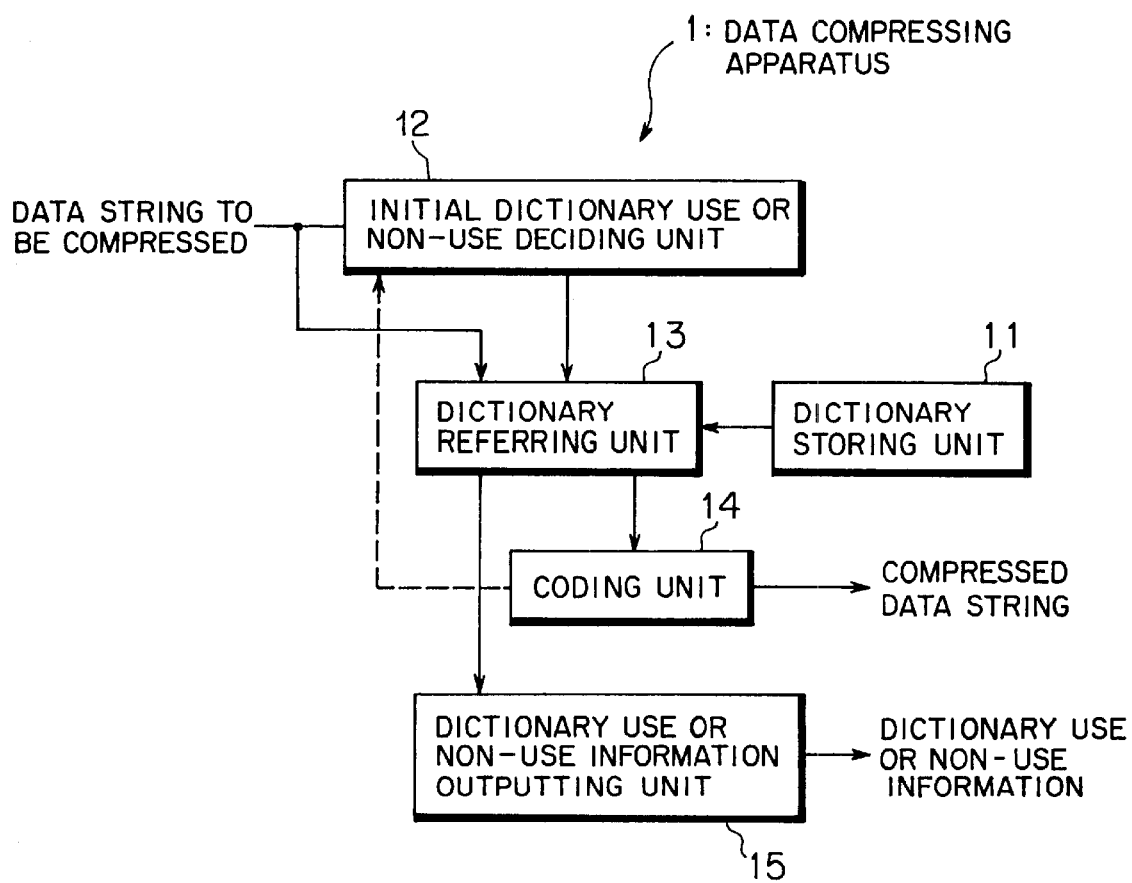
FIG. 10 is a block diagram showing a structure of a data compressing apparatus according to a first modification of the first embodiment.

(A1) Description of a First Modification of the First Embodiment (a) Description of the Compressing Side FIG. 10 is a block diagram showing a structure of a data compressing apparatus according to a first modification of the first embodiment. In a data compressing apparatus 1 shown in FIG. 10, the initial dictionary use or non-use deciding unit 12 decides use or non-use of the compressing dictionary on the basis of not contents discriminating data such as a file name or the like as described above, but inputted data to be compressed, unlike the compressing apparatus 1 shown in FIG. 1.

In concrete, the initial dictionary use or non-use deciding unit 12 according to this modification decides use or non-use of the compressing dictionary according to judging conditions ①, ② or ③ below, for example:

① whether all specific characters (strings) of high occurrence frequency in data to be compressed are included in the compressing dictionary;

② whether a quantity of compressed data is larger than a quantity of original data;

③ whether specific character codes exist in data to be compressed.

If use or non-use of the compressing dictionary is decided according to the above judging conditions ②, the initial dictionary use or non-use deciding unit 12 can receive information on a result of coding by the coding unit 14, as indicated by a broken line in FIG. 10.

Next, an operation of the data compressing apparatus 1 according to the first modification will be described for each of the above judging conditions.

(1) In the Case Where Use or Non-use of the Compressing Dictionary is Decided According to the Above Judging Conditions ①

Figure 11:
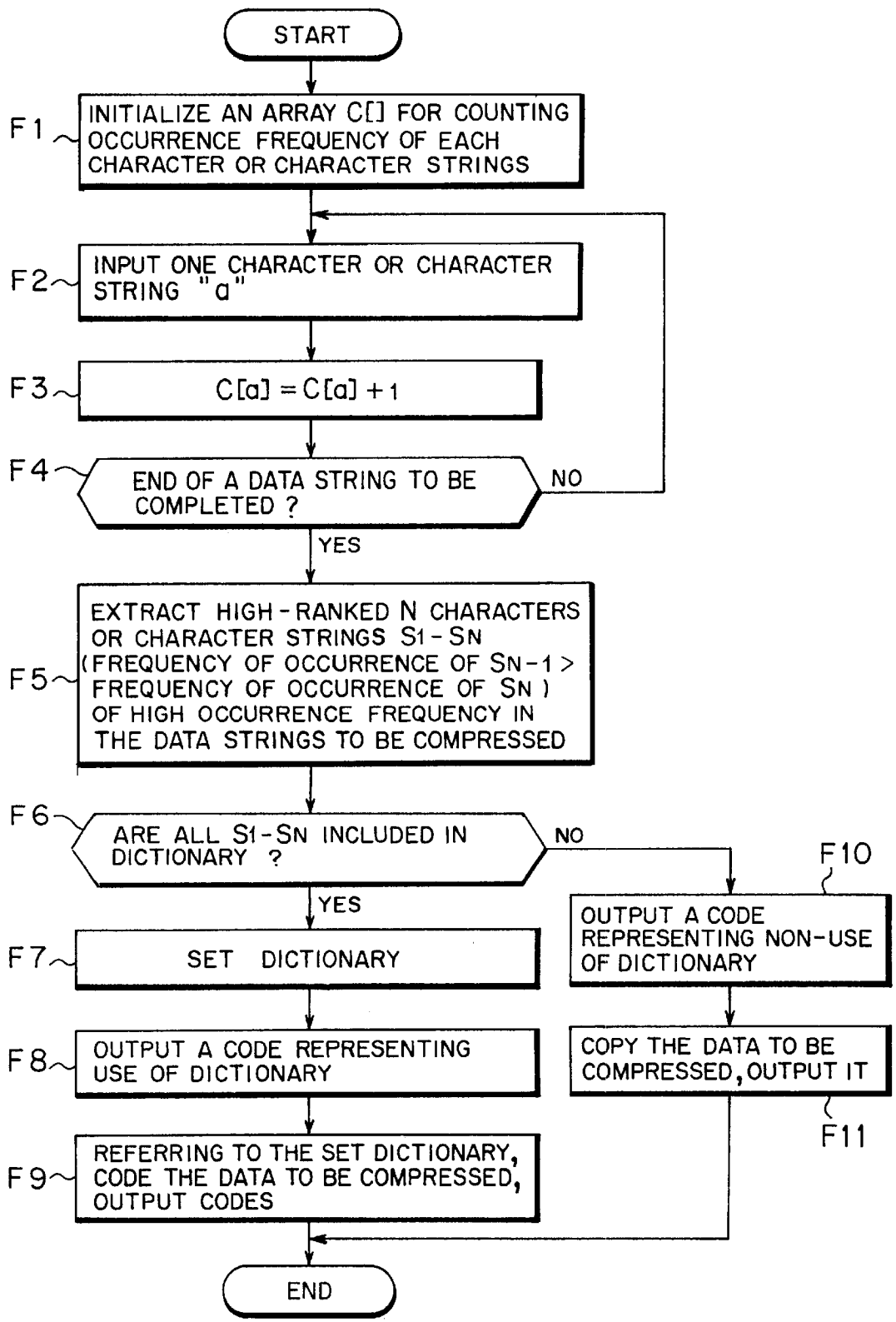
FIGS. 11 through 13 are flowcharts for illustrating operations of the data compressing apparatus according to the first modification of the first embodiment.

In this case, the initial dictionary use or non-use deciding unit 12, as shown in FIG. 11, for example, initializes an array (count value) C[ ] for counting (calculating) an occurrence frequency of each characters (character strings) (Step F1). When one character (or one character string) a of data to be compressed is inputted, for example, (Step F2), the initial dictionary use or non-use deciding unit 12 counts up the count value C[a] of the inputted character (character string) a (C[a]=C[a]+1: Step F3).

The initial dictionary use or non-use deciding unit 12 repeats the above process until inputting of all data to be compressed is completed (until judged YES at Step F4), thereby successively counting the occurrence frequency of each character occurring in the data to be compressed (NO route at Step F4). When the inputting of all the data to be compressed is completed, the initial dictionary use or non-use deciding unit 12 refers to a count value C[ ] of each character (character string), and extracts N (a natural number not less than 2) characters (character strings) in high ranks $S_1$ through $S_N$ (provided occurrences of $S_{N-1}$>occurrences of $S_N$) whose count values are large (that is, high occurrence frequency) (from YES route at Step F4 to Step F5).

The initial dictionary use or non-use deciding unit 12 next refers to the compressing dictionary stored in the dictionary storing unit through the dictionary referring unit 13 to decide whether all the characters (character strings) $S_1$ through $S_N$ extracted as above are included in the compressing dictionary (Step F6). If all the characters (character strings) $S_1$ through $S_N$ are included in the compressing dictionary as a result, the initial dictionary use or non-use deciding unit 12 decides use of the compressing dictionary, and notifies the dictionary referring unit 13 of it. When receiving the notification, the dictionary referring unit 13 reads out the compressing dictionary stored in the dictionary storing unit 11 so that the coding unit 14 can refer to the compressing dictionary (setting the dictionary: from YES route at Step F6 to Step F7).

When the dictionary is set as above, the dictionary use or non-use information outputting unit 15 outputs a code representing use of the compressing dictionary as the dictionary use or non-use information to the decoding side (Step F8), besides the coding unit 14 codes and compresses the data to be compressed according to the compressing dictionary set by the dictionary referring unit 13 (Step F9). Incidentally, the coding in the coding unit 14 may be performed in either statistical coding or dictionary-based coding described above.

If any one of the above N characters (character strings) $S_1$ through $S_N$ in high ranks frequently occurring is not included in the compressing dictionary (if judged NO at Step F6) the initial dictionary use or non-use deciding unit 12 decides non-use of the compressing dictionary, and notifies the dictionary referring unit 13 of it. The dictionary referring unit 13 transfer the notification to the dictionary use or non-use information outputting unit 15 and the coding unit 14. When receiving the notification, the dictionary use or non-use information outputting unit 15 outputs a code representing non-use of the compressing dictionary as the dictionary use or non-use information to the decoding side (Step F10) The coding unit 14 does not code the data to be compressed but outputs it (Step F11).

Namely, the above data compressing apparatus 1 makes a decision according to occurrences of specific character data in data to be compressed. Here, the data compressing apparatus 1 decides use of the compressing dictionary for data to be compressed in which specific characters (character strings) $S_1$ through $S_N$ frequently occurring are all included in the compressing dictionary, as above. Therefore, it is possible to assign short codes to specific characters (character strings) $S_1$ through $S_N$ frequently occurring. This produces a compression effect above a certain level.

(2) In the Case Where Use or Non-use of the Compressing Dictionary is Decided According to the Above Judging Conditions ②

Figure 12:
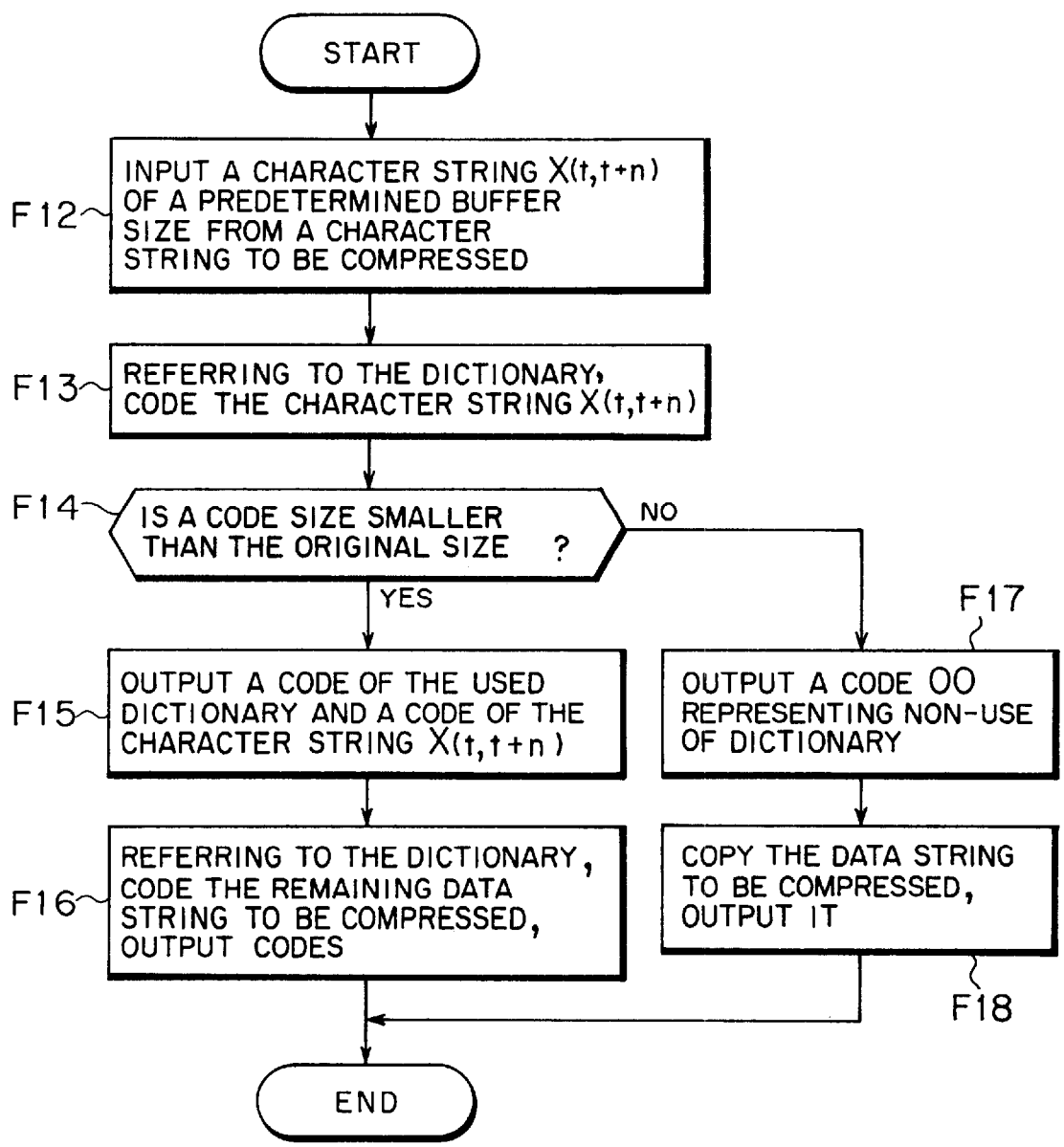

In this case, the initial dictionary use or non-use deciding unit 12, as shown in FIG. 12, for example, accepts an input of a character string X(t, t+n) of a predetermined buffer size from character strings to be compressed (Step F12), decides use of the compressing dictionary for the character string X(t, t+n), and notifies the dictionary referring unit 13 of it. The dictionary referring unit 13 reads out the compressing dictionary from the dictionary storing unit 11. The coding unit 14 codes the character string X (t, t+n) on the basis of the compressing dictionary (Step F13).

After coding the character string X (t, t+n) the coding unit 14 outputs information about a quantity of data (codes) of the coded compressed data resulting from the coding to the initial dictionary use or non-use deciding unit 12. When receiving the information, the initial dictionary use or non-use deciding unit 12 determines whether a quantity of the coded data is smaller than the original buffer size (Step F14).

If a quantity of the coded data is smaller than the original buffer size n+1 as a result (if judged YES at Step F14), the initial dictionary use or non-use deciding unit 12 notifies the dictionary use or non-use information outputting unit 15 and the coding unit 14 via the dictionary referring unit 13 of it. The dictionary use or non-use information outputting unit 15 outputs a code representing use of the compressing dictionary to the decoding side. The coding unit 14 outputs a code of the character string X (t, t+n) after that, codes the remaining data to be compressed with reference to the compressing dictionary (Steps F15 and F16). In this case, a coding system in the coding unit 14 may be statistical coding or dictionary-base coding mentioned above.

If a quantity of the coded data is larger than the original buffer size (if judged NO at Step F14), the initial dictionary use or non-use deciding unit 12 notifies the dictionary use or non-use information outputting unit 15 and the coding unit 14 via the dictionary referring unit 13 of it. The dictionary use or non-use information outputting unit 15 outputs a code representing non-use of the compressing dictionary to the decoding side (Step F17). The coding unit 14 copies the data to be compressed and outputs it (Step F18).

Namely, the above data compressing apparatus 1 decides use or non-use of the compressing dictionary according to a quantity of compressed data which is data to be compressed having been coded. Here, the data compressing apparatus 1 decides non-use of the compressing dictionary for data to be compressed having such a characteristic that a quantity of compressed data after the coding is larger than a quantity of original data (no compressing effect is expected), as above. It is therefore possible to largely decrease a probability of degradation of the compressing efficiency so that a compression effect above a certain level can be ensured more certainly.

(3) In the Case Where Use or Non-use of the Compressing Dictionary is Decided According to the Above Judging Conditions ③

Figure 13:
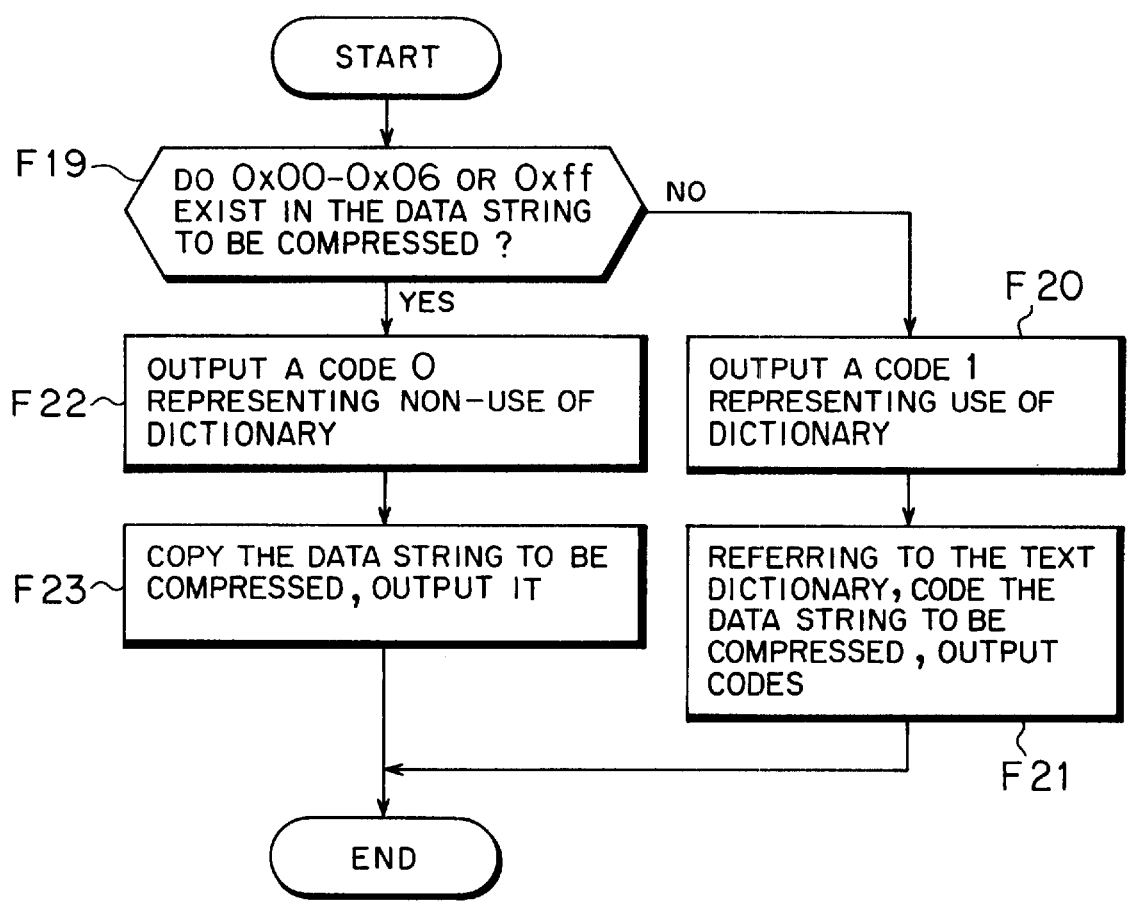

In this case, the initial dictionary use or non-use deciding unit 12, as shown in FIG. 13, for example, determines whether any one of character codes 0x00 through 0x06 and 0xff as specific character codes (specific character bands) exist in data to be compressed (Step F19) Incidentally, one of the above character codes 0x00 through 0x06 and 0xff do not occur in text file data, in general. Assuming here that dictionary for text file data is stored as the compressing dictionary in the dictionary storing unit 11.

If the above judgement results in that any one of the above character codes 0x00 through 0x06 and 0xff do not exist in the data to be compressed (if judged NO at Step F19), the initial dictionary use or non-use deciding unit 12 judges that the data to be compressed is very like text file data so as to decide use of the compressing dictionary, and notifies the dictionary referring unit 13 of it.

The dictionary referring unit 13 reads out the compressing dictionary from the dictionary storing unit 11, besides notifying the dictionary use or non-use information outputting unit 15 of use of the compressing dictionary. The dictionary use or non-use information outputting unit 15 outputs a code representing use of the compressing dictionary as the dictionary use or non-use information to the decoding side (Step F20). The coding unit 14 codes the data to be compressed with reference to the compressing dictionary (for text file data) read out by the dictionary referring unit 13 (Step F21).

If one of the above character codes 0x00 through 0x06 and 0xff exist in the data to be compressed (if judged YES at Step F19), the initial dictionary use or non-use deciding unit 12 determines that the data to be compressed is very likely other than text file data so as to decide non-use of the compressing dictionary, and notifies the dictionary use or non-use information outputting unit 15 and the coding unit 14 via the dictionary referring unit 13 of it.

The dictionary use or non-use information outputting unit 15 outputs a code representing non-use of the compressing dictionary (Step F22) The coding unit 14 does not code but copies the data to be compressed, and outputs it (Step F23).

The above data compressing apparatus 1 can easily decide use or non-use of the compressing dictionary merely by actually inspecting contents of data to be compressed and judging whether specific character data occurs in the data to be compressed. It is therefore possible to quickly judge a characteristic of actual data to be compressed so as to produce a compression effect above a certain level while improving a processing speed.

(b) Description of the Decoding Side

A data decompressing apparatus 3 according to the first modification, that is, a data decompressing apparatus 3 for the data compressing apparatus 1 described above with reference to FIGS. 10 through 13, is configured similarly to that shown in FIG. 6, and its operation (data decompressing method) is similar to that described above with reference to FIGS. 7 through 9. Namely, when receiving a code representing use of the dictionary from the compressing side, the data decompressing apparatus 3 decodes compressed data (codes) using the (decompressing) dictionary. When receiving a code representing non-use of the dictionary, the data decompressing apparatus 3 does not perform the decoding process since the data to be compressed which has not been coded is inputted as it is.

(c) Others

Figure 14:
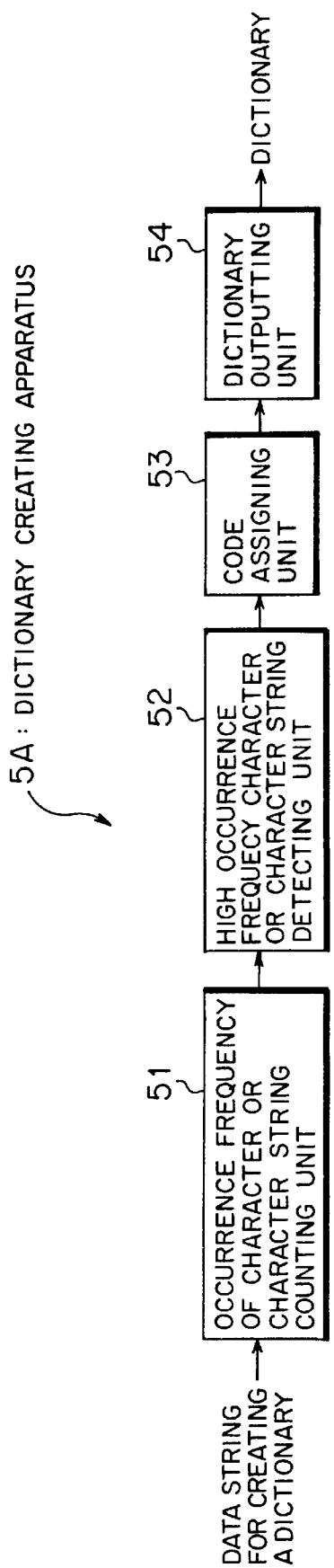
FIG. 14 is a block diagram showing a structure a dictionary creating apparatus according to the first modification of the first embodiment.

The compressing or decompressing dictionary stored in the above dictionary storing unit 11 or 31 is created by a dictionary creating apparatus 5A shown in FIG. 14, for example. The dictionary creating apparatus (data compressing or decompressing dictionary creating apparatus) 5A has, as shown in FIG. 14, an occurrence frequency of character or character string counting unit 51, a high occurrence frequency character or character string detecting unit 52, a code assigning unit 53 and a dictionary outputting unit 54.

The occurrence frequency of character or character string counting unit (occurrence frequency counting unit) 51 counts occurrence frequency of each character or character string in data for creating a dictionary. The high occurrence frequency character or character string detecting unit (high occurrence frequency data detecting unit) 52 detects a character or character string whose occurrence frequency is higher than predetermined times on the basis of occurrence times of each character or character string counting by the occurrence frequency of character or character string counting unit 51.

The code assigning unit 53 assigns a predetermined code to a character or character string of high occurrence frequency detected by the high occurrence frequency character or character string detecting unit 52. The dictionary outputting unit (dictionary generating unit) 54 combines the above character or character string of high occurrence frequency with the code and outputs them, thereby generating the above compressing or decompressing dictionary. In a manner of assigning a code by the code assigning unit 53, a predetermined code may be assigned to a character or character string of high occurrence frequency one-to-one, or a character string of high occurrence frequency may be divided into a context and characters and a predetermined code may be assigned to each of the characters.

The dictionary creating apparatus 5A having the above structure assigns a predetermined code to character data whose occurrence frequency is higher than predetermined frequency on the basis of occurrence frequency of each character or character string occurring in data for creating a dictionary, combines the character data of high occurrence frequency with the code and output them, thereby automatically generating the data compressing or decompressing dictionary. It is therefore possible to omit labor of creating the dictionary.

Figure 15:
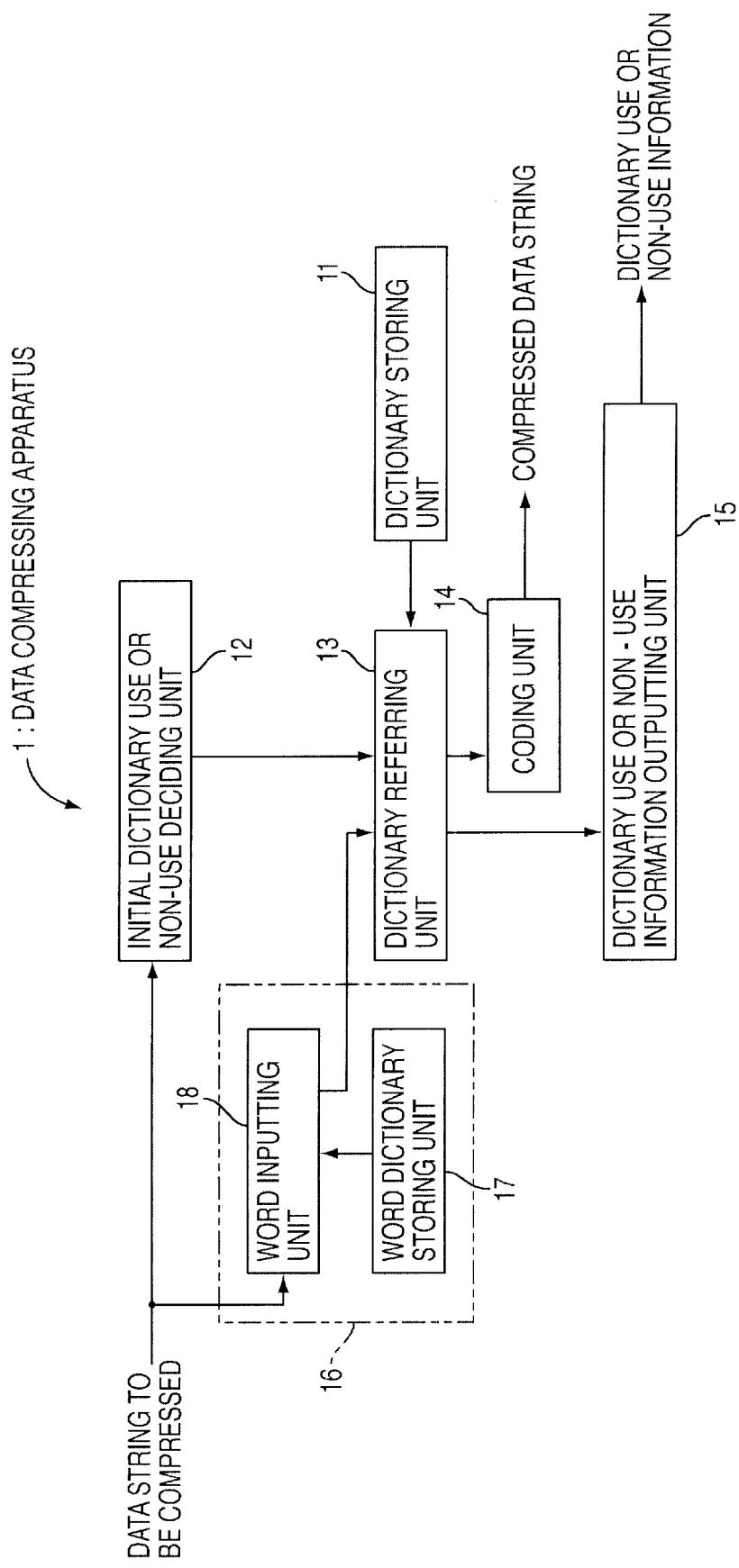
FIG. 15 is a block diagram showing a structure of a data compressing apparatus according to a second modification of the first embodiment.

(A2) Description of a Second Modification of the First Embodiment (a) Description of the Compressing Side FIG. 15 is a block diagram showing a structure of a data compressing apparatus according to a second modification of the first embodiment. A data compressing apparatus 1 shown in FIG. 15 additionally has a compressed data dividing unit 16, as compared with that shown in FIG. 1.

The above compressed data dividing unit 16 divides inputted data to be compressed into predetermined data groups. On an assumption that the data to be compressed is text-form data such as text file data or the like, the compressed data dividing unit 16 divides the data to be compressed into word units in the document-form data in a manner such as morphological analysis or the like.

Because of this, the compressed data dividing unit 16 according to this embodiment has, as shown in FIG. 15, a word dictionary storing unit 17 and a word inputting unit 18. The word dictionary storing unit 17 stores a word dictionary in which desired words occurring in the above document-form data are registered. The word inputting unit (word dividing unit) 18 divides the data to be compressed (document-form data) into word units of on the basis of the words registered in the word dictionary in the word dictionary storing unit 17, and inputs the word units to the coding unit 14 via the dictionary referring unit 13.

Namely, the coding unit 14 of this modification codes the data to be compressed by word (character data group) obtained by the word inputting unit 18 of the compressed data dividing unit 16. For this purpose, a word unit compressing dictionary in which a code is assigned to each of desired words is stored in the dictionary storing unit 11 of this modification. The initial dictionary use or non-use deciding unit 12 decides use or non-use of the compressing dictionary on the basis of contents of the inputted data to be compressed (according to ① whether characters or character strings of high occurrence frequency are all included in the dictionary, ② whether a quantity of compressed data is smaller than a quantity of original data, or ③ whether specific characters or character strings are included in the data to be compressed), similarly to the above first modification.

In the data compressing apparatus 1 having the above structure according to the second modification, the word inputting unit 18 divides data to be compressed (document-form data) into words and inputs them to the coding unit 14 when the initial dictionary use or non-use deciding unit 12 decides use of the compressing dictionary so that the coding unit 14 codes a plurality of character data as a bunch at a time.

As compared with a case of coding character by character as a unit, it is possible to largely speed up the coding process. By dividing data into a plurality of groups of data that are called "words" having respective meanings, it is possible to limit the number of sorts of codes to be assigned to data to be compressed so that a quantity of codes after the coding is reduced, thus a compression ratio is improved. Further, if the data to be compressed is coded by word as a unit, the decoding process on the decoding side becomes easier.

A procedure of the coding in the above coding unit 14 corresponds to the flowchart (Steps D8 through D16) shown in FIG. 4 in which X (t–n, t–1) is replaced with a word or the flowchart (Steps D17 through D28) shown in FIG. 5 in which X (t, t+n) is replaced with a word.

(b) Description of the Decoding Side

A data compressing apparatus 3 according to the second modification, that is, a data compressing apparatus for the above data compressing apparatus 1 shown in FIG. 15 has a structure similar to that shown in FIG. 6. In this case, a decompressing (word unit decompressing) dictionary having the same contents as the compressing dictionary stored in the dictionary storing unit 11 on the compressing side is stored in the dictionary storing unit 31, and the decompressing unit 34 decodes compressed data having been compressed by the data compressing apparatus 1 by word (by predetermined character data group) on the basis of the decompressing dictionary.

The data decompressing apparatus 3 according to the second modification decodes compressed data (codes) by word using the above word unit decompressing dictionary when receiving a code representing use of the dictionary from the compressing side. When receiving a code representing non-use of the dictionary, the data decompressing apparatus 3 does not perform the decoding process since data to be compressed is inputted as it is, not coded.

Namely, an operation of the data decompressing apparatus 3 is similar to the flowchart (Steps E1 through E3) shown in FIG. 7. The decompressing process in the decoding unit 34 corresponds to the flowchart (Steps E4 through E12) shown in FIG. 8 in which X (t–n, t–1) is replaced with a word or the flowchart (Steps E13 through E19) shown in FIG. 9 in which X (t, t+n) is replaced with a word, depending on a coding system (statistical, or dictionary-based) on the compressing side.

The data decompressing apparatus 3 according to the second modification decodes compressed data by word on the basis of the decompressing dictionary when data to be compressed before compressed is document-form data so as to decode a plurality of character data as a bunch at one time. As compared with a case where the decoding is performed by one character data as a unit, this modification can largely speed up the decoding (decompressing) process. Since compressed data is decoded by data that is "a word" having a meaning, it is possible to perform the decoding process readily and at a high speed.

(c) Others

Figure 16:
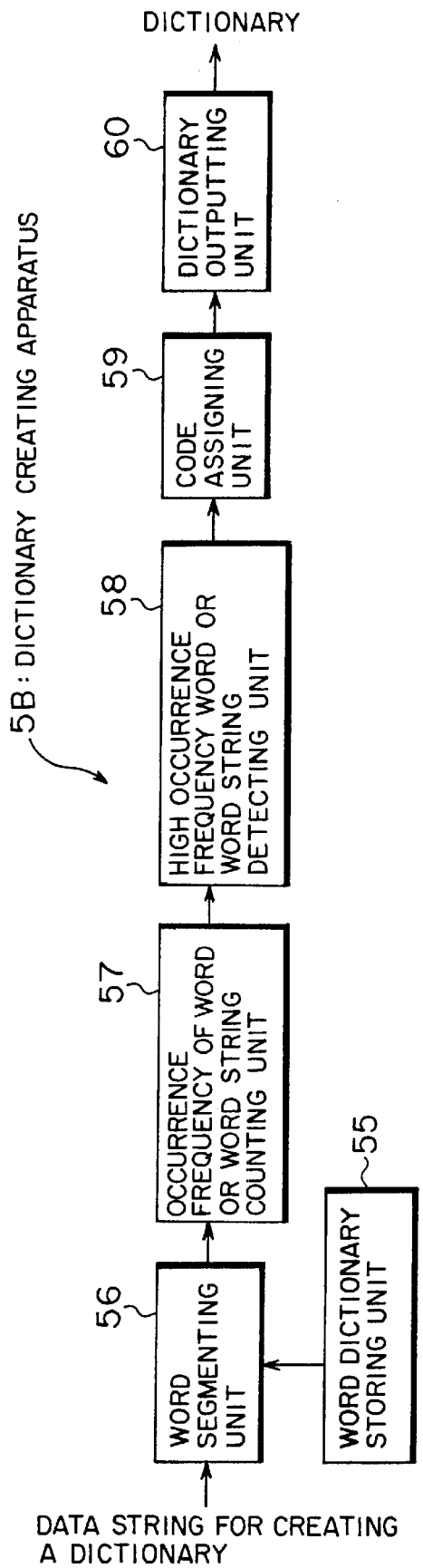
FIG. 16 is a block diagram showing a structure of a dictionary creating apparatus according to the second modification of the first embodiment.

In the above second modification, the compressing or decompressing dictionary stored in the above dictionary storing unit 11 or 31 is created by a dictionary creating apparatus 5B shown in FIG. 16, for example. For this purpose, the dictionary creating apparatus (data compressing or decompressing dictionary creating apparatus) 5B has, as shown in FIG. 16, a word dictionary storing unit 55, a word segmenting unit 56, an occurrence frequency of word or word string counting unit 57, a high occurrence frequency word or word string detecting unit 58, a code assigning unit 59 and a dictionary outputting unit 60.

The word dictionary storing unit 55 stores words or word strings which become basis when data (document-form data) for creating a dictionary is segmented (divided) into words. The word segmenting unit (data dividing unit) 56 segments the data for creating a dictionary into words (predetermined character data group) on the basis the word dictionary storing unit 55. The occurrence frequency of word or word string counting unit (occurrence frequency counting unit) 57 counts occurrence frequency of each word or word string obtained by the word segmenting unit 56.

The high occurrence frequency word or word string detecting unit (high occurrence frequency character data group detecting unit) 58 detects a word or word string whose occurrence frequency is higher than predetermined frequency on the basis of occurrence frequency of each word or word string counted by the occurrence frequency of word or word string counting unit 57. The code assigning unit 59 assigns a predetermined code to a word or word string of high occurrence frequency detected by the high occurrence frequency word or word string detecting unit 58. The dictionary outputting unit (dictionary generating unit) 60 combines the above word or word string of high occurrence frequency with the code and outputs them, thereby generating the above compressing or decompressing dictionary.

The dictionary creating apparatus 5B having the above structure assigns a predetermined code to a word or word string whose occurrence frequency is higher than predetermined frequency on the basis of occurrence frequency of each word or word string obtained by dividing data for creating a dictionary into words, combines the word or word string of high occurrence frequency with the code, and outputs them, thereby automatically creating a dictionary suitable for coding and decoding by word. This allows to omit labor to create a dictionary corresponding to words.

Since a dictionary most suitable for a coding processor a decoding process by data which is "a word" having own meaning is created, it is possible to largely speed up the coding process for data to be compressed or the decoding process for compressed data.

Figure 17:
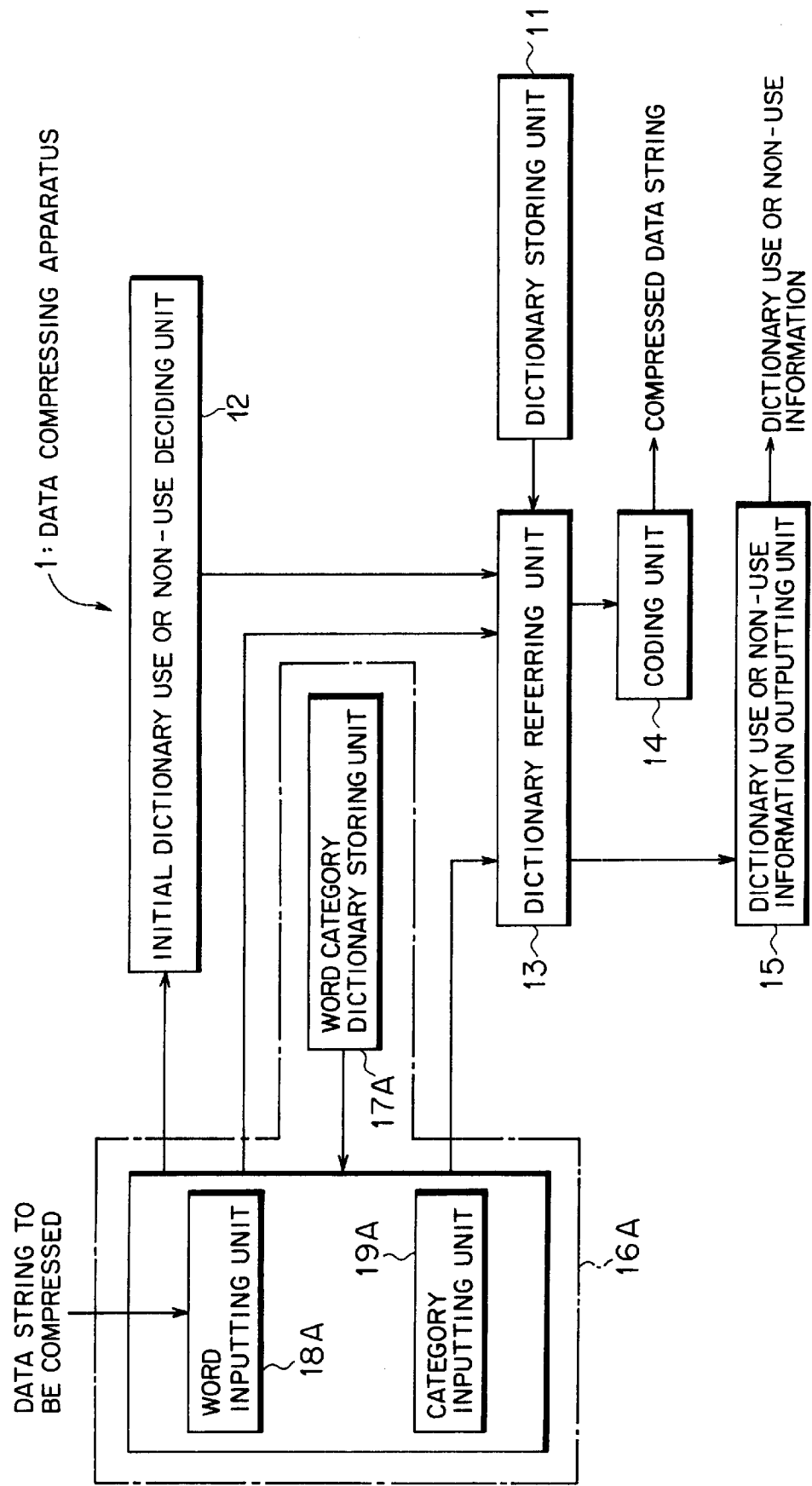
FIG. 17 is a block diagram showing a structure of a data compressing apparatus according to a third modification of the first embodiment.

(A3) Description of a Third Modification of the First Embodiment (a) Description of the Compressing Side FIG. 17 is a block diagram showing a data compressing apparatus according to a third embodiment of the first embodiment. A data compressing apparatus 1 shown in FIG. 17 additionally has a compressed data dividing unit 16A including a word category dictionary storing unit 17A, a word inputting unit 18A and a category inputting unit 19A, as compared with the data compressing apparatus 1 shown in FIG. 1.

The word category dictionary storing unit 17A stores a word category dictionary in which each of desired words (character data groups) occurring in data to be compressed (document-form data) and part-of-speech information (noun, verb, adjective, or the like) on the word are stored as category information is registered. The word inputting unit (word dividing unit) 18A divides data to be compressed into words on the basis of words registered in the word category dictionary in the word category dictionary storing unit 17A. The category inputting unit (category information adding unit) adds part-of-speed information corresponding to a word obtained by the word inputting unit 18A on the basis of the above part-of-speed information registered in the word category dictionary 17A.

Namely, the data compressing apparatus 1 according to the third modification employs a word as a unit of coding of data to be compressed (document-form data) at the time of coding by the coding unit 14, and adds part-of-speech information to each word so as to divide words that are objects of the coding into groups according to the part-of-speech information. It is therefore possible to decrease the number of sorts of codes to be assigned to words (shorten a code length).

Here, the compressing dictionary in which a predetermined code is assigned to each combination of a desired word and category information on the word is stored in the dictionary storing unit 11. The coding unit 14 retrieves a category of data to be compressed that is an object of coding with the category information added by the above category inputting unit 19A as a key to detect a corresponding category group, further retrieves the data to be compressed that is an object of the coding in the group, then outputs codes corresponding to the data to be compressed.

Next, detailed description will be made of an operation of the data compressing apparatus 1 having the above structure according to the third modification with reference to flowcharts (Steps G1 through G21) shown in FIGS. 18 and 19. Incidentally, a process of deciding use or non-use of the compressing dictionary in the initial dictionary use or non-use deciding unit 12 is similar to that described in the first embodiment or the first modification, description of which is omitted here. Hereinafter, the description will be made of only a coding process in the coding unit 14 after use of the compressing dictionary is decided.

(1) In the Case of Statistical Coding

Figure 18:
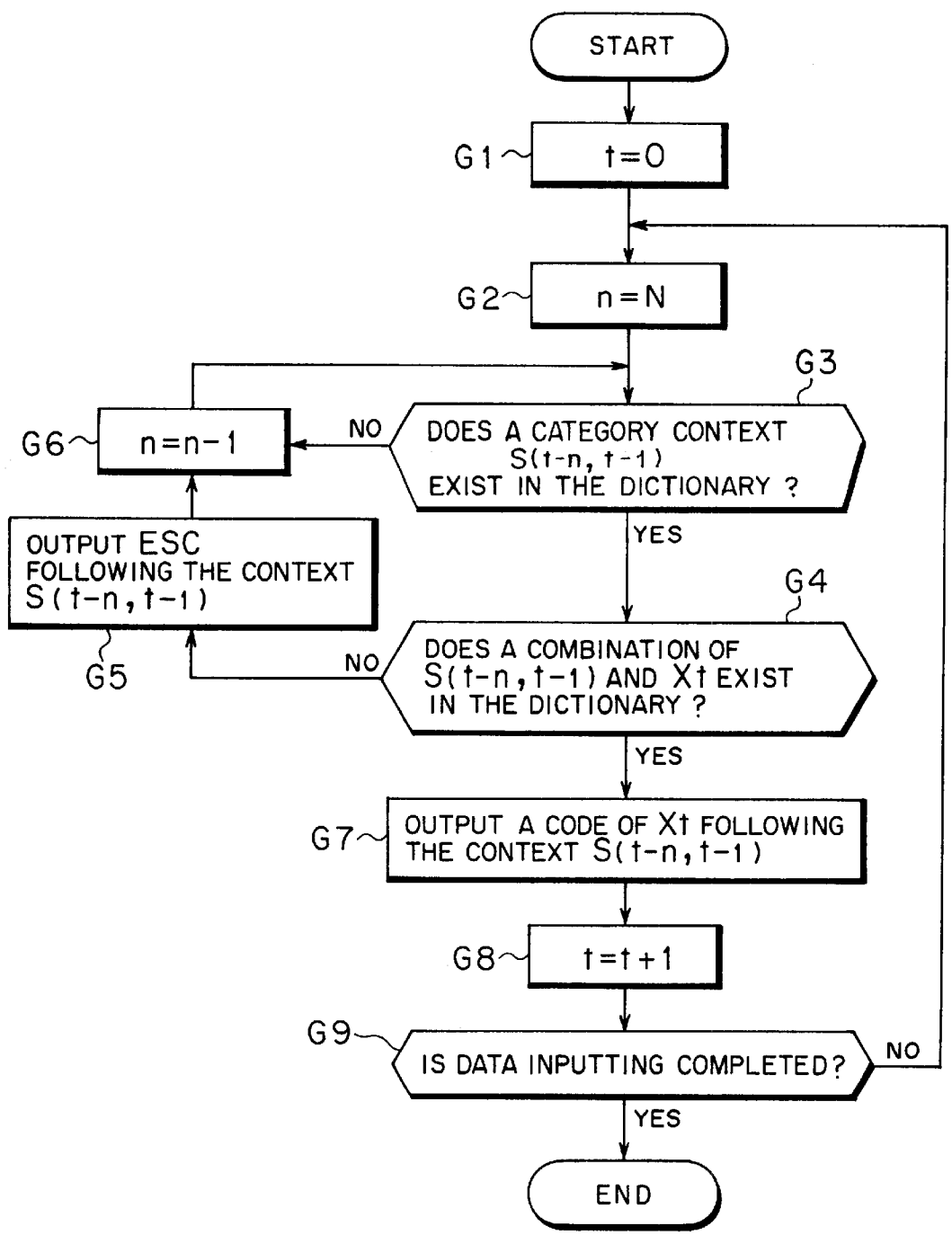
FIG. 18 is a flowchart for illustrating an operation (statistical coding) of a coding unit of the data compressing apparatus according to the third modification of the first embodiment.

When statistical coding is employed, the coding unit 14, as shown in FIG. 18, for example, initializes a parameter t (t=0) for retrieving a category context (category string) S (t−n, t−1) (Step G1), and sets a parameter n for retrieving a longest-matching character string in the context S (t−n, t−1) to a maximum order (a maximum number of characters consisting of the context) N (Step G2). Wherein, each of the above t, n and N are natural numbers, and the above S (t−n, t−1) represents a category string $\{S_{t-n}, S_{t-n+1}, \ldots, S_{t-1}\}$ (where, $S_t$ represents a category of a word (string) $X_t$).

The coding unit 14 determines whether a certain context S (t−n, t−1) exists in the compressing dictionary (Step G3). If not, the coding unit 14 repeats retrieval of the context S (t−n, t−1) while decrementing the parameter n (n=n−1) (that is, descending the order of the context) until detecting the context X (t−n, t−1) (from NO route at Step G3 to Step G6).

If the context S (t−n, t−1) exists in the dictionary, the coding unit 14 further determines whether a combination of the context S (t−n, t−1) and an inputted word (data to be compressed) Xt exists in the above compressing dictionary (Step G4). If not, the coding unit 14 outputs ESC (escape code) following the context S (t−n, t−1) (from NO route at Step G4 to Step G5), descends the order of the context (Step G6), then repeats the above process until detecting the combination (context) of the context S (t−n, t−1) and the inputted word Xt.

If detecting the combination of the context S (t−n, t−1) and the inputted word Xt [if the combination of the context S (t−n, t−1) and the inputted word Xt exists in the compressing dictionary], the coding unit 14 outputs a code of the word Xt following the context S (t−n, t−1) (from YES route at Step G4 to Step G7). After that, the coding unit 14 increments the parameter t (t=t+1: Step G8), and successively codes an inputted word Xt while altering the context S (t−n, t−1) that is an object of the retrieval (NO route at Step G9) until the coding of all inputted data is completed (until judged YES at Step G9).

(2) In the Case of Dictionary-based Coding

Figure 19:
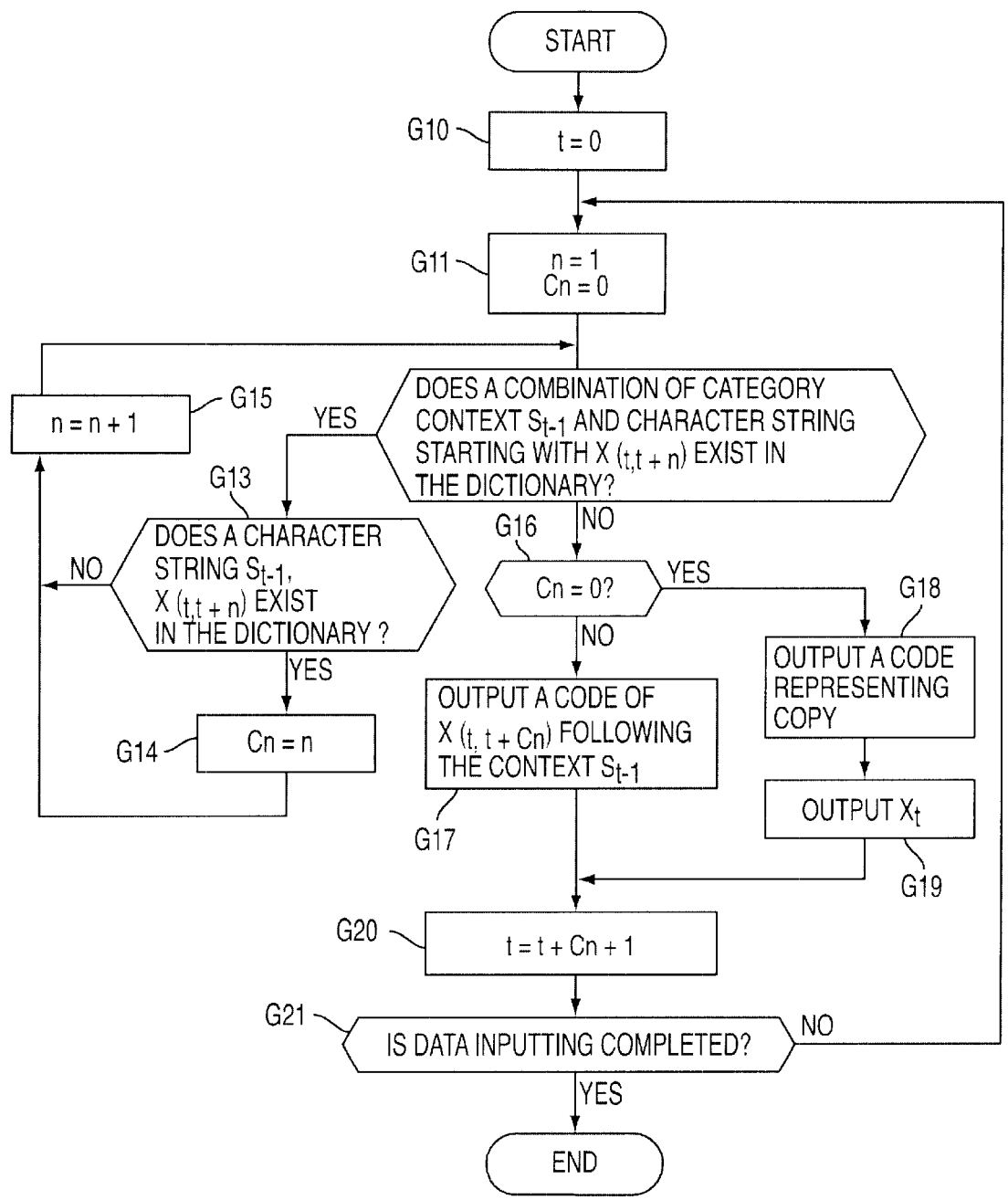
FIG. 19 is a flowchart for illustrating an operation (dictionary-based coding) of the data compressing apparatus according to the third modification of the first embodiment.

If the dictionary-base coding is employed, the coding unit 14, as shown in FIG. 19, for example, initializes parameters t and n for altering a word (string) X (t, t+n) that is an object of retrieval and the number of extended words Cn (where t, n and Cn are natural numbers) of the word (string) X (t, t+n) that is an object of the retrieval (t=0, n=1, Cn=0: Steps G10 and G11) Wherein, the above X (t, t+n) represents a word string $\{X_t, X_{t+1}, \ldots, X_{t+1}\}$ (where $X_t$ represent one word).

The coding unit 14 determines whether a combination of category context $S_{t-1}$ and data string starting with inputted word X (t, t+n) exists in the compressing dictionary (Step G12). If the combination exists, the coding unit 14 further determines whether the combination is a category context $S_{t-1}$ and a word X (t, t+n) that is an object of retrieval itself or not (from YES route at Step G12 to Step G13).

If the word X (t, t+n) that is an object of the retrieval itself exists in the dictionary as a result, the coding unit 14 sets the number of extended words Cn to a value of the parameter n (Step G14), increments n (n=n+1) (Step G15) to increase (extend) the word string X (t, t+n) that is an object of the retrieval by one word, then again determines whether the extended word string X (t, t+n) exists in the dictionary.

If determining that the word string X (t, t+n) does not exist in the dictionary, the coding unit 14 next determines whether the number of extended words Cn=0 (from NO route at Step G12 to Step G16). If Cn≠0 as a result, the coding unit 14 outputs a code in the dictionary corresponding to the word string X (t, t+Cn) following the category context $S_{t-1}$ (from NO route at Step G16 to Step G17). If Cn=0, the coding unit 14 outputs a code representing copy since the word string X (t, t+n) could not be extended even by one word and does not exist in the dictionary (from YES route at Step G16 to Step G18), after that, outputs one word Xt before extended (Step G19).

The coding unit 14 increments the parameter t (t=t+Cn+1) (Step G20) to successively code an inputted word X (t, t+n) while altering the word string X (t, t+n) that is an object of the retrieval (NO route at Step G21) until coding of all inputted data is completed (until judged YES at Step G21).

If data to be compressed is document-form data, the data compressing apparatus 1 according to the third modification divides the document-form data into words, and adds category information (part-of-speech information or the like) on a word to each of the obtained words so as to group words according to the category information. The compressing apparatus 1 therefore can reduce the number of sorts of codes to be assigned to respective words, thereby shortening a code to be assigned to each word. It is thereby possible to decrease a quantity of codes after coding, thus improve a compression ratio. Further, it is possible to readily specify a word to be decoded owing to the above category information, as will be described later. This largely contributes to speeding up of the decoding process.

(b) Description of the Decompressing Side

A decompressing apparatus 3 according to the third modification, that is, a data decompressing apparatus 3 for the above data compressing apparatus 1 described above with reference to FIGS. 17 through 19, has a structure similar to that of the data decompressing apparatus 3 shown in FIG. 6. In this case, the decoding unit 34 decodes having been compressed data compressed by the data compressing apparatus 1 by word (predetermined character data group) on the basis of the above category information.

When receiving a code representing use of the dictionary from the compressing side, the data decompressing apparatus 3 according to the third modification decodes compressed data (codes) by word on the basis of the above category information using the above word unit decompressing dictionary. When receiving a code representing non-use of the dictionary, the data decompressing apparatus 3 does not perform the decoding process since data to be compressed is inputted as it is, not coded.

A decoding system used in the decoding unit 34 of the data decompressing apparatus 3 according to the third modification corresponds to a coding system employed in the above coding unit 14. If statistical coding is employed in the coding unit 14, the decoding unit 34 decodes compressed data in the probability statistical decoding system. If dictionary-based coding is employed in the coding unit 14, the decoding unit 34 decodes compressed data in dictionary-based decoding system. Hereinafter, detailed description will be made of a decoding process by the decoding unit 34 with reference to flowcharts (Steps H1 through H16) shown in FIGS. 20 and 21.

(1) In the Case That the Compressing Side Employs Statistical Coding

Figure 20:
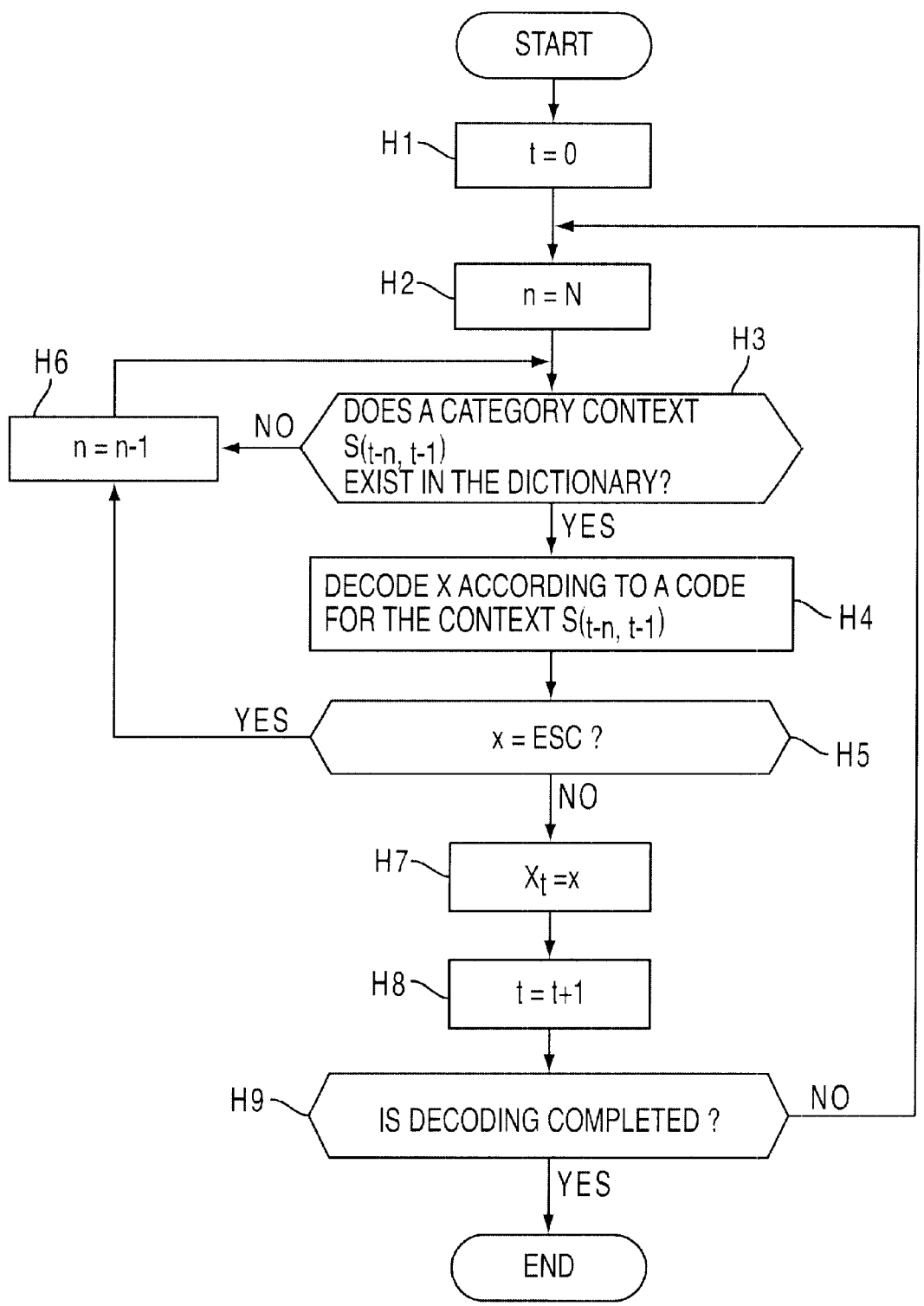
FIG. 20 is a flowchart for illustrating an operation (statistical decoding) of a coding unit of a data decompressing apparatus according to the third modification of the first embodiment.

In this case, the decoding unit 34, as shown in FIG. 20, initializes a parameter t for retrieving a category context (category string) S (t-n, t-1) (Step H1), besides setting a parameter n for retrieving a longest-matching character string in the context X (t-n, t-1) to a maximum order (a maximum number of characters consisting of the context) of the context S (t-n, t-1) (Step H2). Wherein, the above t, n and N are natural numbers, and the above S (t-n, t-1) represents a category string $\{S_{t-n}, S_{t-n+1}, \ldots, S_{t-1}\}$ (where $S_t$ represents a category of a word (string) $X_t$).

The decoding unit 34 determines whether a certain context S (t-n, t-1) that is an object of the coding exists in the decompressing dictionary in the dictionary storing unit 31 (Step H3). If not, the decoding unit 34 repeats retrieval of the context S (t-n, t-1) while decrementing the parameter n (n=n-1) until detecting the context S (t-n, t-1) (from NO route at Step H3 to Step H6).

If detecting the context S (t-n, t-1), the decoding unit 34 decodes a longest-matching word (string) x according to a code corresponding to the context S (t-n, t-1) (from YES route at Step H3 to Step H4), and determines whether the decoded longest-matching word x is ESC (escape code) (Step H5).

If the decoded word x is ESC as a result (if judged YES at Step H5), the decoding unit 34 repeats retrieval of the context S (t-n, t-1) while decrementing the parameter n (Step H6) until decoding a word other than ESC (until judged NO at Step H5).

If the decoded word x is other than ESC, the decoding unit 34 outputs the decoded word x as a decoded word Xt (Xt=x: from NO route at Step H5 to Step H7). The decoding unit 34 increments the parameter t (t=t+1: Step H8), and successively decodes inputted compressed data while altering the context X (t-n, t-1) that is an object of the retrieval (NO route at Step H9) until decoding of all compressed data (codes) is completed (until judged YES at Step H9).

(2) In the Case Where the Compressing Side Employs Dictionary-based Coding

Figure 21:
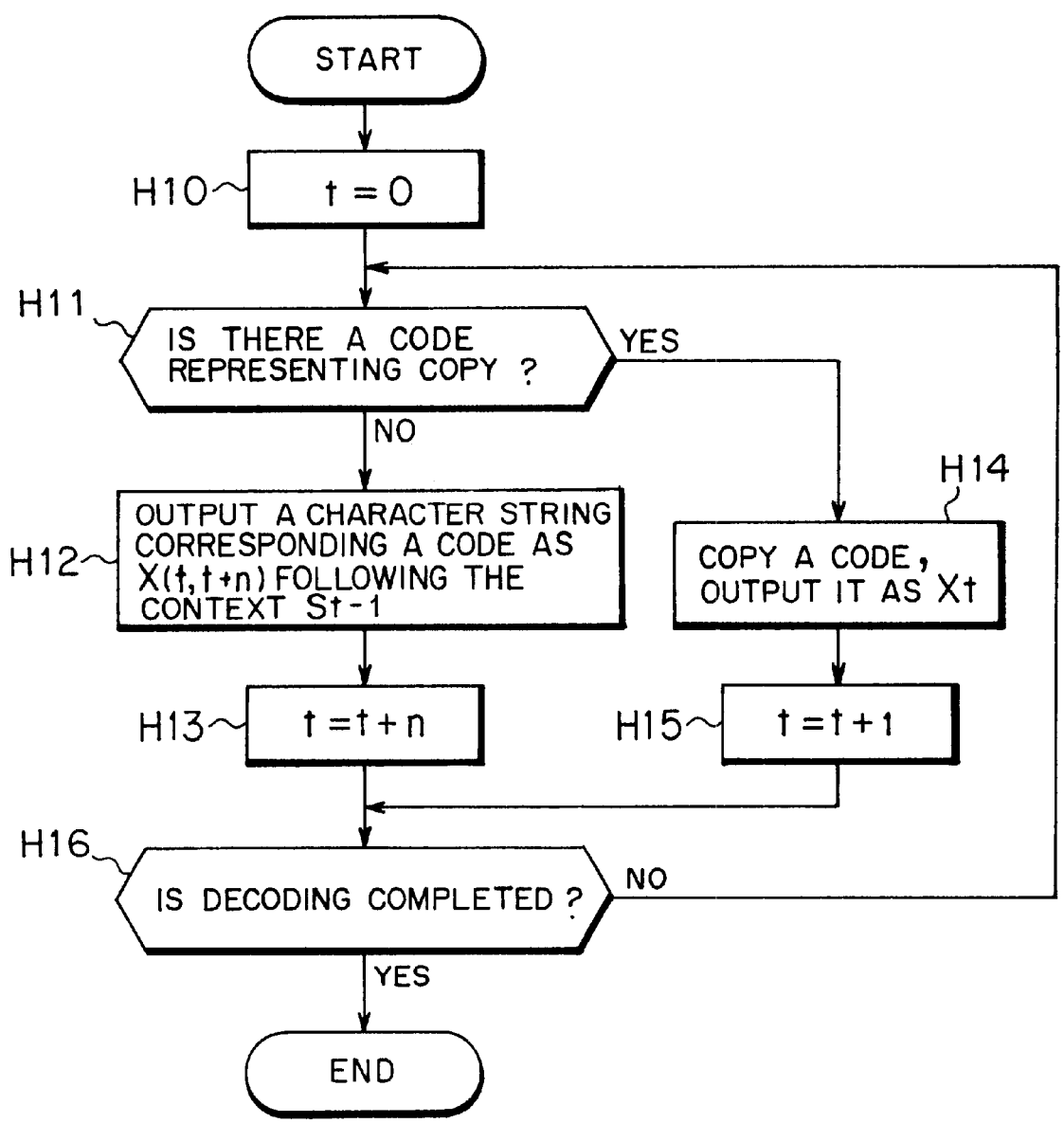
FIG. 21 is a flowchart for illustrating an operation (dictionary-based decoding) of the decoding unit of the data decompressing apparatus according to the third modification of the first embodiment.

In this case, the decoding unit 34, as shown in FIG. 21, initializes a parameter t (t=0) (Step H10), after that, determines whether an inputted code (compressed data) is a code representing copy (Step H11).

If the inputted code is not a code representing copy as a result, the decoding unit 34 outputs a word corresponding to the inputted code on the basis of the decompressing dictionary in the dictionary storing unit 31 as a decoded word X (t, t+n) following the context $S_{t-1}$ (from NO route at Step H11 to Step H12), and increments the parameter t by n (t=t+n: Step H13).

If the inputted code is a code representing copy, the decoding unit 34 outputs the inputted code as it is as a decoded word Xt (from YES route at Step H11 to Step H14), and increments the parameter t (t=t+1: Step H15).

The decoding unit 34 successively decodes inputted compressed data (NO route at Step H16) until decoding of all compressed data (codes) is completed (until judged YES at Step H16).

If the above initial dictionary use or non-use deciding unit 32 decides non-use of the decompressing dictionary, the dictionary referring unit 33 notifies the decoding unit 34 of it. The decoding unit 34 thereby does not decode compressed data (original data having not been compressed on the compressing side actually) and outputs it as it is.

The data decompressing apparatus 3 according to the third modification decodes compressed data from the compressing side on the basis of category information on words in data to be compressed (document-form data) so as to readily specify words to be decoded. As compared with the above second modification, it is possible to more speed up the decoding process.

(c) Others

Figure 22:
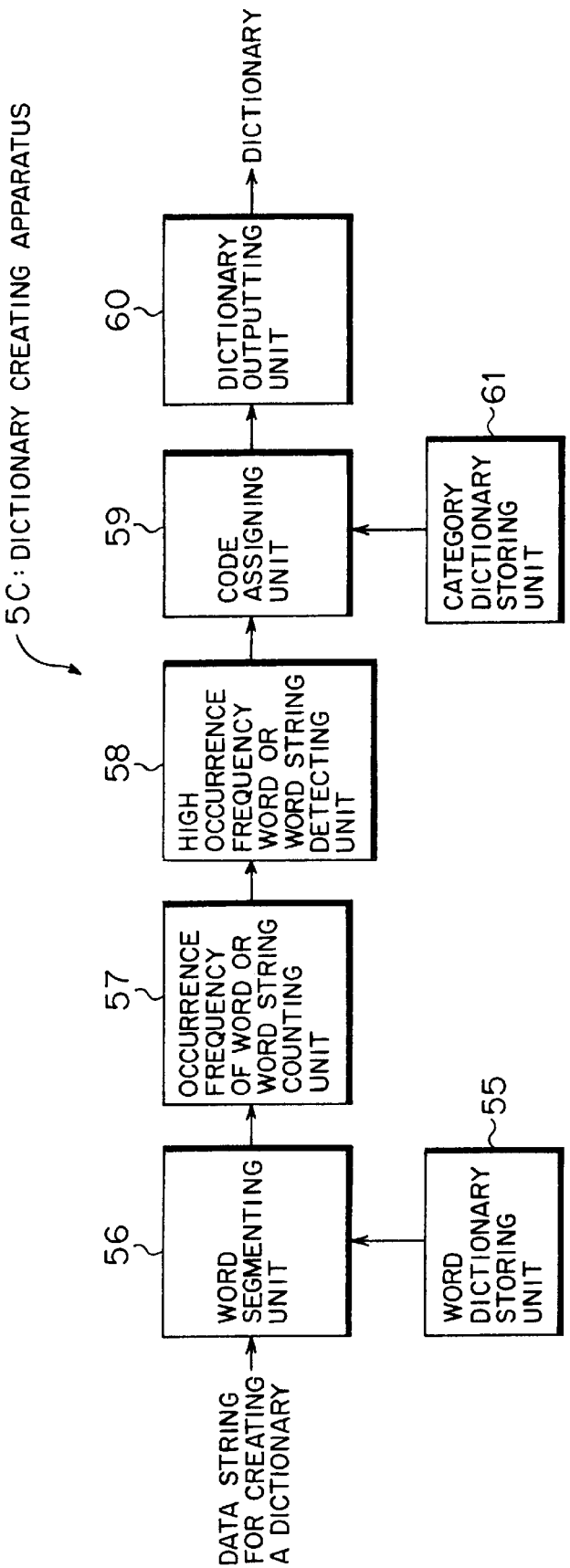
FIG. 22 is a block diagram showing a structure of a dictionary creating apparatus according to the third modification of the first embodiment.

In the above third modification, the compressing or decompressing dictionary stored in the above dictionary storing unit 11 or 31 is created by the dictionary creating apparatus 5C shown in FIG. 22, for example. For this purpose, the dictionary creating apparatus (data compressing or decompressing dictionary creating apparatus) 5C additionally has, as shown in FIG. 22, a category dictionary storing unit 61, along with a word dictionary storing unit 55, a word segmenting unit 56, an occurrence frequency of word or word string counting unit 57, a high occurrence frequency word or word string detecting unit 58, a code assigning unit 59 and a dictionary outputting unit 60 which are similar to those shown in FIG. 16.

The above category dictionary storing unit 61 stores a category dictionary in which category information (part-of-speech information) to be assigned to a word or word string along with a code when the code is assigned to the word or word string of high occurrence frequency by the code assigning unit 59 for each word or word string is stored. The above code assigning unit 59 adds category information on a word or word string of high occurrence frequency to a code to be assigned to the word or word string of high occurrence frequency on the basis the category dictionary stored in the category dictionary storing unit 61.

Whereby, the above dictionary creating apparatus 5C can divide words or word strings in groups according to the above category information. As a result, the number of sorts of codes to be assigned to the above words or word strings is decreased and a code to be assigned to each word is shortened so that a size of the dictionary is reduced. By using the dictionary, a quantity of codes after the process is decreased, thus a compression ratio is improved on the compressing (coding) side, besides a word to be decoded is readily specified according to the category information on the decompressing (decoding) side. Therefore, this largely contributes to speeding-up of the decoding process.

Figure 23:
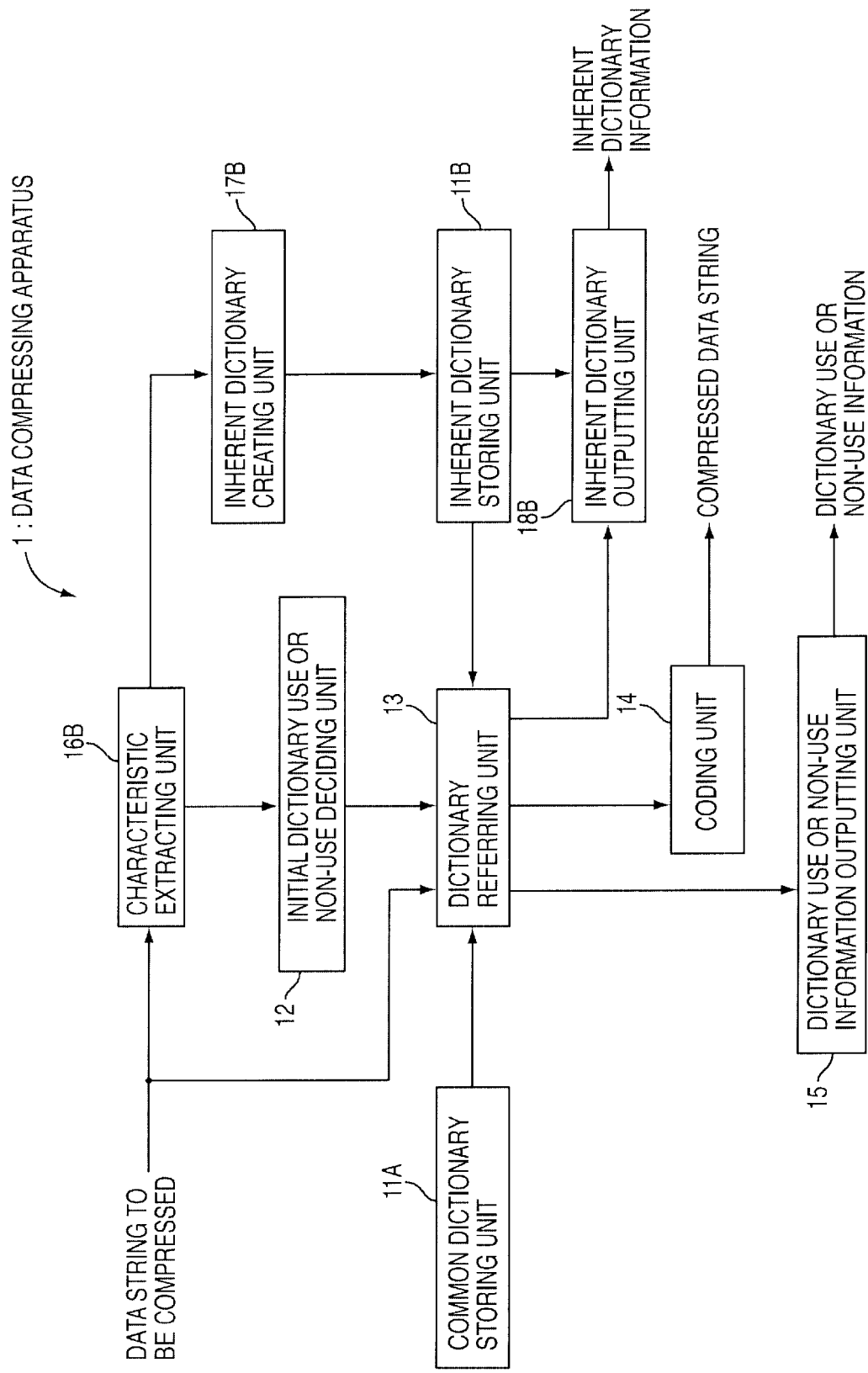
FIG. 23 is a block diagram showing a structure of a data compressing apparatus according to a fourth modification of the first embodiment.

(A4) Description of a Fourth Modification of the First Embodiment (a) Description of the Compressing Side FIG. 23 is a block diagram showing a structure of a data compressing apparatus according to a fourth modification of the first embodiment. A data compressing apparatus 1 shown in FIG. 23 additionally has a common dictionary storing unit 11A, an inherent dictionary storing unit 11B, a characteristic extracting unit 16B, an inherent dictionary creating unit 17B and an inherent dictionary outputting unit 18B, as compared with the data compressing apparatus 1 shown in FIG. 1.

The above characteristic extracting unit 16B extracts characters (character strings) inherent to data to be compressed as characteristic data of the data to be compressed. The inherent dictionary creating unit (compressing inherent dictionary creating unit) 17B assigns predetermined codes to each of the characteristic data extracted by the characteristic extracting unit 16B to create an inherent compressing dictionary inherent to the data to be compressed. The created inherent dictionary is stored in the above inherent dictionary storing unit 11B.

The above inherent dictionary and a common dictionary (compressing dictionary) stored in the common dictionary storing unit (compressing dictionary storing unit) 11A are merged by the dictionary referring nit 13, as will be described later. Namely, the coding unit 14 according to this modification codes data to be compressed on the basis of the above compressing inherent dictionary created by the inherent dictionary creating unit 17B and the common dictionary stored in the common dictionary storing unit 11A.

The inherent dictionary outputting unit (inherent dictionary information outputting unit) 18B outputs information on the above inherent dictionary to the decompressing side for the data to be compressed.

Next, detailed description will be made of an operation of the data compressing apparatus 1 having the above structure according to the fourth modification with reference to a flowchart (Steps J1 through J6) shown in FIG. 24. Incidentally, a process of deciding use or non-use of the compressing dictionary in the initial dictionary use or non-use deciding unit 12 is similar to that described in the first embodiment or the first modification, description of which is omitted here. Hereinafter, the description will be made of the operation, paying an attention to a coding process in the coding unit 14 after use of the compressing dictionary is decided.

In the data compressing apparatus 1, the characteristic extracting unit 16B counts occurrences of each character or character string occurring in data (string) to be compressed (Step J1), and extracts high ranked Np (Np is a natural number) characters or character strings frequently occurring (deleting the remainder: Step J2). The characteristic extracting unit 16B compares the obtained characters or character strings with characters or character strings in the common dictionary (set dictionary) in the common dictionary storing unit 11A, and deletes coinciding information (included in the common dictionary to extract the remaining characters or character strings as characteristic data (Step J3).

The characteristic data obtained as above is given to the inherent dictionary creating unit 17B. The inherent dictionary creating unit 17B appropriately assigns predetermined codes to the received characteristic data to create the inherent dictionary, and stores it in the inherent dictionary storing unit 11B (Step J4). The dictionary referring unit 13 merges the inherent dictionary stored as above in the inherent dictionary storing unit 11B and the common dictionary in the common dictionary storing unit 11A (Step J5).

Whether the initial dictionary use or non-use deciding unit 12 decides use of the compressing dictionary, the dictionary referring unit 13 outputs information (inherent dictionary information) on the inherent dictionary to the decoding side described later, besides the coding unit 14 successively codes the data to be compressed on the basis of the dictionary (inherent dictionary+common dictionary) merged by the dictionary referring unit 13 (Step J6).

The coding procedure in the coding unit 14 is performed similarly to the first embodiment described above. Namely, either statistical coding (refer to FIG. 4) or dictionary-based coding (refer to FIG. 5) is employable. The process of deciding use or non-use of the compressing dictionary in the initial dictionary use or non-use deciding unit 12 is performed similarly to the first embodiment or the first modification, as well.

Whether the initial dictionary use or non-use deciding unit 12 decides non-use of the dictionary, the coding unit 14 does not code the data to be compressed, but copies it and outputs it as it is.

In the data compressing apparatus 1 according to the fourth modification, the inherent dictionary creating unit 17B assigns predetermined codes to characters or character strings inherent to data to be compressed to create an inherent dictionary inherent to the data to be compressed, and the coding unit 14 codes the data to be compressed on the basis of a dictionary obtained by merging the inherent dictionary and the common dictionary, so as to largely decrease probability of coding data to be compressed not registered in the dictionary, thus improve a compression ratio.

The above inherent dictionary information is outputted to the decompressing side. Therefore, the decompressing side can certainly decode (decompress) the compressed data coded according to the inherent dictionary originally created on the coding side, as will be described later.

The data compressing apparatus 1 according to the fourth modification codes data to be compressed by character or character string. However, it is alternatively possible to code the data to be compressed by word, or code the data to be compresed by word while adding category information thereto, similarly to the above second and third modifications.

(b) Description of the Decompressing Side

Figure 25:
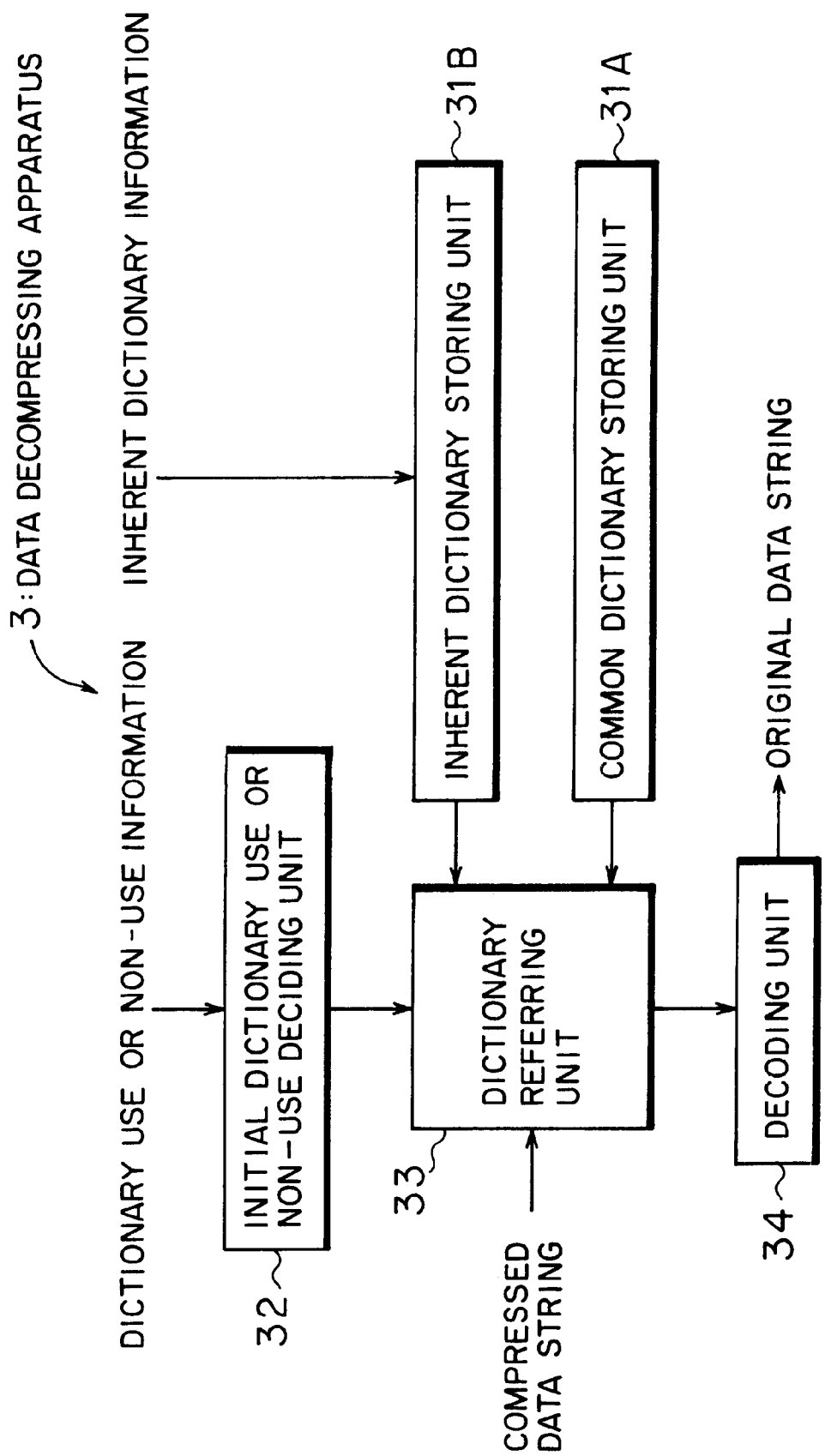
FIG. 25 is a block diagram showing a structure of a data decompressing apparatus according to the fourth modification of the first embodiment.

FIG. 25 is a block diagram showing a structure of a data decompressing apparatus 3 according to the fourth modification of the first embodiment. The data decompressing apparatus 3 shown in FIG. 25 corresponds to the decompressing side for the data compressing apparatus 1 described above with reference to FIG. 23, which has a common dictionary storing unit 31A and an inherent dictionary storing unit 31B, unlike that according to the first embodiment shown in FIG. 6.

The common dictionary storing unit 31A stores a dictionary having the same contents as the common dictionary stored in the common dictionary storing unit 11A on the compressing side. The inherent dictionary storing unit (decompressing inherent dictionary storing unit) 31B stores a dictionary having characters or character strings inherent to data to be compressed, which is compressed data before compression, as characteristic data of the data to be compressed, in which a predetermined code is assigned to each character data, as a decompressing inherent dictionary. According to this modification, by receiving the inherent dictionary information outputted from the inherent dictionary outputting unit 18B on the compressing side, the inherent dictionary storing unit 31B stores a dictionary having the same contents as the inherent dictionary created by the inherent dictionary creating unit 17B on the compressing side as the above decompressing dictionary.

The above common dictionary and the inherent dictionary are merged by the dictionary referring unit 33, similarly to the compressing side, and used in the decoding process in the decoding unit 34. When the initial dictionary use or non-use deciding unit 32 decides use of the dictionary, the decoding unit 34 decodes compressed data on the basis of the inherent dictionary in the inherent dictionary storing unit 31B and the common dictionary (decompressing dictionary) in the common dictionary storing unit 31A merged as above by the dictionary referring unit 33.

The above initial dictionary use or non-use deciding unit 32 decides use or non-use of the dictionary according to the dictionary use or non-use information from the dictionary use or non-use information outputting unit 15 on the compressing side in this modification, as well.

Figure 26:
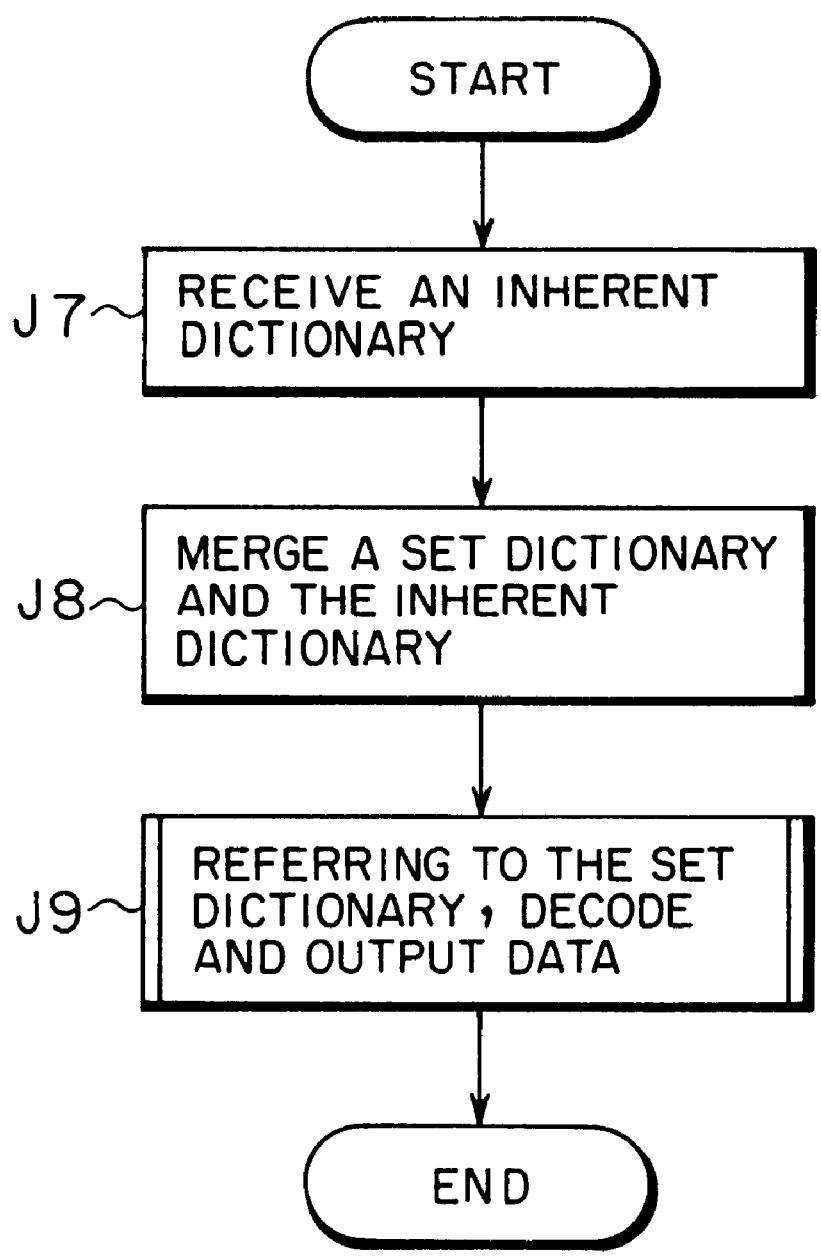
FIG. 26 is a flowchart for illustrating an operation of the data decompressing apparatus according to the fourth modification of the first embodiment.

Hereinafter, detailed description will be made of an operation of the data decompressing apparatus 3 having the above structure according to the fourth modification with reference to a flowchart (Steps J7 through J9) shown in FIG. 26.

When the data decompressing apparatus 3 receives inherent dictionary information inputted from the inherent dictionary outputting unit 18B on the compressing side (Step J7), the inherent dictionary storing unit 31B stores the information so as to generate an inherent dictionary having the same contents as that on the compressing as a decompressing inherent dictionary. The dictionary referring unit 33 merges the decompressing inherent dictionary and the common dictionary (Step J8).

If the initial dictionary use or non-use deciding unit 32 decides use of the dictionary according to the dictionary use or non-use information received from the dictionary use or non-use information outputting unit 15 on the compressing side in this state, the decoding unit 34 successively decodes compressed data referring to the dictionary (inherent dictionary+common dictionary) merged as above by the dictionary referring unit 33 (Step J9).

Incidentally, if the compressing side (coding unit 14) employs statistical coding, statistical decoding (refer to FIG. 8) is employed in the decoding process in the decoding unit 34. If the compressing side (coding unit 14) employs dictionary-based coding, dictionary-based decoding (refer to FIG. 9) is employed, as well as in the first embodiment.

If the initial dictionary use or non-use deciding unit 32 decides non-use of the dictionary, the decoding unit 34 does not decode the compressed data (original data having not been compressed actually), but copies it and output it as it is.

The data decompressing apparatus 3 according to the fourth modification decodes compressed data on the basis of both of the inherent dictionary in the inherent dictionary storing unit 31B and the common dictionary in the common dictionary storing unit 31A so as to largely decrease probability of decoding compressed data not registered in the dictionary. This largely improves efficiency of decoding.

At this time, the inherent dictionary storing unit 31B receives information on the compressing inherent dictionary from the compressing side so as to generate a dictionary having the same contents as the inherent dictionary used on the compressing side as the above decompressing inherent dictionary. It is therefore possible to decode very accurately compressed data having been coded according to the inherent dictionary originally created on the compressing side.

If the compressing side codes data to be compressed by word, or code data to be compressed by word while adding category information thereto, the decompressing side can decode compressed data by word, or decode the compressed data by word on the basis of the category information, as well as in the second and third modifications.

Figure 27:
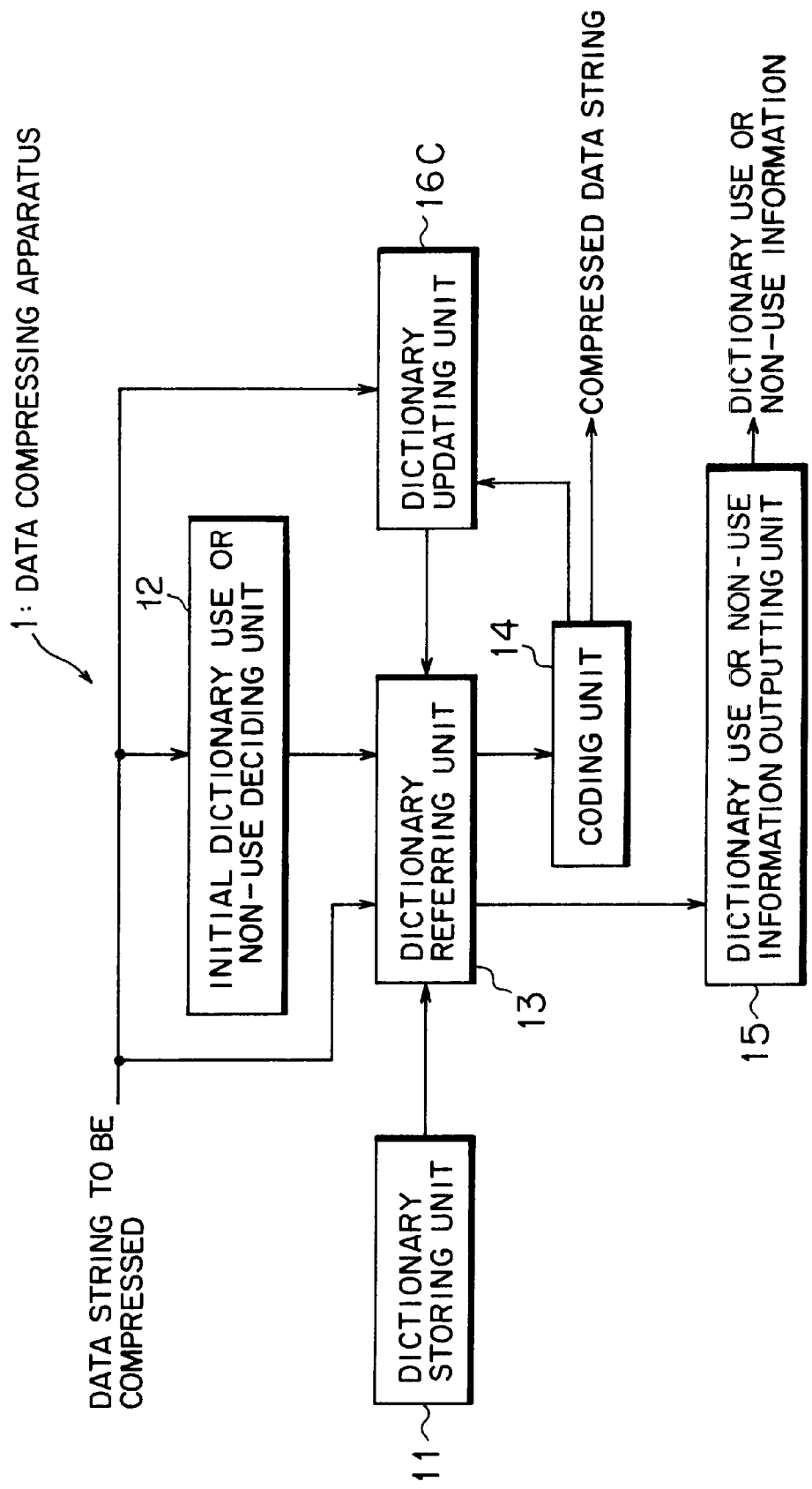
FIG. 27 is a block diagram showing a structure of a data compressing apparatus according to a fifth modification of the first embodiment.

(A5) Description of a Fifth Modification of the First Embodiment (a) Description of the Compressing Side FIG. 27 is a block diagram showing a structure of a data compressing apparatus according to a fifth modification of the first embodiment. A data compressing apparatus 1 shown in FIG. 27 additionally has a dictionary updating unit 16C, as compared with that shown in FIG. 1.

The dictionary updating unit (compressing dictionary updating unit) 16C updates a compressing dictionary in the dictionary storing unit 11 on the basis of data to be compressed, coded by code in the coding unit 14. According to the fifth modification, the coding unit 14 codes the data to be compressed on the basis of the compressing dictionary updated by the dictionary updating unit 16C.

Next, detailed description will be made of an operation of the data compressing apparatus 1 having the above structure according to the fifth modification. In the fifth modification, a process of deciding use or non-use of the compressing dictionary in the initial dictionary use or non-use deciding unit 12 is similar to that in the first embodiment or the first modification, description of which is omitted here. Hereinafter, the description will be made of a coding process in the coding unit 14 after use of the compressing dictionary is decided.

(1) In the Case of Statistical Coding

Figure 28:
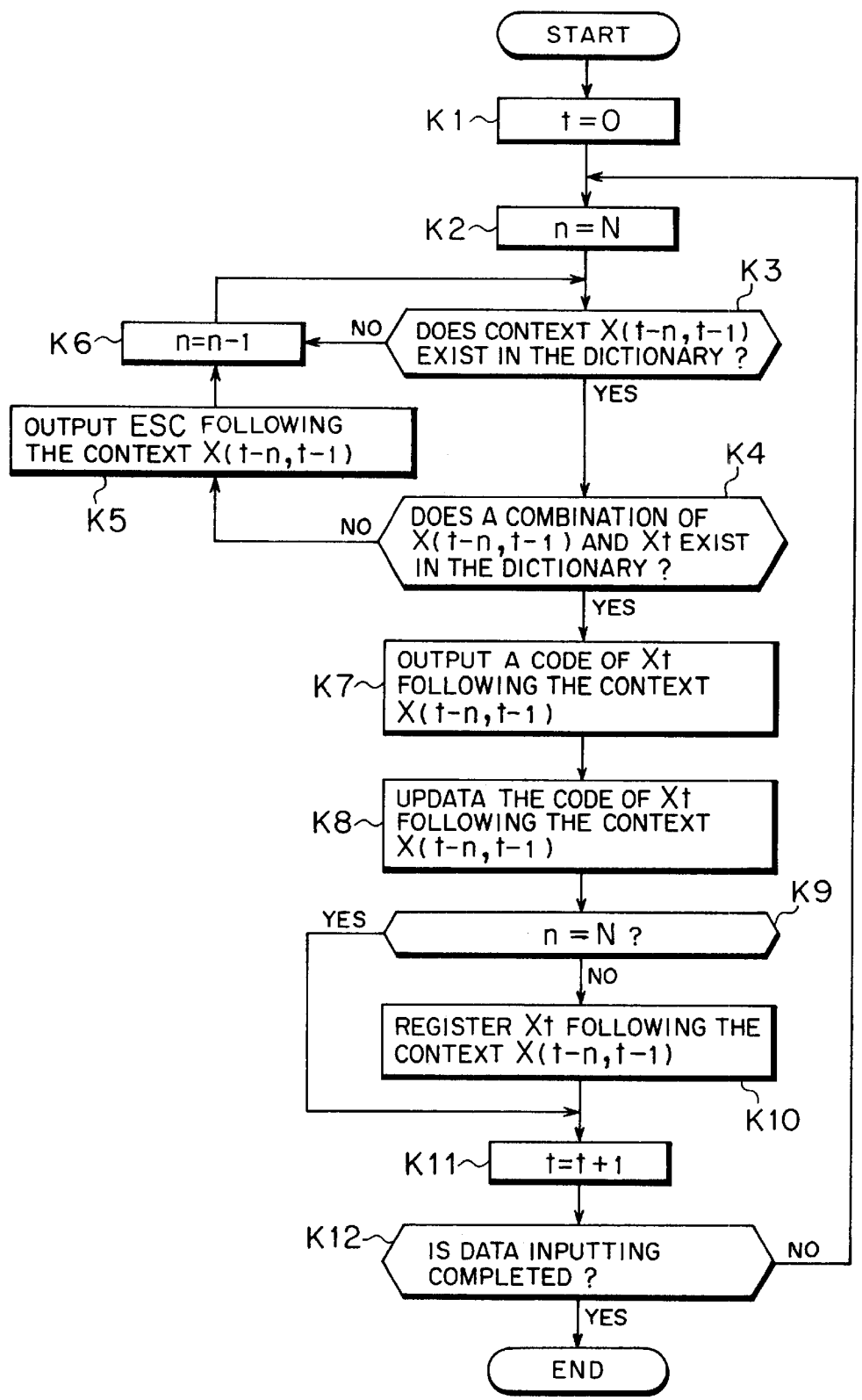
FIG. 28 is a flowchart for illustrating an operation (statistical coding) of a coding unit of the data compressing apparatus according to the fifth modification of the first embodiment.

If statistical coding is employed, the coding unit 14 initializes, as shown in FIG. 28, for example, a parameter t for retrieving a context (character string) X (t−n, t−1) (t=0) (Step K1), and sets a parameter n for retrieving a longest-matching character string in the context (t−n, t−1) to a maximum number of order (a maximum number of characters consisting of the context) of the context X (t−n, t−1) (Step K2). Wherein, the above t, n and N are natural numbers, and the above X (t−n, t−1) represents a character string $\{X_{t-n}, X_{t-n+1}, \ldots X_{t-1}\}$ (where $X_t$ represents one character).

The coding unit 14 determines whether a certain context X (t−n, t−1) exists in the compressing dictionary (Step K3). If not, the coding unit 14 repeats retrieval of the context X (t−n, t−1) while decrementing (descending the order) the parameter n (n=n−1) until detecting the context X (t−n, t−1) (from NO route at Step K3 to Step K6).

If the context X (t−n, t−1) exists in the dictionary, the coding unit 14 further determines whether a context configured with the context X (t−n, t−1) and an inputted character (data to be compressed) Xt added thereto already exists in the above compressing dictionary (from YES route at Step K3 to Step K4) If not, the coding unit 14 outputs ESC (escape code) following the context (t−n, t−1) (from NO route at Step K4 to Step K5), and descends the order of the context (Step K6), and repeats the above process until detecting the combination (context) of the context X (t−n, t−1) and the inputted character Xt.

When detecting the combination of the context X (t−n, t−1) and the inputted character Xt (if the combination exists in the compressing dictionary), the coding unit 14 outputs a code of the character Xt following the context x (t−n, t−1) (from YES route at Step K4 to Step K7). The dictionary updating unit 16C updates the code of one character Xt following the context X (t−n, t−1) in the compressing dictionary (Step K8).

The dictionary updating unit 16C then determines whether the parameter n at present is N (n=N?: Step K9). If n≠N, the dictionary updating unit 16C registers one character Xt whose code has been updated in a position following the context X (t−n, t−1) in the compressing dictionary (from NO route at Step K9 to Step K10) If n=N, the dictionary updating unit 16C does not perform the above updating (registering) process (YES route at Step K9).

The coding unit 14 increments the parameter t (t=t+1: Step K11), and successively codes an inputted character Xt while altering the context (t−n, t−1) that is an object of retrieval and updating the compressing dictionary (NO route at Step K12) until coding of all inputted data is completed (until it is judged as YES at Step K12).

(2) In the Case of Dictionary-based Coding

Figure 29:
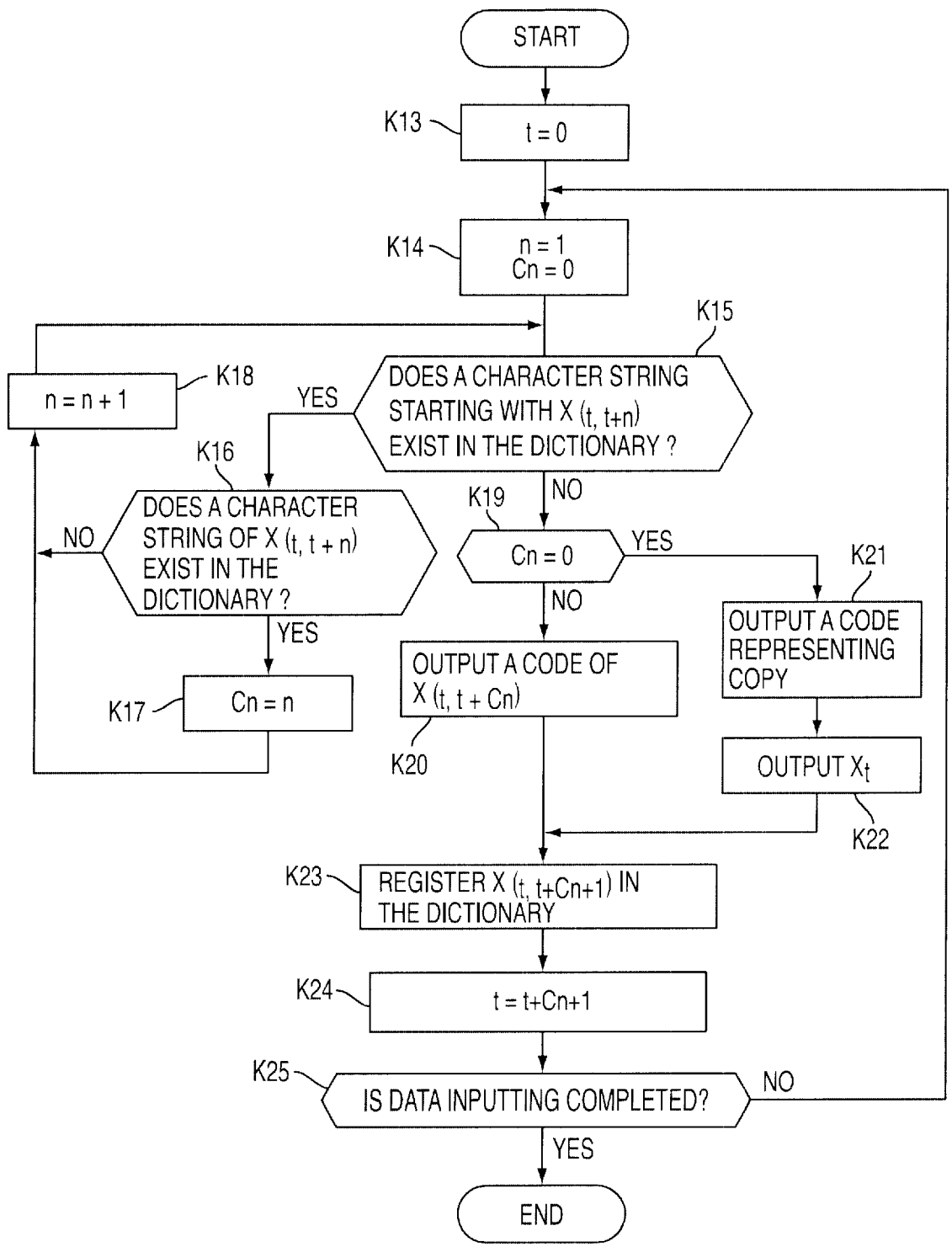
FIG. 29 is a flowchart for illustrating an operation (dictionary-based coding) of the coding unit of the data compressing apparatus according to the fifth modification of the first embodiment.

If dictionary-based coding is employed, the coding unit 14, as shown in FIG. 29, for example, initializes parameters t and n for altering a character string X (t, t+n) that is an object of retrieval and the number of extended characters Cn (where t, n and Cn are natural numbers) of the character string (t, t+1) that is an object of the retrieval (t=0, n=1, Cn=0: Steps K13 and K14). In this case, the above X (t, t+1) represents a character string $\{X_t, X_{t+1}, \ldots, X_{t+n}\}$ (where $X_t$ represents one character).

The coding unit 14 determines whether a character string starting with an inputted character string (character string that is an object of retrieval) X (t, t+n) to be coded exists in the compressing dictionary set as above (Step K15). If the character string exists in the dictionary, the coding unit 14 further determines whether the character string is a character string X (t, t+n) that is an object of retrieval itself [whether the character string X (t, t+n) exists in the dictionary] (from YES route at Step K15 to Step K16).

If the character string X (t, t+n) that is an object of the retrieval itself exists in the dictionary as a result, the coding unit 14 sets the number of extended characters Cn to a value of the above parameter n (Step K17), increments n (n=n+1) (Step K18) to increase (extend) the character string X (t, t+n) that is an object of retrieval by one character, and again determines whether the extended character string X (t, t+n) exists in the dictionary.

When determining that the character string X (t, t+n) does not exist in the dictionary, the coding unit 14 determines whether the number of extended characters Cn is 0 (from NO route at Step K15 to Step K19) If Cn≠0 as a result, the coding unit 14 outputs a code in the dictionary corresponding to the extended character string X (t, t+Cn) (from NO route at Step K19 to Step K20). If Cn =0, the coding unit 14 outputs a code representing copy since it is determined that the character string X (t, t+n) could not be extended even by one character and does not exist in the dictionary (from YES route at Step K19 to Step K21), and outputs one character Xt before extended (Step K22).

The dictionary updating unit 16C registers a character string X (t, t+Cn+1) in the dictionary to update it (Step K23). The coding unit 14 increments the parameter t (t=t+Cn+1) (Step K24), and successively codes an inputted character string X (t, t+n) while altering the character string X (t, t+n) that is an object of the retrieval and updating the compressing dictionary (NO route at Step K25) until coding of all inputted data is completed (until judged YES at Step K25).

In the data compressing apparatus 1 according to the fifth modification, since the dictionary updating unit 16C updates the compressing dictionary in the dictionary storing unit 11 used in coding on the basis of data to be compressed coded by code at that time as above, it is possible to always provide the compressing dictionary suitable for data to be compressed that is an object of the next coding. This further improves a compression ratio.

The data compressing apparatus 1 according to the fifth modification may code data to be compressed by word, or code data to be compressed by word while adding category information thereto, as well as in the above second and third modifications.

(b) Description of the Decompressing Side

Figure 30:
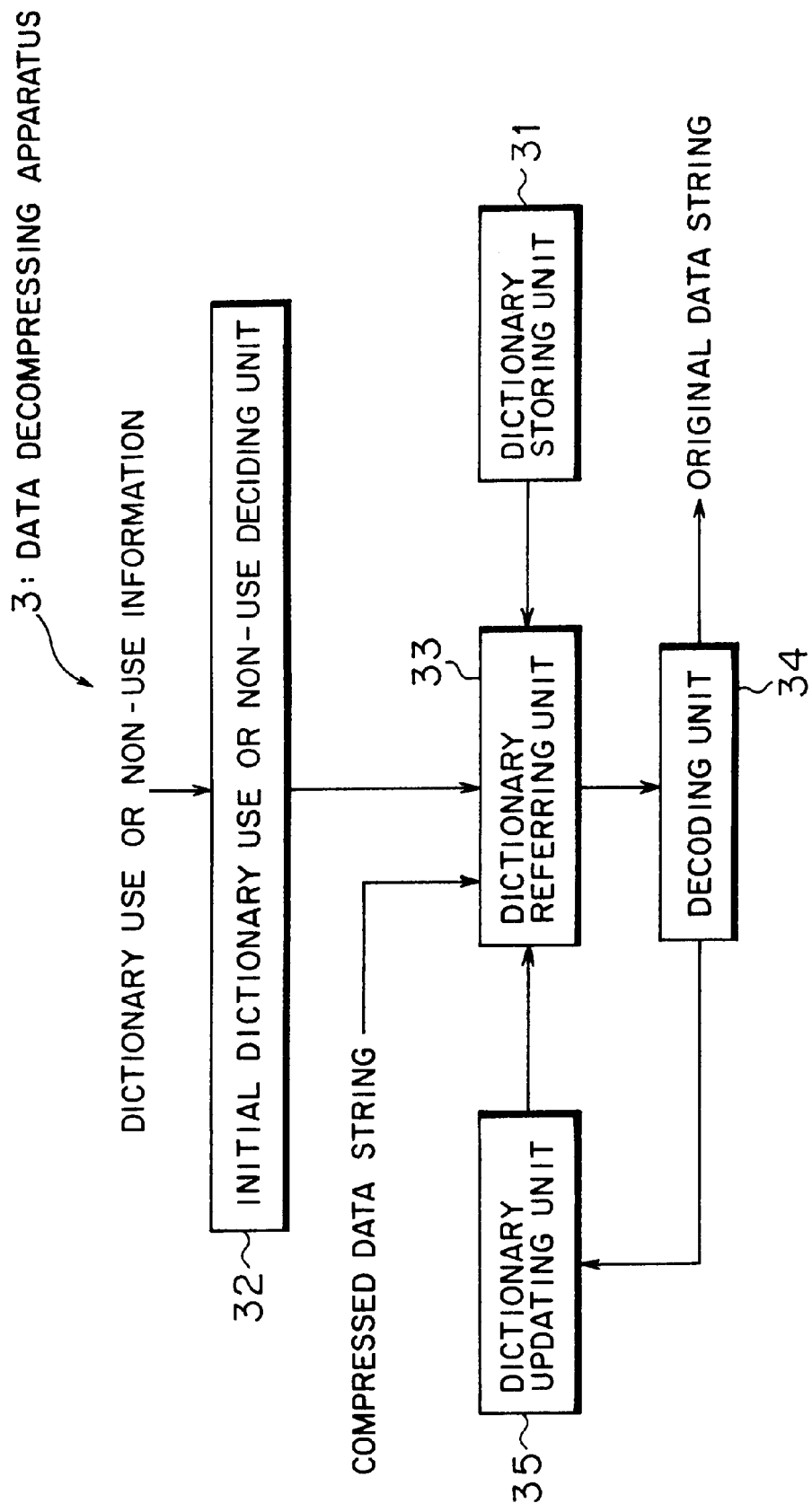
FIG. 30 is a block diagram showing a structure of a data decompressing apparatus according to the fifth modification of the first embodiment.

FIG. 30 is a block diagram showing a structure of a data decompressing apparatus 3 according to the fifth modification of the first embodiment. The data decompressing apparatus 3 shown in FIG. 30 corresponds to the decoding side for the data compressing apparatus 1 described above with reference to FIG. 27, which additionally has a dictionary updating unit 35, as compared with that shown in FIG. 6 according to the first embodiment.

The dictionary updating unit (decompressing dictionary updating unit) 35 updates a decompressing dictionary in the dictionary storing unit 31 on the basis of a result of decoding by the decoding unit 34. According to the fifth modification, when the initial dictionary use or non-use deciding unit 32 decides use of the dictionary, the decoding unit 34 decodes compressed data on the basis of the decompressing dictionary updated by the dictionary updating unit 35.

Next, detailed description will be made of an operation of the data decompressing apparatus 3 having the above structure according to the fifth modification. Incidentally, a process of deciding use or non-use of the dictionary in the initial dictionary use or non-use deciding unit 32 on the decompressing side is similar to that described in the first embodiment or the first modification, description of which is omitted here. Hereinafter, the description will be made, paying an attention to the decoding process in the decoding unit 34 after use of the dictionary is decided.

(1) In the Case Where the Compressing Side Employs Statistical Coding

Figure 31:
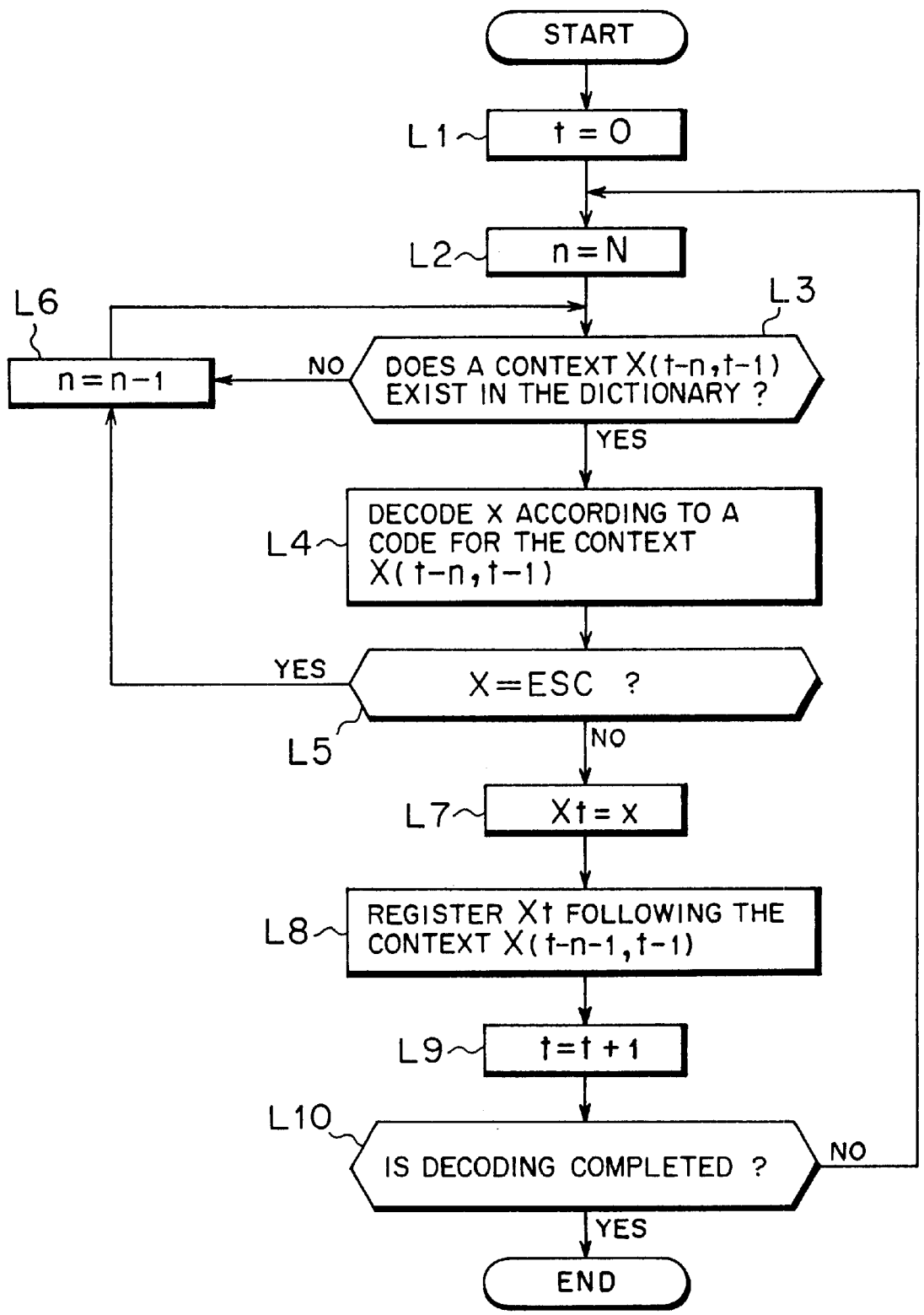
FIG. 31 is a flowchart for illustrating an operation (statistical decoding) of a decoding unit of the data decompressing apparatus according to the fifth modification of the first embodiment.

In this case, the decoding unit 34, as shown in FIG. 31, for example, initializes a parameter t for retrieving a context (character string) X (t−n, t−1) (t=0) (Step L1), and sets a parameter n for retrieving a longest-matching character string in the context X (t−n, t−1) to a maximum number of order (a maximum number of characters consisting of the context) N of the context X (t−n, t−1) (Step L2). Wherein, the above t, n and N are natural numbers, and the above X (t−n, t−1) represents a character string $\{X_{t-n}, X_{t-n+1}, \ldots, X_{t-1}\}$ (where $X_t$ represents one character).

The decoding unit 34 determines whether a certain context X (t−n, t−1) that is an object of decoding exists in the decompressing dictionary set as above (Step L3) If not, the decoding unit 34 repeats retrieval of the context X (t−n, t−1) while decrementing the parameter n (n=n−1) (descending the order of the context) until detecting the context X (t−n, t−1) (from NO route at Step L3 to Step L6).

When detecting the context X (t−n, t−1), the decoding unit 34 decodes a longest-matching character x according to a code corresponding to the context X (t−n, t−1) (from YES route at Step L3 to Step L4), and determines whether the decoded longest-matching character x is ESC (escape code) (Step L5). If the decoded character x is ESC as a result (if judged YES at Step L5), the decoding unit 34 repeats retrieval of the context X (t−n, t−1) while decrementing the parameter n (Step L6) until decoding a character other than ESC.

If the decoded character x is other than ESC, the decoding unit 34 outputs the decoded character x as a decoded character Xt (Xt=x: from NO route at Step L5 to Step L7). The data decompressing apparatus 3 registers the decoded character Xt in a position following the context X (t−n, t−1) by the dictionary updating unit 35 to update the decompressing dictionary (Step L8).

The decoding unit 34 increments the parameter t (t=t+1: Step L9), and successively decodes inputted compressed data while altering the context X (t−n, t−1) that is an object of the retrieval and updating the compressing dictionary (NO route at Step L10) until decoding of all compressed data is completed (until judged YES at Step L10).

(2) In the Case Where the Compressing Side Employs Dictionary-based Coding

Figure 32:
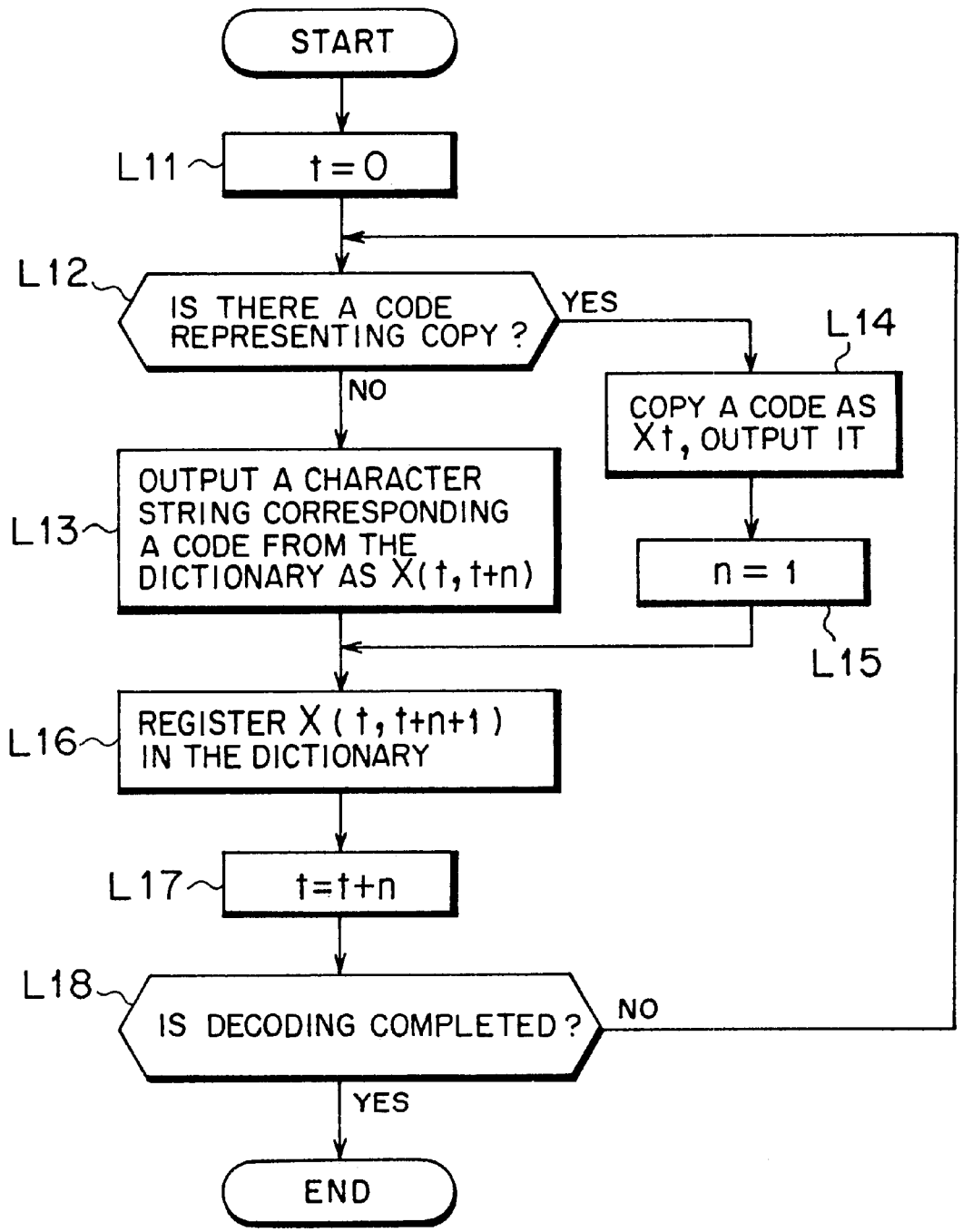
FIG. 32 is a flowchart for illustrating an operation (dictionary-based coding) of the decoding unit of the data decompressing apparatus according to the fifth modification of the first embodiment.

In this case, the decoding unit 34, as shown in FIG. 32, for example, initializes a parameter t (t=0) (Step L11), after that, determines whether an inputted code (compressed data) is a code representing copy (Step L12).

If the inputted code is not a code representing copy as a result, the decoding unit 34 outputs a character string corresponding to the inputted code from the decompressing dictionary as a decoded character string X (t, t+n) (from NO route at Step L12 to Step L13). If the inputted code is a code representing copy, the decoding unit 34 outputs the inputted code as it is as a decoded character Xt (from YES route at Step L12 to Step L14), and initializes the parameter n (n=1) (Step L15).

In this state, the dictionary updating unit 35 registers a character string X (t, t+n+1) in the decompressing dictionary to update the dictionary (Step L16). The decoding unit 34 increments the parameter t by n (t=t+n: Step L17), and successively decodes inputted compressed data (NO route at Step L18) until decoding of all compressed data (codes) is completed (until judged YES at Step L18).

The data decompressing apparatus 3 according to the fifth modification updates the decompressing dictionary in the dictionary storing unit 31 on the basis of a result of decoding in the decoding unit 34 so as to always provide the decompressing dictionary suitable for compressed data that is an object of the next decoding. This further improves efficiency of the decoding.

If the compressing side codes data to be compressed by word or codes the data to be compressed by word while adding category information, the decoding side may decode compressed data by word, or decode the compressed data by word on the basis of the category information, as well as in the second and third modifications.

(B) Description of a Second Embodiment of the Invention

Figure 33:
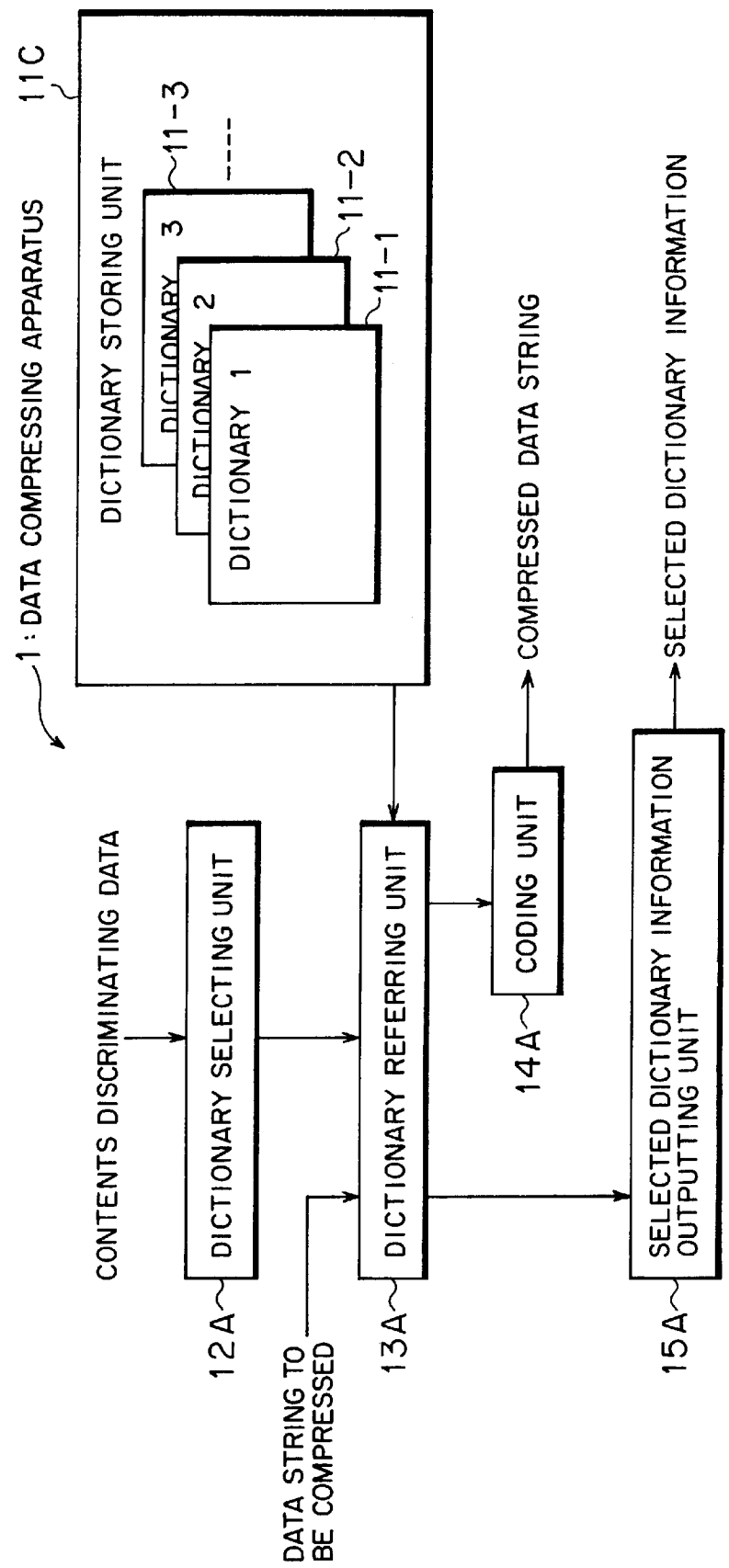
FIG. 33 is a block diagram showing a structure of a data compressing apparatus according to a second embodiment of this invention.

FIG. 33 is a block diagram showing a structure of a data compressing apparatus 1 according to a second embodiment of this invention. The data compressing apparatus 1 shown in FIG. 33 has a dictionary storing unit 11C, a dictionary selecting unit 12A, a dictionary referring unit 13A, a coding unit 14A and a selected dictionary information outputting unit 15A.

The dictionary storing unit (compressing dictionary storing unit) 11C stores plural kinds of compressing dictionaries 11-1, 11-2, 11-3, . . . 11-M (where M is a natural number) which can be used when data (strings) to be compressed is compressed. The dictionary selecting unit (compressing dictionary selecting unit) 12A selects a compressing dictionary to be used among the above compressing dictionaries 11-i (where i=1 through M) on the basis of data contents type information (an extension of a text file name, or the like) representing a type of contents of the data to be compressed.

The dictionary referring unit 13A reads out the dictionary 11-i selected by the dictionary selecting unit 12A from the dictionary storing unit 11C so that the coding unit 14A refers to it. The coding unit 14A codes the data to be compressed on the basis of the compressing dictionary 11-i selected by the compressing dictionary selecting unit 12A and read out (set) by the dictionary referring unit 13A.

The selected dictionary information outputting unit 1SA outputs selected dictionary information on the compressing dictionary 11-i selected by the above dictionary selecting unit 12A to the decompressing side for the data to be compressed.

A function of the data compressing apparatus 1 according to the second embodiment is accomplished by, for example, the personal computer 2 (refer to FIG.2). A data compressing program is stored in the hard disk 27, and the CPU 26 reads the data compressing program to operate, whereby functions of the above units 11C and 12A through 15A are realized.

The user can make the above data compressing program using an editor of the personal computer 1, or receive the data compressing program made in another personal computer 3 over the network 6 and store it in the hard disk 27. Alternatively, the CPU 26 reads the data compressing program recorded in advance in one of various storage medium 28 such as the floppy disk (FD) 28A, the CD-ROM 28B, the MO (magneto-optic disk) 28C and the like through the disk drive 25 to store (install) it in the hard disk 27. In this case, improvement in versatility or spread of the data compressing apparatus 1 can be largely expected.

Figure 34:
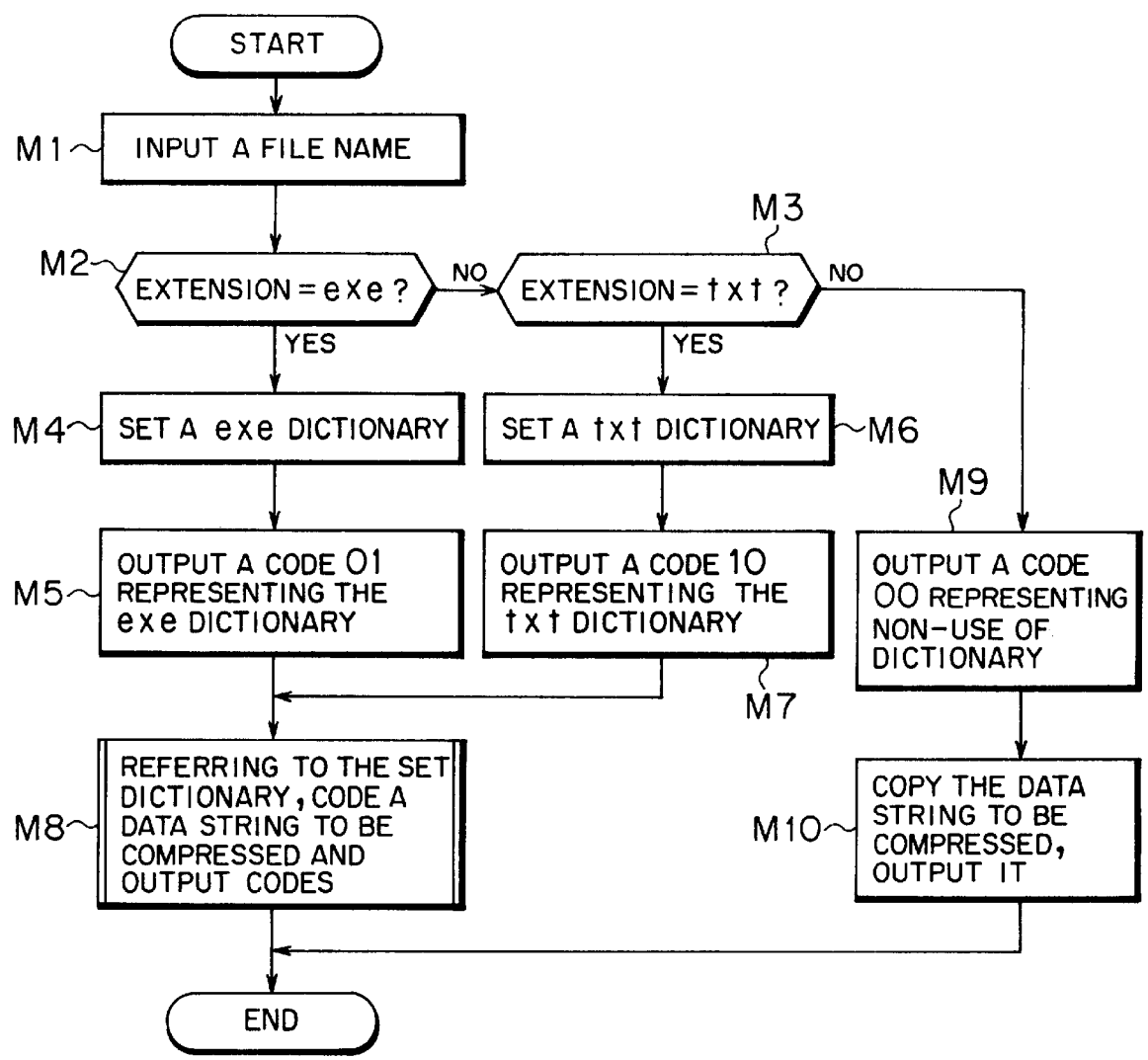
FIG. 34 is a flowchart for illustrating an operation of the data compressing apparatus according to the second embodiment.

Next, detailed description will be made of an operation (data compressing method) of the data compressing apparatus 2 having the above structure according to the second embodiment with reference to a flowchart (Step M1 through M10) shown in FIG. 34. Hereinafter, it is assumed that a dictionary 11-1 for execute file data and a dictionary 11-2 for text file data, for example, are stored at least as the compressing dictionaries 11-i in the dictionary storing unit 11C, for the sake of convenience.

When a file name is inputted to the data compressing apparatus 1 (Step M1), the dictionary selecting unit 12A determines whether an extension of the inputted file name is an extension "exe" representing an execute file or an extension "txt" representing a text file (Steps M2 and M3). If the extension of the inputted file name is "exe", for example, as a result (if judged YES at Step M2), the dictionary selecting unit 13A selects the dictionary 11-1 for execute file in the dictionary storing unit 11C as the compressing dictionary to be used (dictionary selecting step), and notifies the dictionary referring unit 13A of it.

The dictionary referring unit 13A reads the dictionary 11-1 for execute file from the dictionary storing unit 11C and sets it as the compressing dictionary (Step M4), and notifies the selected dictionary information outputting unit 15A of it. The selected dictionary information outputting unit 15A outputs a code 01 representing that the dictionary 11-1 for execute file is selected as selected dictionary information to the decompressing side (Step M5). The coding unit 14A refers to the dictionary 11-1 set by the dictionary referring unit 13A to successively code data (strings) to be compressed (coding step: Step M8).

If the extension of the inputted file name is "txt", for example, (if judged NO at Step M2 and judged as YES at Step M3), the dictionary selecting unit 13A selects the dictionary 11-2 for text file in the dictionary storing unit 11C, and notifies the dictionary referring unit 13A of it.

The dictionary referring unit 13A reads out the dictionary 11-2 for text file from the dictionary storing unit 11C and sets it as the compressing dictionary (Step M6), and notifies the selected dictionary information outputting unit 15A of it. The selected dictionary information outputting unit 15A outputs a code 10 representing that the dictionary 11-2 for text file is selected as the selected dictionary information to the decompressing side (Step M7). The coding unit 14A refers to the dictionary 11-2 set by the dictionary referring unit 13A to successively code data (strings) to be compressed (Step M8).

A practical procedure of coding in the coding unit 14A after a dictionary is selected is similar to the first embodiment, where either statistical coding (refer to FIG. 4) or dictionary-based coding (refer to FIG. 5) may be employed.

If the extension of the inputted file is neither "exe" nor "txt" (if judged NO at both of Steps M2 and M3), the dictionary selecting unit 13A notifies the selected dictionary information outputting unit 15A and the coding unit 14A via the dictionary referring unit 13A that no dictionary is used here. The selected dictionary information outputting unit 15A outputs a code 00 representing non-use of the dictionary as the selected dictionary information (Step M9). The coding unit 14A does not code the data to be compressed, but copies it and output it as it is (Step M10).

The data compressing apparatus 1 according to the second embodiment selects a compressing dictionary 11-i to be used among plural kinds of compressing dictionaries 11-i on the basis of an extension (data contents type information) of an inputted file name, and codes data to be compressed on the basis of the selected compressing dictionary 11-i. It is therefore possible to quickly select and use a dictionary 11-i most suitable for contents (property) of data to be compressed at any time only by inputting a name of a file that is an object of compressing, so as to code the data to be compressed.

Accordingly, it is possible to certainly achieve a remarkable compression effect for data to be compressed having different properties while improving a processing speed of a whole compressing process.

(b) Description of the Decompressing Side

Figure 35:
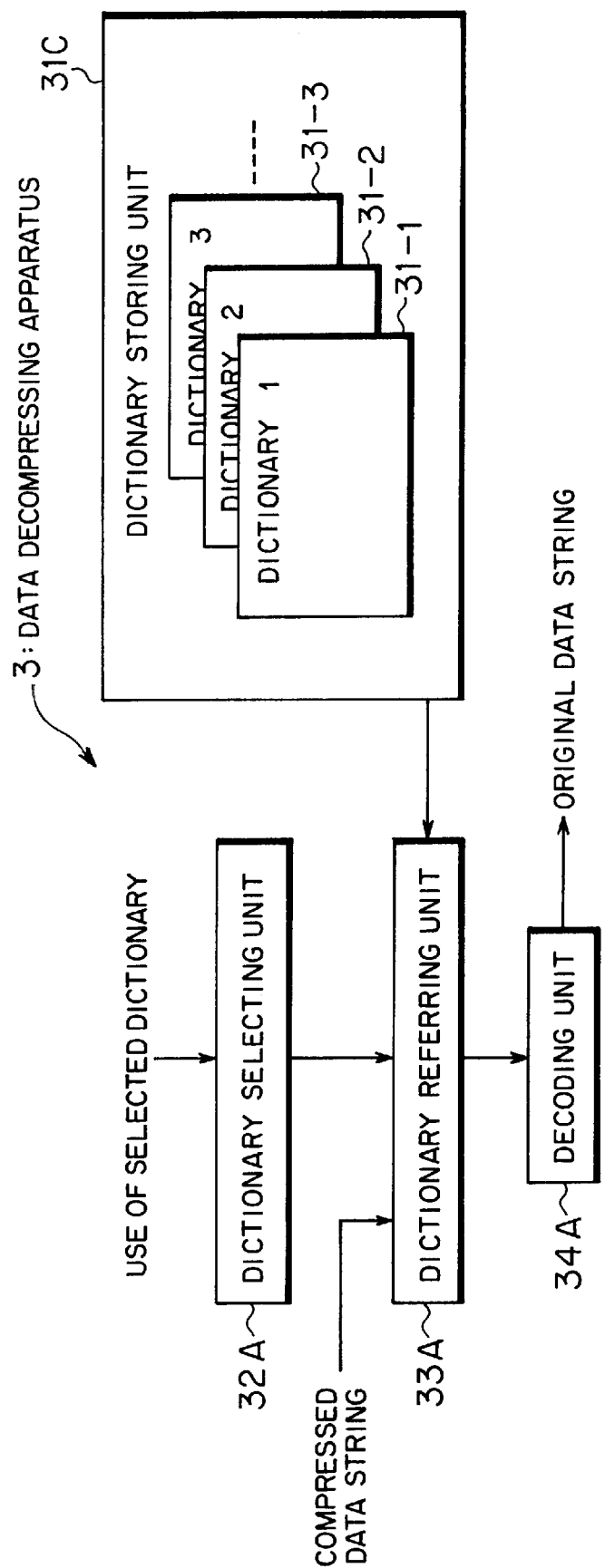
FIG. 35 is a block diagram showing a structure of a data decompressing apparatus according to the second embodiment.

FIG. 35 is a block diagram showing a structure of a data decompressing apparatus according to the second embodiment. A data decompressing apparatus 3 shown in FIG. 35 corresponds to the decompressing side for the data compressing apparatus 1 described above with reference to FIG. 33, which has a dictionary storing unit 31C, a dictionary selecting unit 32A, a dictionary referring unit 33A and a decoding unit 34A.

The dictionary storing unit (decompressing dictionary storing unit) 31C stores plural kinds of dictionaries 31-1, 31-2, 31-3, . . . 31-M which can be used when compressed data is decompressed. Here, a dictionary for execute file is stored as the decompressing dictionary 31-1, and a dictionary for text file is also stored as the-decompressing dictionary 31-2, for example, correspondingly to the compressing side.

The dictionary selecting unit (decompressing dictionary selecting unit) 32A receives the selected dictionary information on a compressing dictionary 11-i (i=1 through M) selected on the basis of an extension (data contents type information representing a type of data contents of the data to be compressed) of a file name on the compressing side as described above, and selects a decompressing dictionary to be used among the plural kinds of decompressing dictionaries on the basis of the received selected dictionary information.

When receiving a code 01 representing that the dictionary 11-1 for execute file is selected from the compressing side, the dictionary selecting unit 32A selects the decompressing dictionary 32-1 for execute file. When receiving a code 10 representing that the dictionary for text file is selected from the compressing side, the dictionary selecting unit 32A selects the decompressing dictionary for text file.

The dictionary referring unit 33A reads out the dictionary 32-i selected by the dictionary selecting unit 32A so that the decoding unit 34A refers to it. The decoding unit 34A decodes inputted compressed data on the basis of the decompressing dictionary 31-i selected by the dictionary selecting unit 32A and read out (set) by the dictionary referring unit 33A.

If any dictionary 11-i has not been selected on the compressing side (when receiving a code 00 representing non-use of the dictionary from the compressing side), the decoding unit 34A is notified of it via the dictionary referring unit 33A. The decoding unit 34A does not decode compressed data [original data which has not been compressed (coded) actually], but copies it and outputs it as it is.

A function of the data decompressing apparatus 3 according to the second embodiment is accomplished by, for example, the personal computer 3 (refer to FIG. 2). A data decompressing program is stored in the hard disk 27, and the CPU 26 reads the data decompressing program to operate, whereby functions of the above units 31C and 32A through 34A are realized.

The user can make the above data decompressing program using an editor or the like of the personal computer 3, or receive the data decompressing program made in another personal computer 1 over the network 6 and store it in the hard disk 27. Alternatively, the CPU 26 reads the data decompressing program recorded in advance in one of various storage medium 28 such as the floppy disk (FD) 28A, the CD-ROM 28B, the MO (magneto-optic disk) 28C and the like through the disk drive 25 to store (install) it in the hard disk 27. In this case, improvement in versatility or spread of the data decompressing apparatus 3 can be largely expected.

Figure 36:
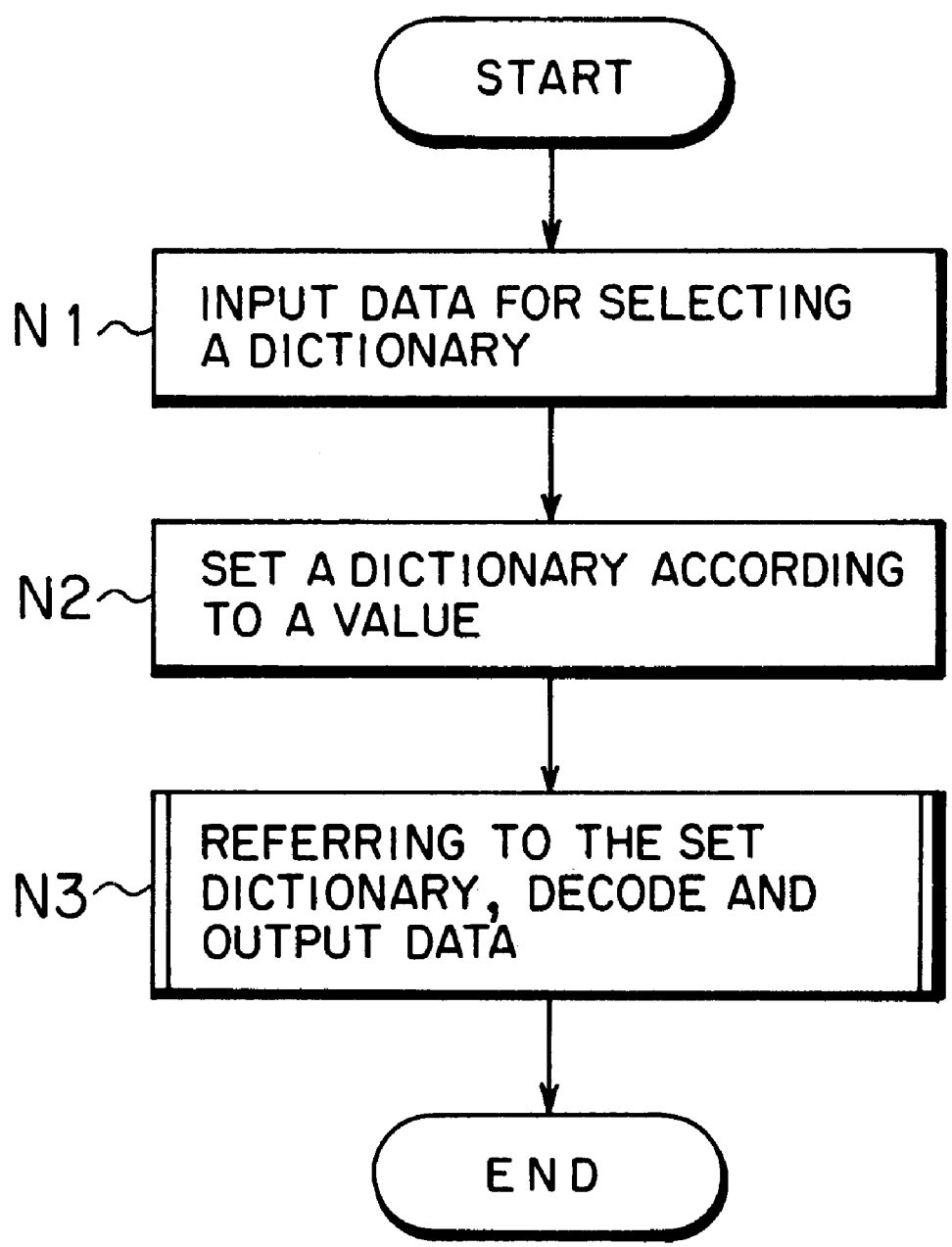
FIG. 36 is a flowchart for illustrating an operation of the data decompressing apparatus according to the second embodiment.

Next, detailed description will be made of an operation (data decompressing method) of the data decompressing apparatus 3 having the above structure according to the second embodiment with reference to a flowchart (Step N1 through N3) shown in FIG. 36.

When the data decompressing apparatus 3 receives the selected dictionary information from the data compressing apparatus 1 (receiving step: Step N1), the dictionary selecting unit 32A selects a decompressing dictionary 31-i to be used on the basis of the received selected dictionary information (dictionary selecting step). If the received selected dictionary information is a code (01) representing a dictionary for execute file, the dictionary selecting unit 32A selects the decompressing dictionary 31-1. If the received selected dictionary information is a code (10) representing a dictionary for text file, the dictionary selecting unit 32A selects the decompressing dictionary 31-2.

When the dictionary selecting unit 32A selects the decompressing dictionary 31-i, the dictionary referring unit 33A reads out a corresponding decompressing dictionary 31-i from the dictionary storing unit 31C (setting a dictionary: Step N2). The decoding unit 34A decodes compressed data on the basis of the decompressing dictionary 33-i set by the dictionary referring unit 33A (decoding step: Step N3).

A decoding system in the decoding unit 34A is decided according to a coding system on the compressing side (a coding system employed in the coding unit 14 of the data compressing apparatus 1). If the compressing side employs statistical coding, statistical decoding system (refer to FIG. 8) is employed. If the compressing side employs dictionary-based coding, dictionary-based decoding system (refer to FIG. 9) is employed.

The data decompressing apparatus 3 (data decompressing method) according to the second embodiment receives the selected dictionary information on a compressing dictionary 11-i selected on the basis of an extension of a file name from the compressing side, selects a decompressing dictionary among the plural kinds of decompressing dictionaries 31-i on the basis of the received selected dictionary information to decode compressed data on the basis of the decompressing dictionary, as above. It is therefore to quickly select a decompressing dictionary 31-i having the same contents as a compressing dictionary having been selected on the compressing side at any time so as to accurately decompress (decode) the compressed data.

Figure 37:
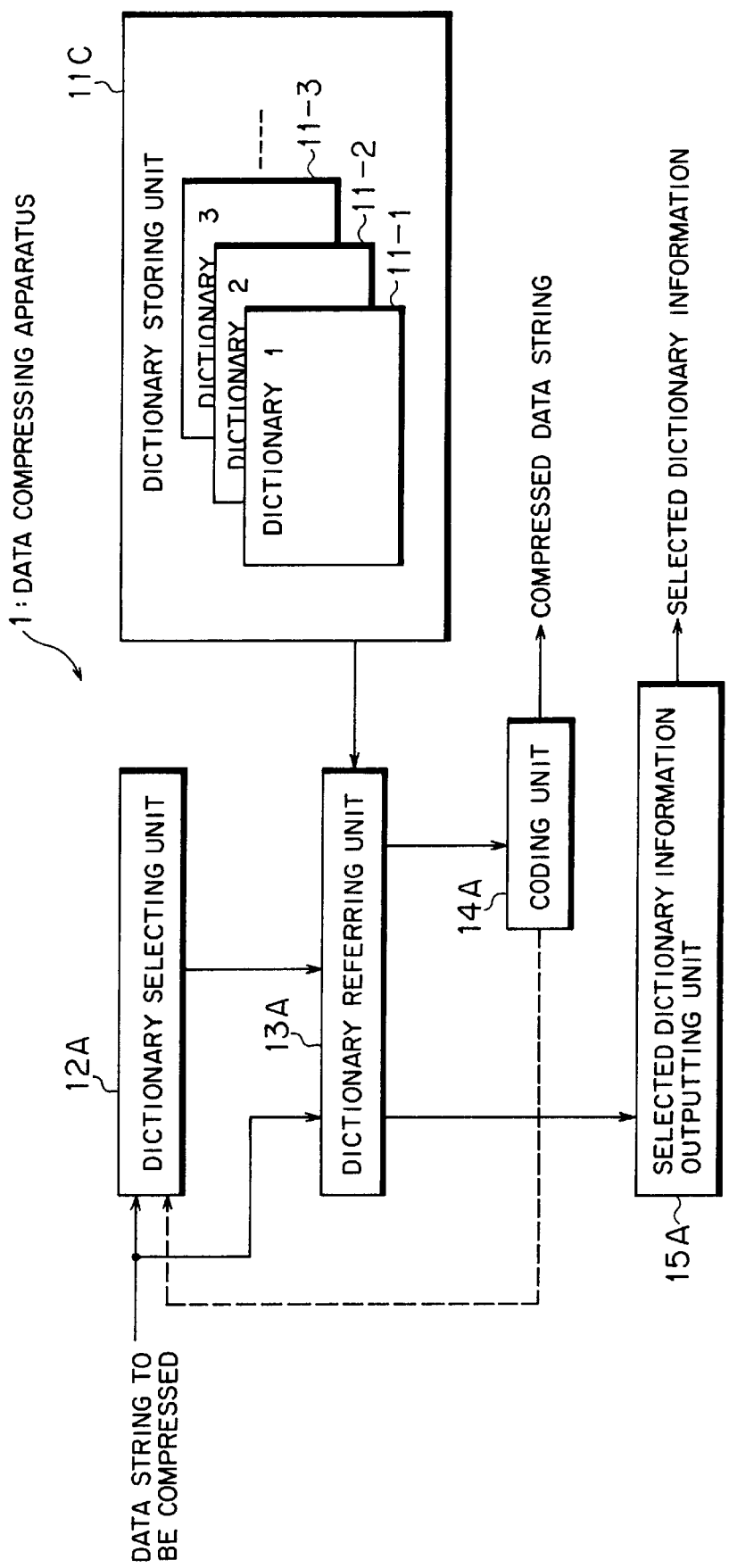
FIG. 37 is a block diagram showing a structure of a data compressing apparatus according to a first modification of the second embodiment.

(B1) Description of a First Modification of the Second Embodiment (a) Description of the Compressing Side FIG. 37 is a block diagram showing a structure of a data compressing apparatus according to a first modification of the second embodiment. As shown in FIG. 37, a data compressing apparatus 1 according to the first modification has a structure similar to that shown in FIG. 33. However, the dictionary selecting unit 12A of the data compressing apparatus 1 according to this modification selects a compressing dictionary 11-i including specific character data (characters or character strings) frequently occurring in data to be compressed among plural kinds of compressing dictionaries 11-i.

Next, detailed description will be made of an operation (data compressing method) of the data compressing apparatus 1 according to the first modification.

Figure 38:
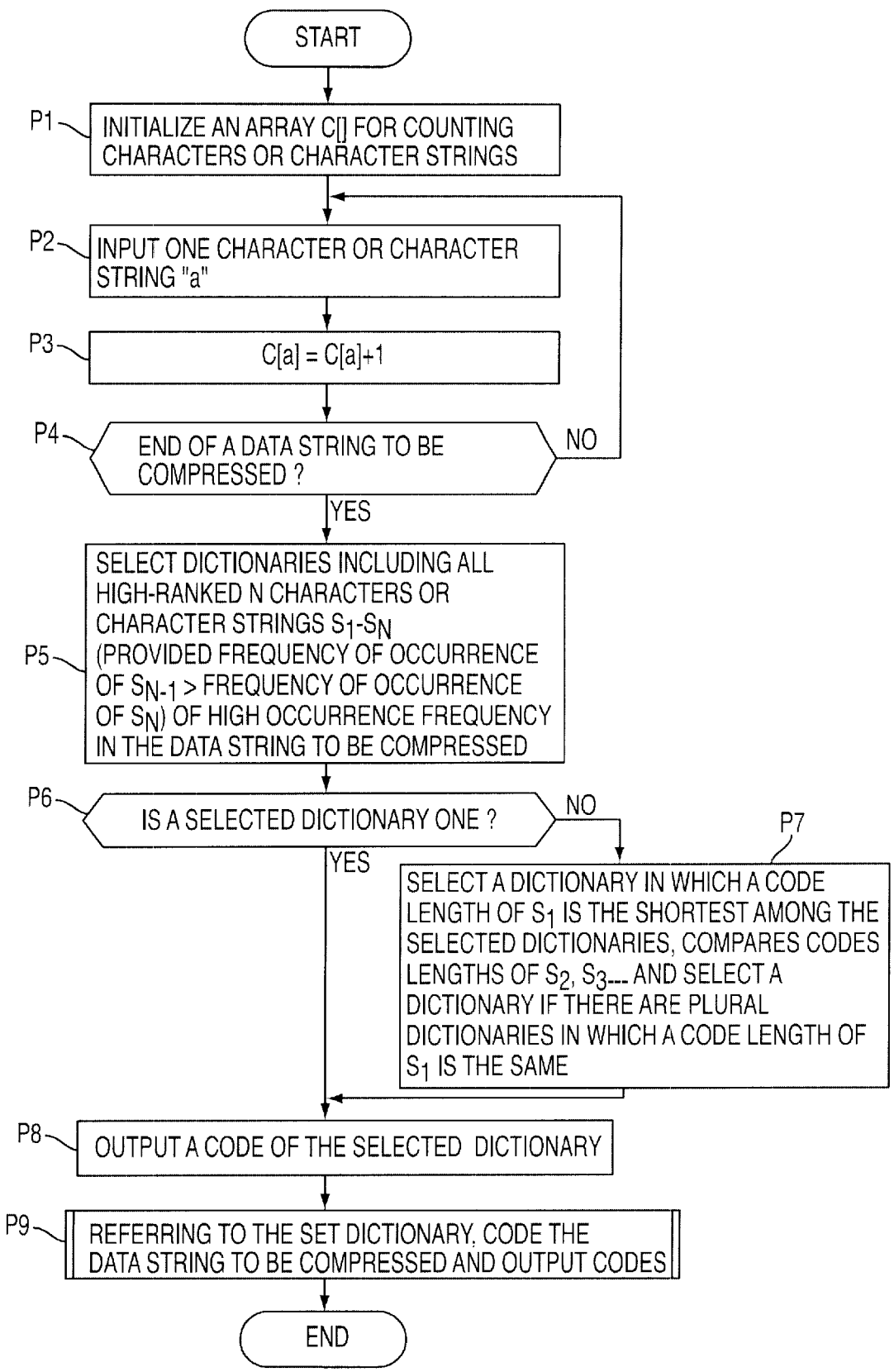
FIG. 38 is a flowchart for illustrating an operation of the data compressing apparatus according to the first modification of the second embodiment.

As shown in FIG. 38, for example, the data compressing apparatus 1 initializes an array (count value) C[ ] for counting characters (character strings) (Step P1). When one character (or character string) a of data to be compressed is inputted (Step 2), the dictionary selecting unit 12A counts up a count value C [a] of the inputted character (character string) a (C[a]=C[a]+1: Step P3).

The dictionary selecting unit 12A repeats the above process until inputting of all the data to be compressed is completed (until it is judged as YES at Step P4), thereby counting occurrences of a character (character string) occurring in the data to be compressed (NO route at Step P4). When the inputting of all the data to be compressed is completed, the dictionary selecting unit 12A refers to the count value C[ ] of each character (character string) and the dictionary storing unit 11C to select a compressing dictionary 11-i including high-ranked N (N is a natural number not less than 2) characters (character strings) $S_1$ through $S_N$ (provided occurrences of $S_{N-1}$>occurrences of $S_N$) having large count values (that is, frequently occurring) (dictionary selecting step: Step P5).

The dictionary selecting unit 12A then determines whether the selected dictionary 11-i is only one (Step P6). If the selected dictionary 11-i is only one, the dictionary selecting unit 12a outputs a code of the dictionary 11-i as the selected dictionary information to the decompressing side via the selected dictionary information outputting unit 15a (from YES route at Step P6 to Step P8).

If the selected dictionary is plural, the dictionary selecting unit 12A selects a dictionary 11-i in which a code of a character (character string) $S_1$ most frequently occurring is the shortest among the plural kinds of dictionaries 11-i (from NO route at Step P6 to Step P7), and outputs a code of the selected dictionary 11-i as the selected dictionary information to the decompressing side via the selected dictionary information outputting unit 15A (Step P8).

If there are plural dictionaries in which a code of the character (character string) $S_1$ is the same at the above Step P7, the dictionary selecting unit 12A compares lengths of the codes of the characters (character strings) $S_2$, $S_3$, . . . , and selects a dictionary 11-i in which lengths of the codes of the characters (character strings) $S_2$, $S_3$, . . . are shorter.

When the dictionary selecting unit 12A selects the dictionary 11-i, the dictionary referring unit 33A reads out the selected dictionary 11-i from the dictionary storing unit 11C to set the dictionary 11-i. The coding unit 14A refers to the dictionary 11-i set by the dictionary referring unit 33A to successively code the data to be compressed (coding step: Step P9).

In this case, a coding system in the coding unit 14A may be either statistical coding (refer to FIG. 4) or dictionary-based coding (refer to FIG. 5).

The data compressing apparatus 1 (data compressing method) according to the first modification selects a dictionary 11-i including specific characters (character strings) $S_1$ through $S_N$ frequently occurring in data to be compressed, and codes the data to be compressed on the basis of the dictionary 11-i, as above. It is therefore possible to code data to be compressed using a dictionary 11-i including characters (character strings) $S_1$ through $S_N$ frequently occurring in data to be compressed at any time, so as to increase effect of compression.

In this case, a dictionary 11-i is selected depending on whether the dictionary including a finite number of characters (character strings) $S_1$ through $S_N$ occurring in data to be compressed so that the dictionary selecting process itself is sped up. This largely contributes to speeding-up of the whole coding process.

Figure 39:
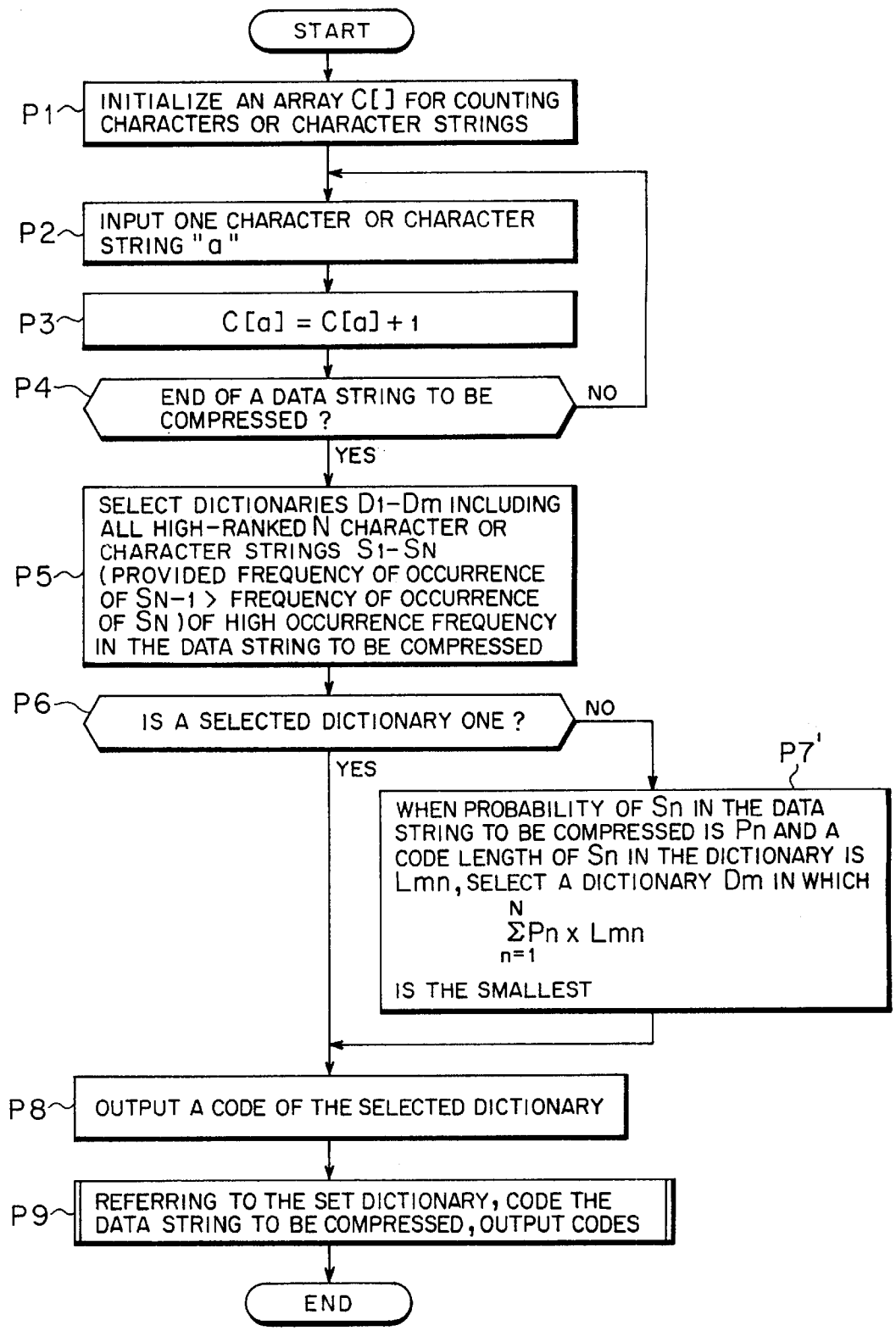
FIGS. 39 and 40 are flowcharts for illustrating operations of the data compressing apparatus according to the first modification of the second embodiment.

The dictionary selecting process at the above Step P7 may be performed as shown at Step P7 in FIG. 39, for example. Namely, if the dictionary 11-i selected at Step P5 is plural (dictionaries $D_1$ through $D_M$: where M is a natural number not less than 2), the dictionary selecting unit 12A selects a dictionary $D_M$ in which $\Sigma P_n \times L_{mn}$ (where $\Sigma$ represents a total about n=1 through N) is the smallest when probability of occurrence of a character (character string) $S_N$ in the data to be compressed is $P_n$ (n=1 through N), and a code length of a character (character string) $S_N$ in the dictionary $D_M$ is $L_{mn}$.

In this case, the dictionary selecting unit 12a selects a dictionary 11-i in which a total of lengths of codes assigned to characters (character strings) $S_1$ through $S_N$ of high occurrence frequency is the smallest. Therefore, it is possible in this case to achieve a higher compression ratio.

The above dictionary selecting unit 12A may select a compressing dictionary 11-i to be used among plural kinds of compressing dictionaries 11-i according to a quantity of compressed data having been coded by the coding unit 14A, as indicated by a broken line in FIG. 37.

Figure 40:
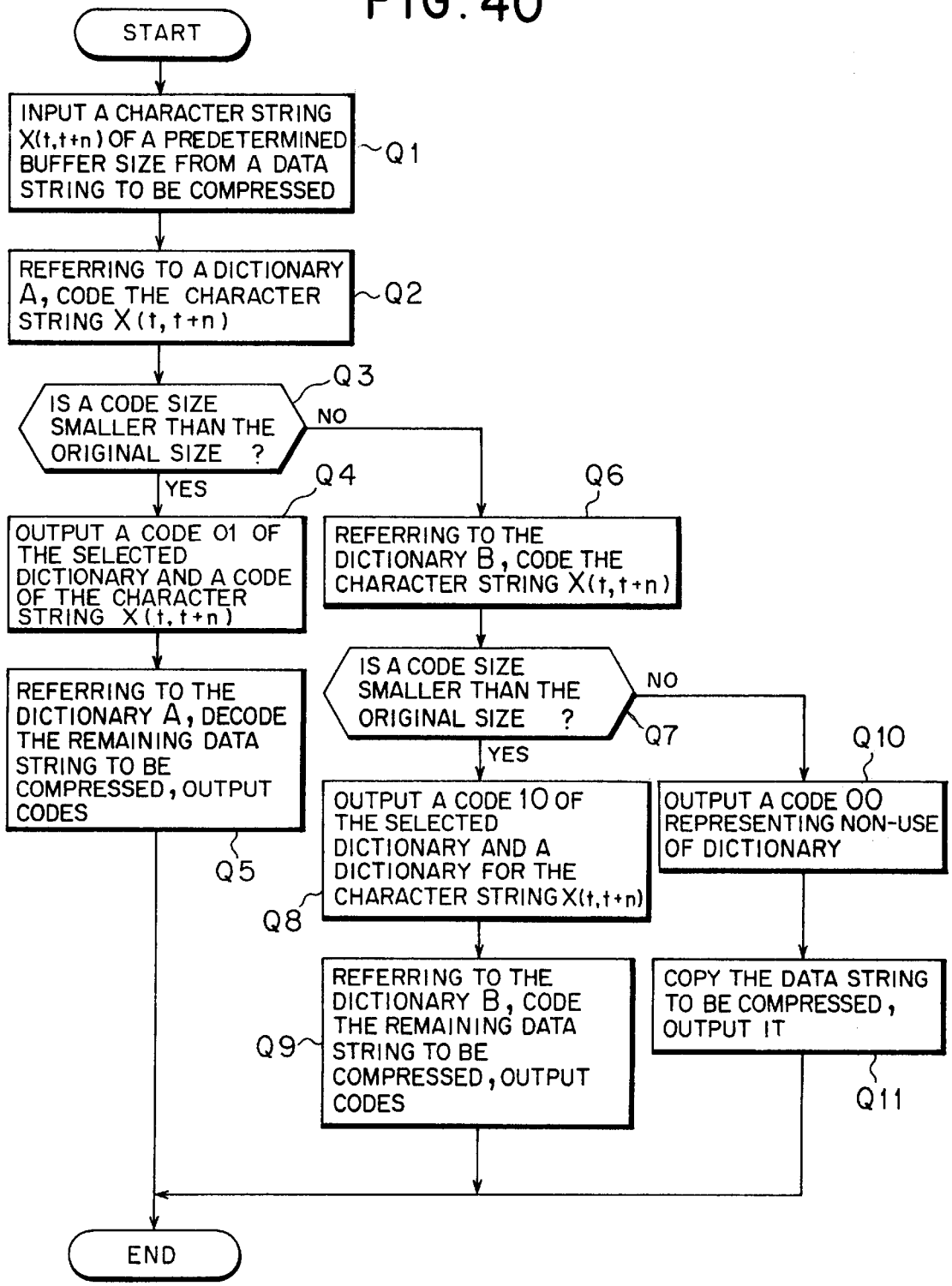

An operation (data compressing method) of the data compressing apparatus 1 in this case is as shown in FIG. 40. Namely, the data compressing apparatus 1 accepts an input of a character string X(t, t+n) for a predetermined buffer size from the data to be compressed (character strings) (Step Q1), and arbitrarily selects a dictionary 11-i to be used in coding the character string X(t, t+n) among the compressing dictionaries 11-i by the dictionary selecting unit 12A. The dictionary selecting unit 13A reads out a corresponding compressing dictionary 11-i from the dictionary storing unit 11C, and the coding unit 14A codes the character string X(t, t+n) on the basis of the dictionary 11-i (hereinafeter referred as dictionary A) (Step Q2).

After coding the character string X(t, t+n), the coding unit 14A outputs information on a quantity of data (codes) of the data to be compressed having been coded as a result of the coding to the dictionary selecting unit 12A. When receiving the information, the dictionary selecting unit 12A determines whether a quantity of the data having been coded is smaller than the original buffer size (Step Q3).

If a quantity of the data having been coded is smaller than the original buffer size (if judged YES at Step Q3), the dictionary selecting unit 12A notifies the selected dictionary information outputting unit 15A and the coding unit 14A via the dictionary referring unit 13A of a code (01, for example) of the selected dictionary A. The selected dictionary information outputting unit 15A outputs the code (01) of the dictionary A to the decompressing side. The coding unit 14A outputs a code of the character string, after that, codes the remaining data to be compressed by referring to the same dictionary A (coding step: Steps Q4 and Q5). In this case, a coding system in the coding unit 14A may be either statistical coding or dictionary-base coding.

If a quantity of the data having been coded is larger than the original buffer size (if judged NO at Step Q3), the dictionary selecting unit 12A selects another compressing dictionary 11-i (hereinafer referred as dictionary B) (dictionary selecting step). The coding unit 14A codes the data to be compressed by referring to the dictionary B (Step Q6). After coding, the coding unit 14A outputs information on a quantity of data (codes) of the data to be compressed having been coded as a result of the coding to the dictionary selecting unit 12A. When receiving the information, the dictionary selecting unit 12A again determines whether a quantity of the data having been coded is smaller than the original buffer size (Step Q7).

If a quantity of the data having been coded is smaller than the original buffer size as a result (if judged YES at Step Q7), the dictionary selecting unit 12A notifies the selected dictionary information outputting unit 15A and the coding unit 14A via the dictionary referring unit 13A of a code (10, for example) of the selected dictionary B. The selected dictionary information outputting unit 15A outputs the code (10) of the dictionary to the decompressing side, and the coding unit 14A codes the data to be compressed by referring to the same dictionary B (Steps Q8 and Q9).

If a quantity of the data having been coded is larger than the original buffer size (if judged NO at Step Q7), the dictionary selecting unit 12A determines that there is no dictionary suitable for the coding, and notifies the selected dictionary information outputting unit 15A and the coding unit 14A via the dictionary referring unit 13A of non-use of dictionary. The selected dictionary information outputting unit 15A thereby outputs a code (00, for example) representing non-use of dictionary to the decompressing side (Step Q10). The coding unit 14A does not code the data to be compressed, but copies it and outputs it as it is (Step Q11).

The above data compressing apparatus 1 (data compressing method) selects a compressing dictionary to be used among plural kinds of compressing dictionaries 11-i according to a quantity of compressed data which is data to be compressed having been coded. It is therefore possible to select the most suitable compressing dictionary 11-i in consideration of a quantity of compressed data obtained after coding, at anytime. This improves the compression effect of data to be compressed, more certainly.

(b) Description of the Decompressing Side

A data decompressing apparatus 3 according to the first modification, that is, a data decompressing apparatus 3 for the above data compressing apparatus 1 described above with reference to FIGS. 37 through 40, has a structure similar to that according to the second embodiment shown in FIG. 35. In this case, the dictionary selecting unit 32A has a function ① or ② below according to the above-described dictionary selecting manner on the compressing side:

① function of receiving the selected dictionary information on a compressing dictionary 11-i selected as a compressing dictionary including characters (character strings) $S_1$ through $S_N$ of high occurrence frequency in data to be compressed from the compressing side, and selecting a decompressing dictionary 31-i to be used among plural kinds of decompressing dictionaries 31-i on the basis of the received selected dictionary information; and ② function of receiving the selected dictionary information on a compressing dictionary 11-i selected according to a quantity of compressed data having been coded, and selecting a decompressing dictionary to be used among plural kinds of decompressing dictionaries 31-i on the basis of the received selected dictionary information.

The data decompressing apparatus 3 according to the first modification performs the same decoding process conducted after the selected dictionary information is received as the above second embodiment, in which only definition of the selected dictionary information received from the compressing side differs.

Namely, when receiving the selected dictionary information form the compressing side, the dictionary selecting unit 32A selects a decompressing dictionary 31-i corresponding to the selected dictionary information, referring to the dictionary storing unit 31C (dictionary selecting step). The dictionary referring unit 23 reads out the selected dictionary 31-i, and the decoding unit 34A successively decodes compressed data, referring to the read dictionary 31-i (decoding step).

The data decompressing apparatus 3 (data decompressing method) according to the first modification can receive the selected dictionary information on a compressing dictionary 11-i selected as a compressing dictionary 11-i including specific characters (character strings) $S_1$ through $S_N$ of high occurrence frequency from the compressing side, select a decompressing dictionary 31-i to be used among plural kinds of decompressing dictionaries 31-i on the basis of the received selected dictionary information, and decode compressed data on the basis of the decompressing dictionary 31-i. It is therefore possible to quickly select a decompressing dictionary 31-i having the same contents as a compressing dictionary selected as a compressing dictionary 11-i including specific characters (character strings) $S_1$ through $S_N$ of high occurrence frequency on the compressing side at any time so as to accurately decode (decompress) the compressed data.

Alternatively, the data decompressing apparatus 3 (data decompressing method) according to the first modification can receive the selected dictionary information on a compressing dictionary 11-i selected according to a quantity of compressed data having been coded from the compressing side, select a decompressing dictionary 31-i to be used among plural kinds of decompressing dictionaries 31-i on the basis of the received selected dictionary information, and decode compressed data on the basis of the decompressing dictionary 31-i. It is therefore possible to quickly select a decompressing dictionary having the same contents as a compressing dictionary 11-i selected according to a quantity of compressed data having been coded on the compressing side at any time so as to accurately decode (decompress) the compressed data.

(c) Others

The dictionaries 11-i and 31-i stored in the respective dictionary storing unit 11C and 31C can be automatically created by the dictionary creating apparatus 5A described before with reference to FIG. 14.

Figure 41:
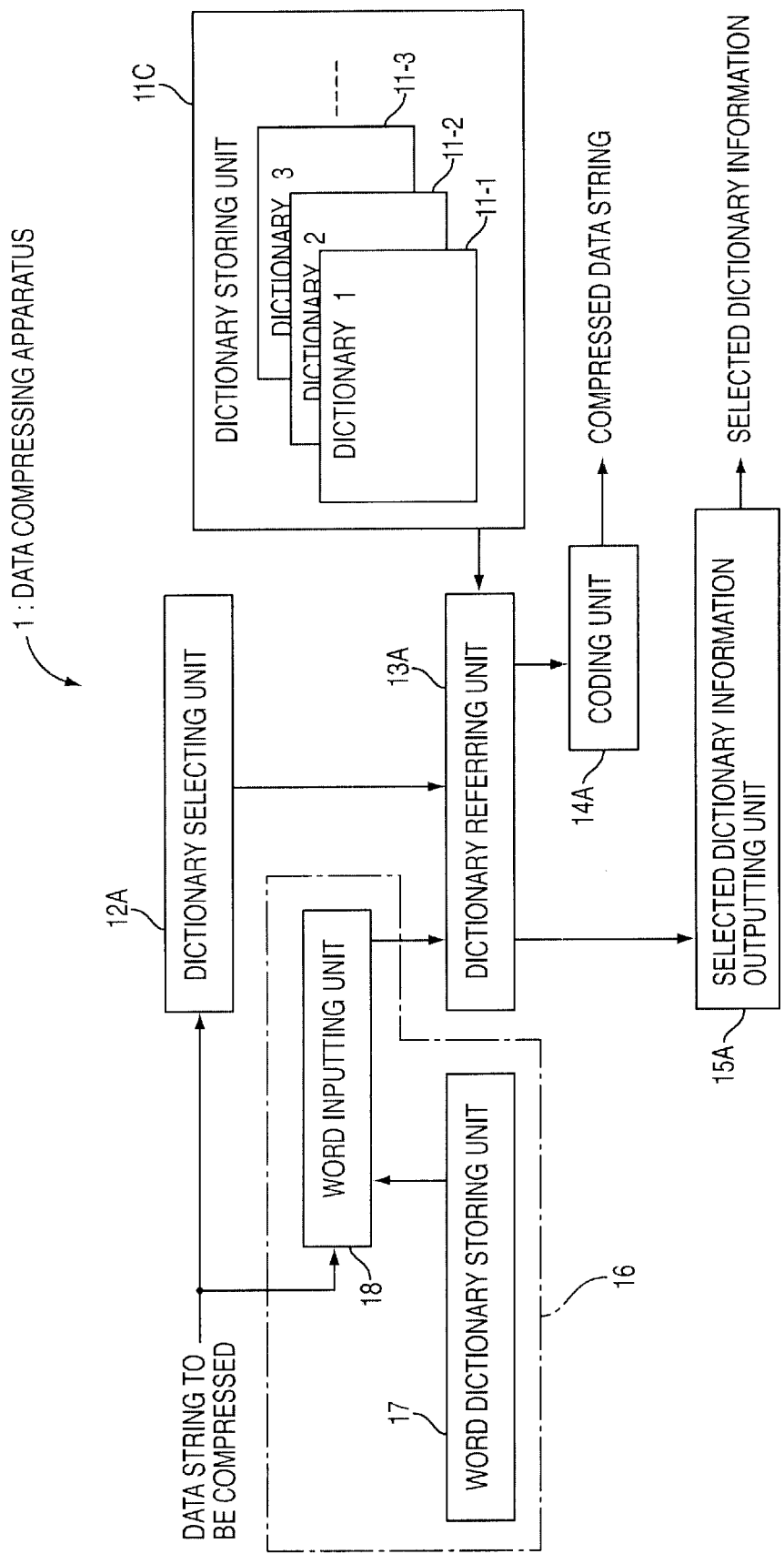
FIG. 41 is a block diagram showing a structure of a data compressing apparatus according to a second modification of the second embodiment.

(B2) Description of a Second Modification of the Second Embodiment (a) Description of the Compressing Side FIG. 41 is a block diagram showing a data compressing apparatus according to a second modification of the second embodiment. In a data compressing apparatus 1 shown in FIG. 41, as compared with that shown in FIG. 33, the dictionary selecting unit 12A selects a compressing dictionary 11-i on the basis of specific characters (character string) frequently occurring in data to be compressed or a quantity of compressed data having been coded, similarly to the above first modification. The data compressing apparatus 1 has a compressed data dividing unit 16 including a word dictionary storing unit 16 and a word inputting unit 17 similar to those (refer to FIG. 15) described above in the second modification of the first embodiment.

The structure of the data compressing apparatus 1 according to the second modification is of the data compressing apparatus 1 shown in FIG. 37 according to the above first modification to which the compressed data dividing unit 16 described in the second modification of the first embodiment is added, wherein the coding unit 14A codes data to be compressed (document-form data) by word, similarly to the second modification of the first embodiment.

In this case, each decompressing dictionary 11-i stored in the dictionary storing unit 11C has contents in which a predetermined code is assigned to each of desired words in document-form data. The dictionary selecting process in the dictionary selecting unit 12A is performed, based on, not a character (character string), but a word.

In the data compressing apparatus 1 having the above structure according to the second modification, the word inputting unit 18 divides data to be compressed (document-form data) into words, and outputs the words to the coding unit 14. The coding unit 14A can code plural character data as a bunch at a time on the basis of a compressing dictionary 11-i selected by the dictionary selecting unit 12A.

As compared with the second embodiment, it is possible to largely speed up the decoding process. By dividing data to be compressed into data that is "words" each having own meaning, it is possible to limit the number of kinds of codes to be assigned to the data to be compressed so that a quantity of codes having been coded is decreased, thus a compression ratio is increased. If data to be compressed is coded by word, the decoding process on the decompressing side becomes easy and can be sped up.

A procedure of coding in the above coding unit 14A corresponds to the flowchart (Steps D8 through D16) in FIG. 4 in which X (t−n, t−1) is replaced with one word, or the flowchart (Steps D17 through D28) in FIG. 5 in which X (t, t+n) is replaced with one word.

(b) Description of the Decompressing Side

A data decompressing apparatus 3 according to the second modification, that is, a data decompressing apparatus 3 for the data compressing apparatus 1 described above with reference to FIG. 41, is configured similarly to that shown in FIG. 35. In this case, a dictionary 31-i for decompression (decompressing by word) having the same contents as a compressing dictionary 11-i stored in the dictionary storing unit 11C on the compressing side is stored in the dictionary storing unit 11C. The decoding unit 34A decodes compressed data by word (by predetermined character data group) on the basis of a decompressing dictionary 31-i selected by the dictionary selecting unit 32A.

When the data decompressing apparatus 3 according to the second modification receives the selected dictionary information from the compressing side, the dictionary selecting unit 32A selects a decompressing dictionary corresponding to the selected dictionary information, and the decoding unit 34A decodes compressed data (codes) using the decompressing dictionary 31-i.

The decoding process in the decoding unit 34 corresponds to a coding system on the compressing side (statistical or dictionary-based), where X (t−n, t−1) is replaced with one word in the flowchart (Steps E4 through E12) in FIG. 8, or X (t, t+n) is replaced with one word in the flowchart (Steps E13 through E19) in FIG. 9.

The data decompressing apparatus 3 according to the second modification divides compressed data into words when the compressed data is decompressed on the basis of a decompressing dictionary 31-i selected by the dictionary selecting unit 12A to decode the compressed data by word. It is therefore possible to decode plural character data as a bunch at a time. This can largely speed up the decoding (decompressing) process after a dictionary is selected, as compared with the above second embodiment.

(c) Others

The dictionaries 11-i and 31-i stored in the respective dictionary storing units 11C and 31C can be automatically created by the dictionary creating apparatus 5B described before with reference to FIG. 16.

Figure 42:
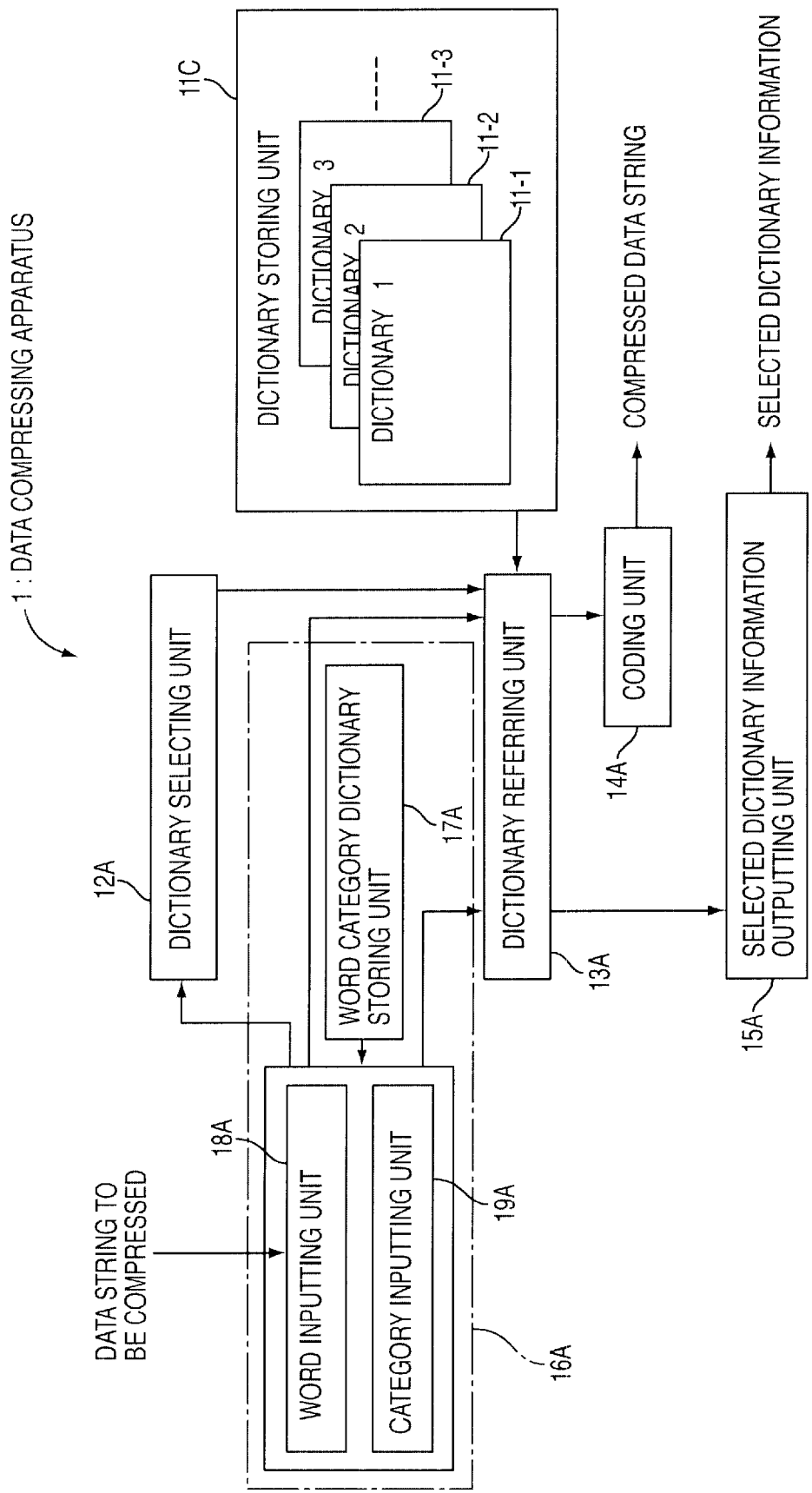
FIG. 42 is a block diagram showing a structure of a data compressing apparatus according to a third modification of the second embodiment.

(B3) Description of a Third Modification of the Second Embodiment (a) Description of the Compressing Side FIG. 42 is a block diagram showing a third modification of the data compressing apparatus 1 shown in FIG. 33. In the data compressing apparatus 1 shown in FIG. 42, as compared with that shown in FIG. 33, the dictionary selecting unit 12A selects a compressing dictionary 11-i according to specific characters (character strings) frequently occurring in data to be compressed or a quantity of compressed data having been coded, similarly to the above first modification. Further, the data compressing apparatus 1 has a compressed data dividing unit 16A including a word category dictionary storing unit 17A, a word inputting unit 18A and a category inputting unit 19A similar to those (refer to FIG. 17) described above in the third modification of the first embodiment.

A structure of the data compressing apparatus 1 according to the third modification is of the data compressing apparatus 1 according to the above first modification shown in FIG. 37, to which the compressed data dividing unit 16A described before in the third modification of the first embodiment is added, where the coding unit 14A codes data to be compressed (document-form data) by word on the basis of category information (part-of-speech information, or the like) on each word, similarly to the third modification of the first embodiment.

In this case, each of the compressing dictionaries stored in the dictionary storing unit 11C has contents in which category information and a predetermined codes are assigned to each desired word in document-form data. The dictionary selecting process in the dictionary selecting unit 12A is performed, based on, not a character (character string), but a word.

In the data compressing apparatus 1 having the above structure according to the third modification, the word inputting unit 18A of the compressed data dividing unit 16A divides data to be compressed (document-form data) into words on the basis of the word category dictionary storing unit 17A, and the category inputting unit 19A adds the category information on each of the obtained words to divide the words into groups according to the category information.

It is therefore possible to decrease the number of kinds of codes to be assigned to the words and shorten a length of each code to be assigned to the word. If the coding unit 14A performs the coding process using a compressing dictionary 11-i selected by the dictionary selecting unit 12A, a quantity of codes having been subjected to the coding process is further decreased and a compression ratio is largely improved, as compared with the above first modification. In this case, the decompressing side can readily specify a word to be decoded owing to the above category information, leading to an increase of a speed of the decoding process.

In this case, a coding system in the coding unit 14A may be either statistical coding (refer to FIG. 18) or dictionary-based coding (refer to FIG. 19).

(b) Description of the Decompressing Side

A data decompressing apparatus 3 according to the third modification, that is, a data decompressing apparatus 3 for the data compressing apparatus 1 described above with reference to FIG. 42, is configured similarly to that shown in FIG. 35. In this case, the decoding unit 34A decodes compressed data compressed in the data compressing apparatus 1 on the basis of the above category information by word (by predetermined character data group).

When the data decompressing apparatus 3 according to the third modification receives the selected dictionary information from the compressing side, the dictionary selecting unit 32A selects a decompressing dictionary 31-i corresponding to the selected dictionary information, and the decoding unit 34A decodes compressed data (codes) by word on the basis of the dictionary 31-i and the above category information (part-of-speech information, or the like), similarly to the third modification of the first embodiment.

In this case, the decoding system in the decoding unit 34 of the data decompressing apparatus 3 according to the third modification corresponds to a coding system in the above coding unit 14. If statistical coding is employed in the coding unit 14, statistical decoding (refer to FIG. 20) is employed, or if dictionary-based coding is employed in the coding unit 14, dictionary-based decoding is employed to decode compressed data.

In the data decompressing apparatus 3 according to the third modification, the decoding unit 34A decodes compressed data on the basis of the category information on each word so that a word to be decoded is readily specified on the basis of the above category information, which leads to speeding-up of the compressed data decoding process.

(c) Others

The dictionaries 11-i and 31-i stored in the above dictionary storing units 11C and 31C, respectively, can be automatically created by the dictionary creating apparatus 5C described before with reference to FIG. 22.

Figure 43:
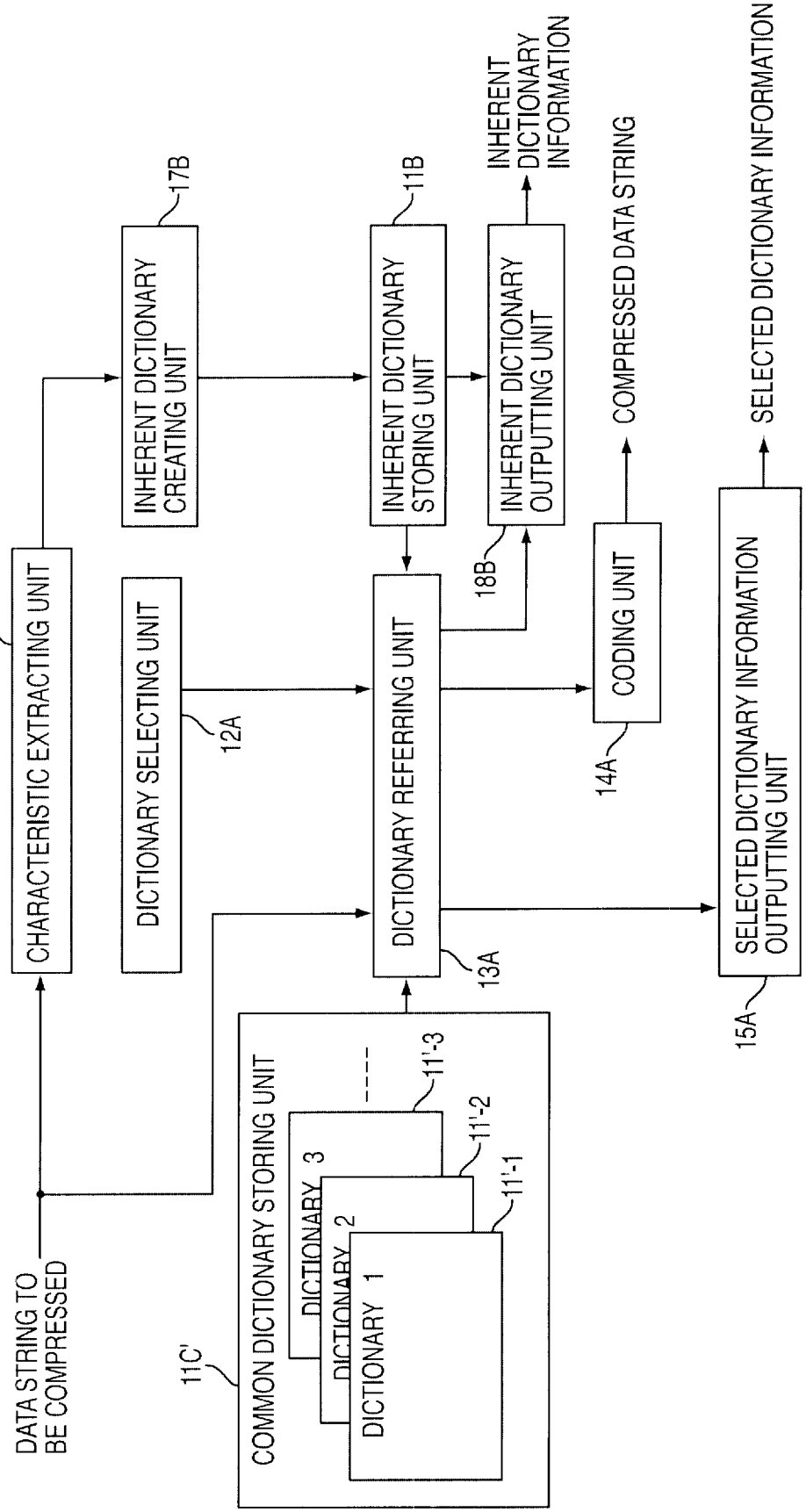
FIG. 43 is a block diagram showing a structure of a data compressing apparatus according to a fourth modification of the second embodiment.

(B4) Description of a Fourth Modification of the Second Embodiment (a) Description of the Decompressing Side FIG. 43 is a block diagram showing a structure of a data compressing apparatus according to a fourth modification of the second embodiment. A data compressing apparatus 1 shown FIG. 43 additionally has, as compared with that shown in FIG. 33, a common dictionary storing unit 11C', along with a inherent dictionary storing unit 11B, a characteristic extracting unit 16B, an inherent dictionary creating unit 17B and an inherent dictionary outputting unit 18B which are similar to those described in the fourth modification of the first embodiment.

In the data compressing apparatus 1 according to the fourth modification, the coding unit 14A codes data to be compressed on the basis of an inherent dictionary created by the inherent dictionary creating unit 17B and a compressing dictionary 11'-i (i=1 through M: where M is a natural number not less than 2) in the common dictionary storing unit 11C' selected by the dictionary selecting unit 32A.

Figure 24:
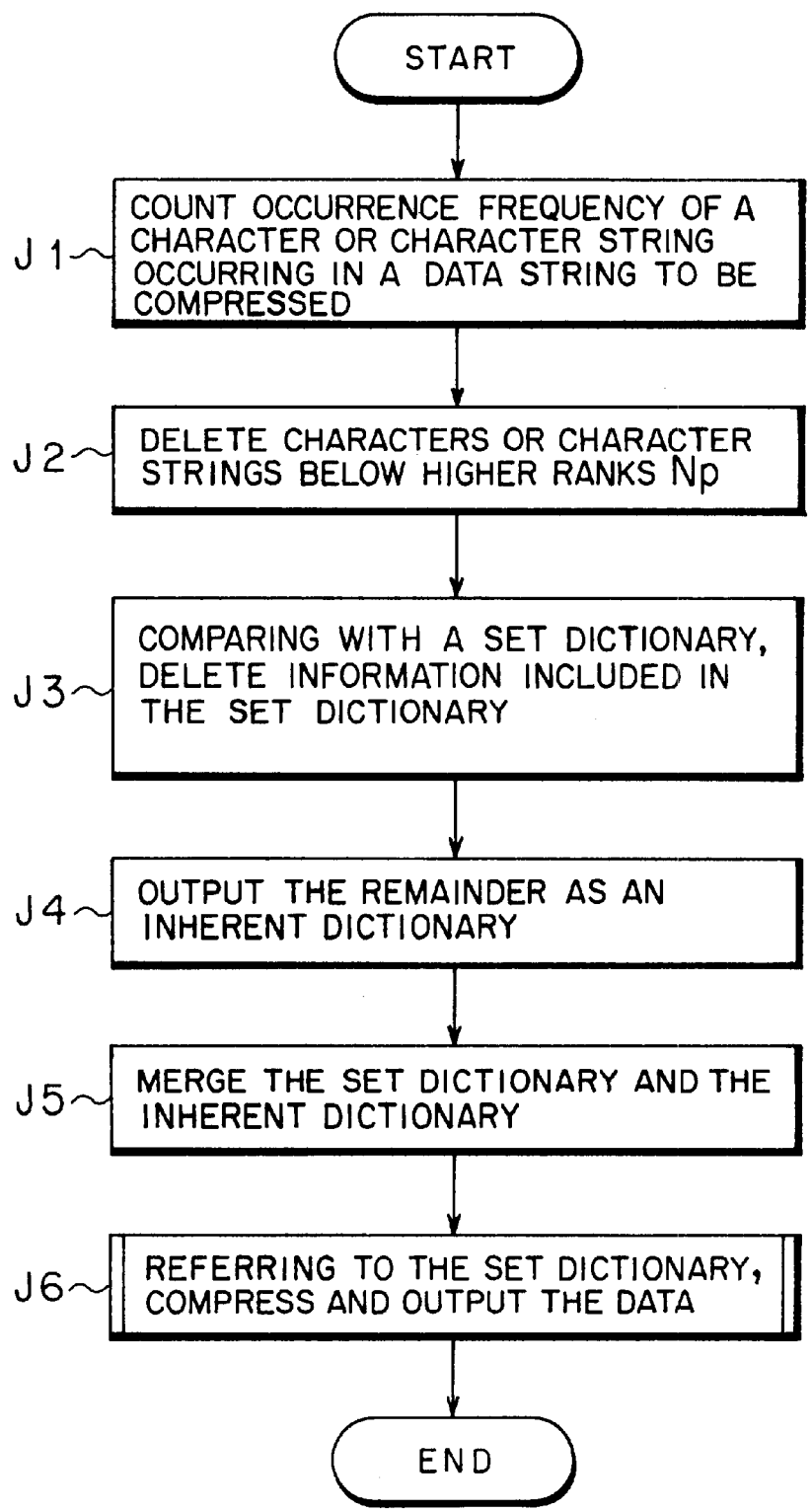
FIG. 24 is a flowchart for illustrating an operation of the data compressing apparatus according to the fourth modification of the first embodiment.

In the data compressing apparatus 1 according to the fourth modification, the characteristic extracting unit 16B and the inherent dictionary creating unit 17B assign a predetermined code to each inherent character data (characteristic data) of data to be compressed to create a compressing inherent dictionary inherent to the data to be compressed (as to a concrete procedure, refer to FIG. 24). The coding unit 14A codes the data to be compressed on the basis of both of the compressing inherent dictionary and a common dictionary selected by the dictionary selecting unit 12A.

According to the above data compressing apparatus 1, it is possible to largely decrease probability of coding data to be compressed not registered in a dictionary, thus improve a compression ratio.

In this case, the inherent dictionary outputting unit 18B outputs information on the above inherent dictionary to the decompressing side so that the decompressing side, which will be described later, accurately decode (decompress) compressed data having been coded according to the inherent dictionary originally created on the compressing side.

The data compressing apparatus 1 according to the fourth modification may code data to be compressed by word, or code data to be compressed by word while adding the category information, similarly to the above second and third modifications.

(b) Description of the Decompressing Side

Figure 44:
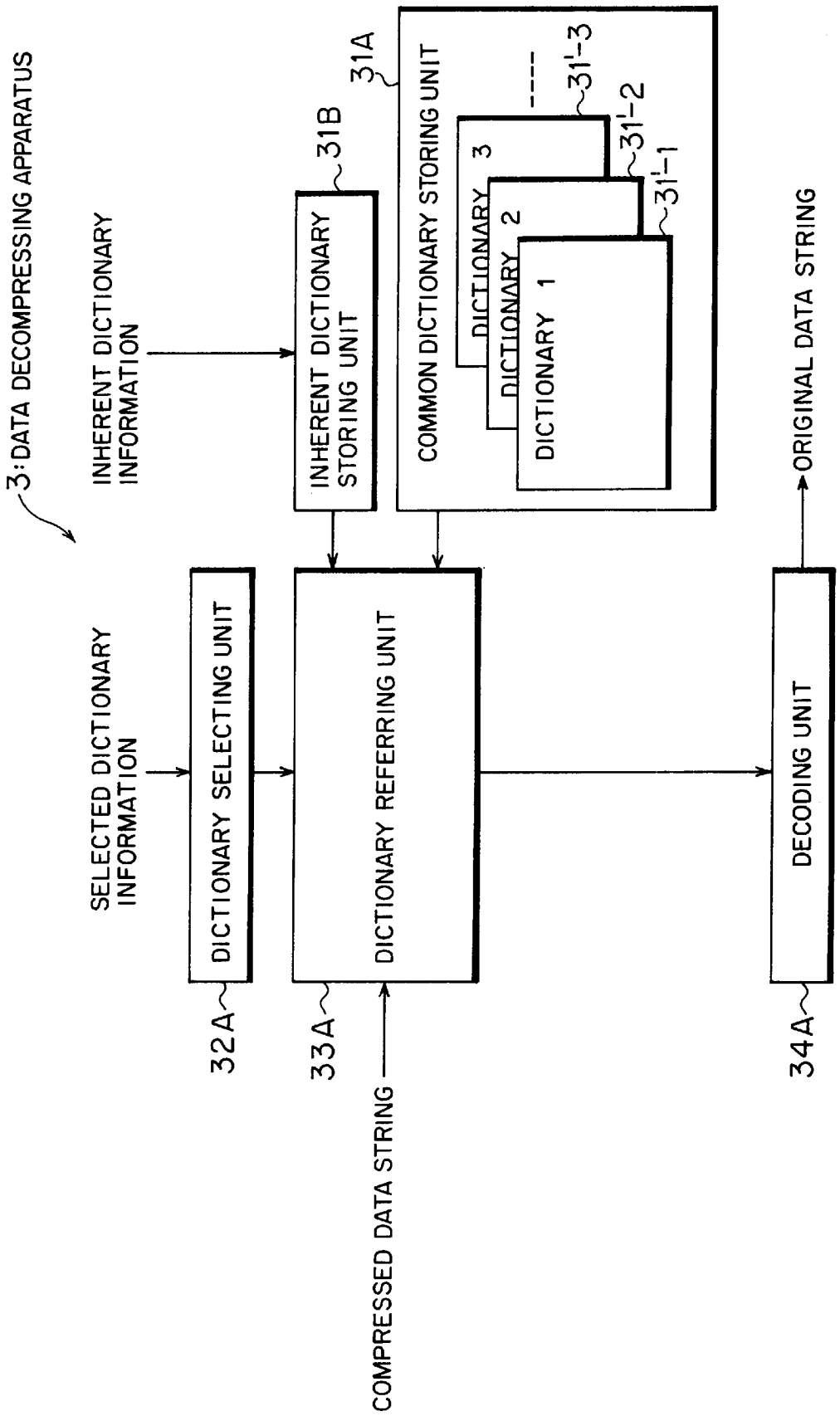
FIG. 44 is a block diagram showing a structure of a data decompressing apparatus according to the fourth modification of the second embodiment.

FIG. 44 is a block diagram showing a structure of a data decompressing apparatus 3 according to the fourth modification of the second embodiment. A data decompressing apparatus 3 shown in FIG. 44 corresponds to the decompressing side of the data compressing apparatus 1 described above with reference to FIG. 43, which additionally has, as compared with that according to the second embodiment shown in FIG. 35, a common dictionary storing unit 31a and an inherent dictionary storing unit 31B.

The common dictionary storing unit 31A and the inherent dictionary storing unit 31B are similar to those shown in FIG. 25. The common dictionary storing unit 31A store dictionaries 31'-i (i=1 through M: where M is a natural number not less than 2) having the same contents as common dictionaries stored in the common dictionary storing unit 11A on the compressing side. The inherent dictionary storing unit 31B stores a dictionary having characters or character strings inherent to data to be compressed that is compressed data before compressed as characteristic data of the data to be compressed, in which a predetermined code is assigned to each characteristic data, as a decompressing inherent dictionary. According to this modification, by receiving inherent dictionary information outputted from the inherent dictionary outputting unit 18B on the compressing side, the inherent dictionary storing unit 31B stores a dictionary having the same contents as an inherent dictionary created by the inherent dictionary creating unit 17B on the compressing side as the above decompressing dictionary.

Namely, a structure of the data decompressing apparatus 3 according to the fourth modification is of the data decompressing apparatus 3 according to the second embodiment shown in FIG. 35, to which the common dictionary storing unit 31A and the inherent dictionary storing unit 31B described in the fourth modification of the first embodiment are added, where the decoding unit 34A decodes compressed data on the basis of a decompressing inherent dictionary in the inherent dictionary storing unit 31B and a common dictionary (decompressing dictionary) 31'-i in the common dictionary storing unit 31A selected by the dictionary selecting unit 32A.

When the data decompressing apparatus 3 having the above structure according to the fourth modification of the second embodiment receives selected dictionary information from the compressing side, the dictionary selecting unit 32A selects a common dictionary 31'-i corresponding to the selected dictionary information. At this time, the inherent dictionary storing unit 31B receives inherent dictionary information from the compressing side, thereby storing a compressing inherent dictionary having the same contents as a compressing dictionary 11'-i having been used on the compressing side.

In the data decompressing apparatus 3, the dictionary referring unit 33A merges (composes) the common dictionary 31'-i selected by the dictionary selecting unit 32A and the inherent dictionary in the inherent dictionary storing unit 31B. The decoding unit 34A successively decode compressed data on the basis of the dictionary merged as above.

The data decompressing apparatus 3 according to the fourth modification decodes compressed data on the basis of both an inherent dictionary in the inherent dictionary storing unit 31B and a common dictionary 31'-i selected by the dictionary selecting unit 32A so as to largely decrease probability of decoding compressed data not registered in the selected dictionary, thus further improve efficiency of the decoding.

According to this modification, the inherent dictionary storing unit 31B can store an inherent dictionary having the same contents as a compressing dictionary 11'-i having been used on the compressing side by receiving the inherent dictionary information from the compressing side. The decoding unit 34A can thereby decode compressed data having been coded according to an inherent dictionary originally created on the compressing side, very accurately.

If the compressing side codes data to be compressed by word or codes data to be compressed by word while adding the category information, the decompressing side may decode compressed data by word or decode compressed data by word on the basis of the category information, as well as the second and third modifications.

Figure 45:
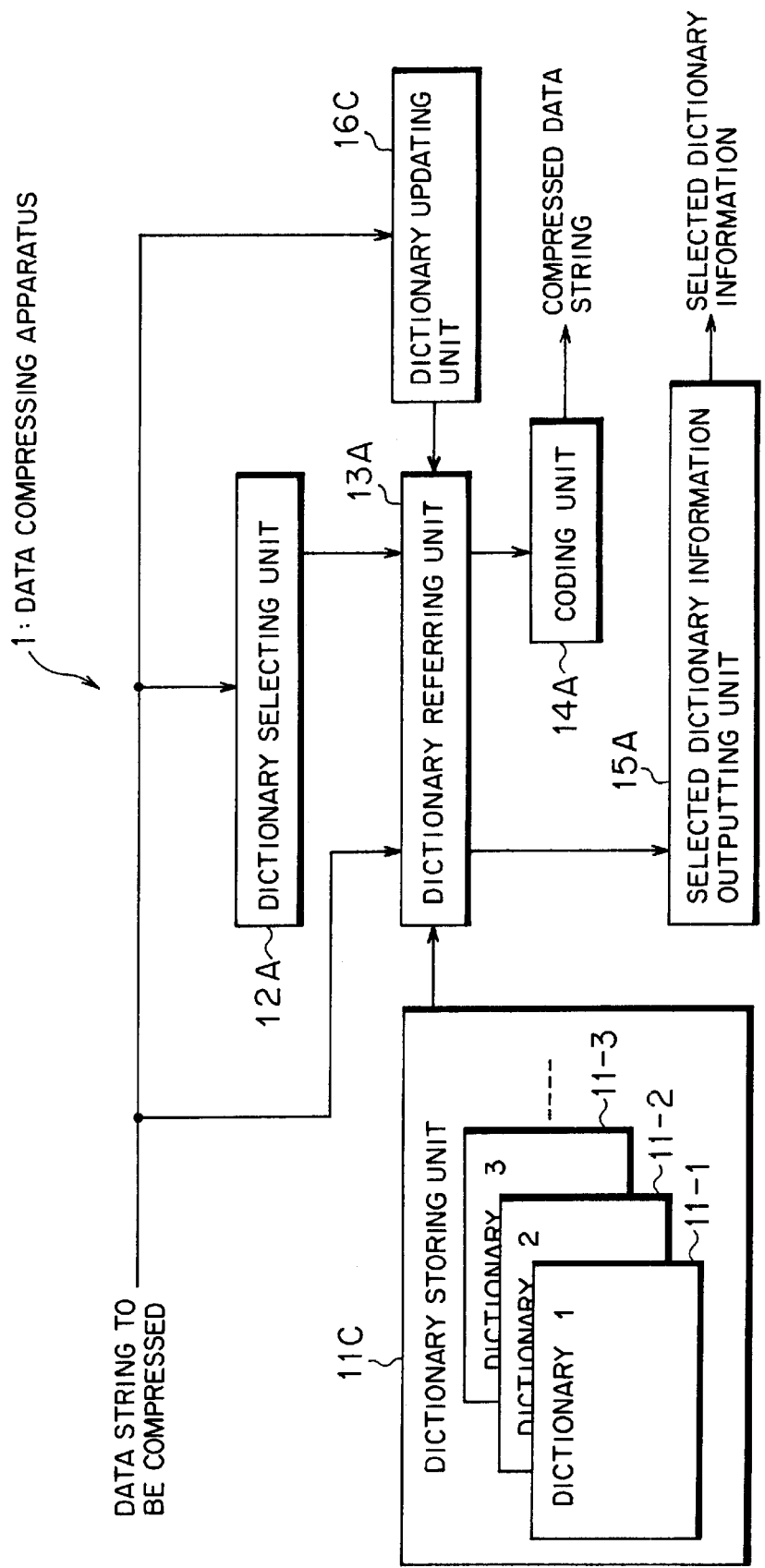
FIG. 45 is a block diagram showing a structure of a data decompressing apparatus according to a fifth modification of the second embodiment.

(B5) Description of a Fifth Modification of the Second Embodiment (a) Description of the Compressing Side FIG. 45 is a block diagram showing a structure of a data compressing apparatus according to a fifth modification of the second embodiment. In a data compressing apparatus shown in FIG. 45, as compared with that shown in FIG. 33, the dictionary selecting unit 12A selects a compressing dictionary 11-i on the basis of specific characters (character strings) frequently occurring in data to be compressed or a quantity of compressed data having been coded, similarly to the above first modification. The data compressing apparatus 1 in FIG. 45 additionally has a dictionary updating unit 16C similar to that (refer to FIG. 27) described above in the fifth modification of the first embodiment.

The data compressing apparatus 1 according to the fifth modification has the dictionary updating unit 16C which updates a compressing dictionary 11-i on the basis of compressed data, which has been coded by word by the coding unit 14A, whereby the coding unit 14A codes data to be compressed on the basis of the compressing dictionary 11-i updated by the dictionary updating unit 16C.

In the data compressing apparatus 1 having the above structure according to the fifth modification, the dictionary selecting unit 12A selects a compressing dictionary 11-i in either manner shown in FIG. 38 or 39, and the coding unit 14A codes data to be compressed on the basis of the compressing dictionary 11-i. At this time, the dictionary updating unit 16C updates the compressing dictionary 11-i on the basis of compressed data which has been coded by word by the coding unit 14A.

As the coding process is proceeded, a plurality of compressing dictionaries suitable for data to be compressed that is an object of the next coding can be prepared. This further improves a compression ratio.

Details of the above processes after a dictionary is selected are similar to those shown in FIGS. 28 and 29, description of which is omitted here. The data compressing apparatus 1 according to the fifth modification may code data to be compressed by word, or code data to be compressed by word while adding category information, as well as the second and third modifications.

(b) Description of the Decompressing Side

Figure 46:
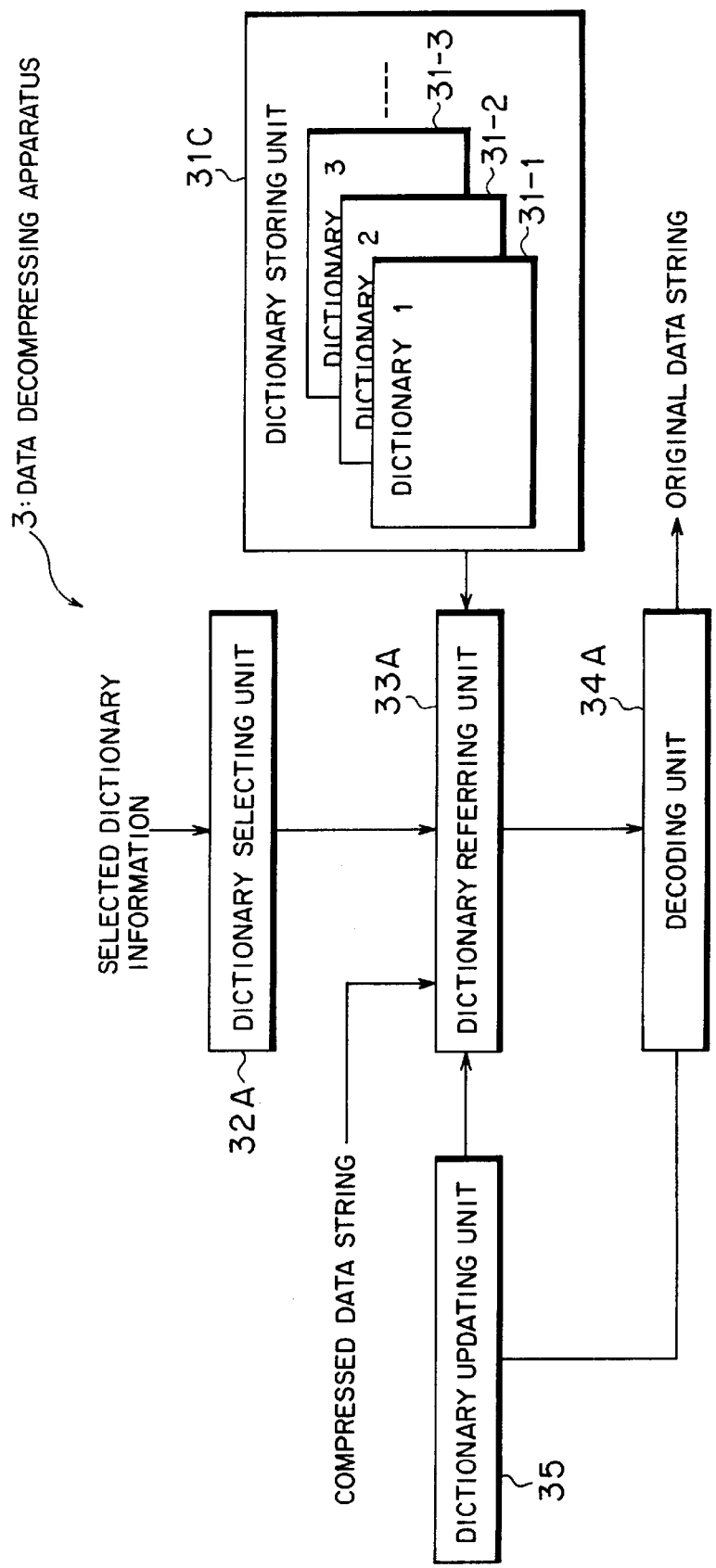
FIG. 46 is a block diagram showing a structure of a data decompressing apparatus according to the fifth modification of the second embodiment.

FIG. 46 is a block diagram showing a structure of a data decompressing apparatus according to the fifth modification of the second embodiment. A data decompressing apparatus 3 shown in FIG. 46 corresponds to the decompressing side of the data compressing apparatus 1 described above with reference to FIG. 45, which additionally has, as compared with that shown in FIG. 35, a dictionary updating unit 35 similar to that (refer to FIG. 30) described above in the fifth modification of the first embodiment.

The data decompressing apparatus 3 according to the fifth modification has the dictionary updating unit (decompressing dictionary updating unit) 35 which updates a decompressing dictionary 31-i in the dictionary storing unit 31C on the basis of a result of decoding by the decoding unit 34A. The decoding unit 34A decodes compressed data on the basis of the decompressing dictionary 31-i updated by the dictionary updating unit 35.

When the data decompressing apparatus 3 according to the fifth modification receives selected dictionary information from the compressing side, the dictionary selecting unit 32A selects a decompressing dictionary 31-i corresponding to the received selected dictionary information in the dictionary storing unit 31C, and the decoding unit 34A successively decode compressed data on the basis of the decompressing dictionary 31-i. At this time, the dictionary updating unit 35 successively updates the decompressing dictionary selected by the dictionary selecting unit 32A on the basis of a result of decoding by the decoding unit 34A.

According to the data decompressing apparatus 3 of the fifth modification, the dictionary updating unit 35 updates a decompressing dictionary 31-i selected by the dictionary selecting unit 32A on the basis of a result of decoding obtained through the decoding process in the decoding unit 34A. As the decoding process is proceeded, plural kinds of decompressing dictionaries 31-i suitable for compressed data that is an object of the next decoding can be prepared, which further improves a decompression efficiency.

Details of the above processes after a dictionary is selected are similar to those shown in FIG. 31 or 32, description of which is omitted here. If the compressing side codes data to be compressed by word, or codes data to be compressed by word while adding the category information, the decompressing side may decode compressed data by word, or decode compressed data by word on the basis of the category information.

(c) Others

Figure 47:
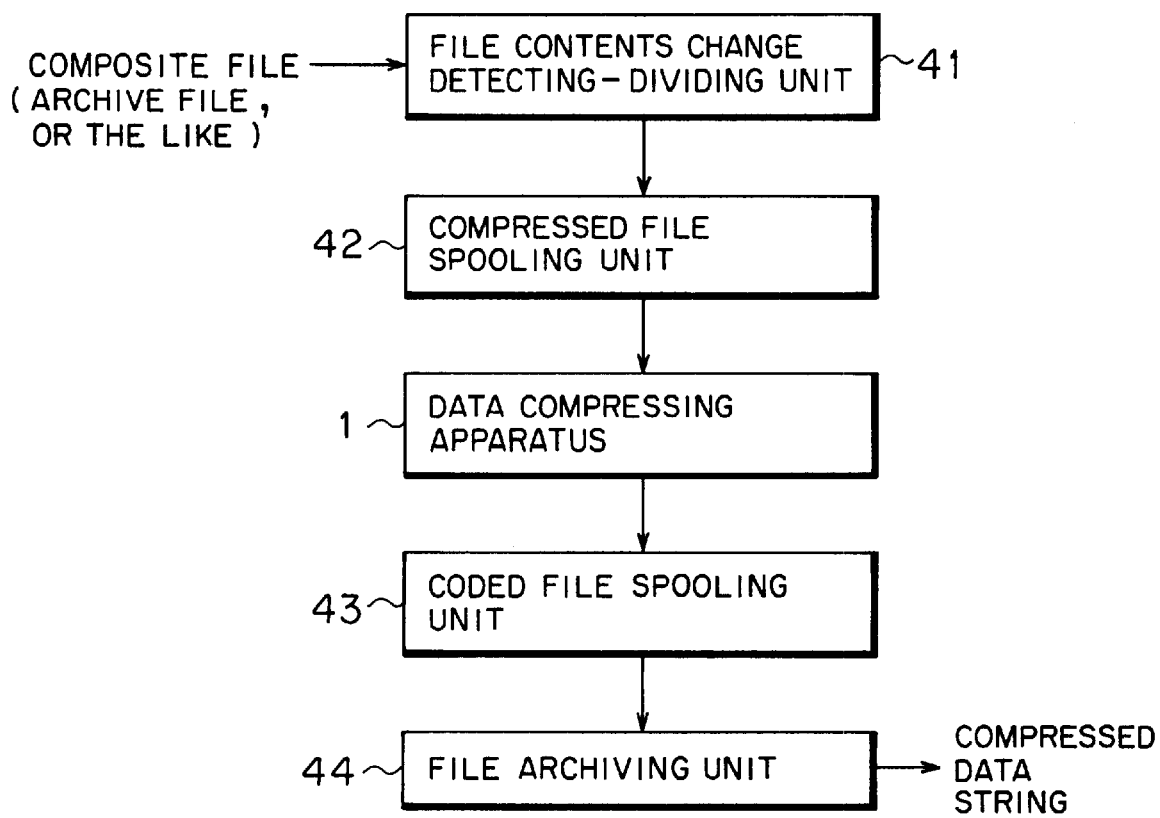
FIG. 47 is a diagram for illustrating an example where the data compressing apparatus according to the first and/or second embodiments is applied.
Figure 48:
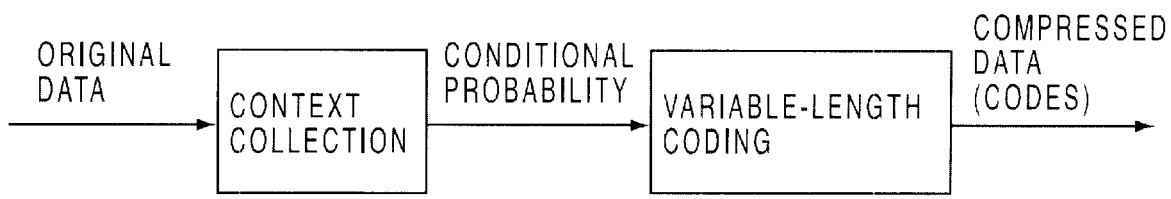
FIG. 48 is a diagram for illustrating a variable-length coding using a context model.
Figure 49B:
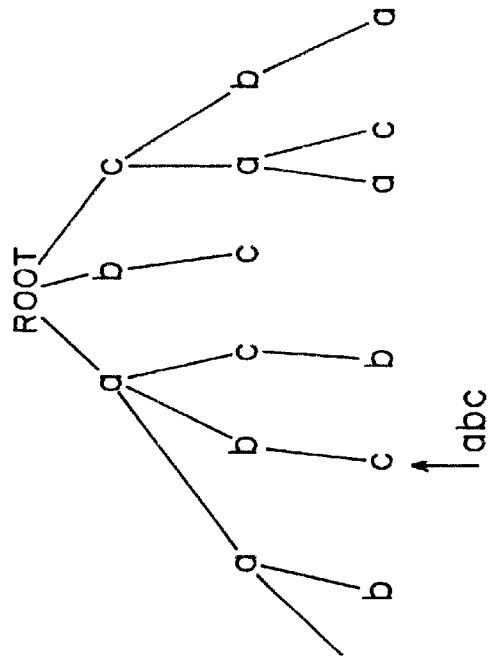
FIGS. 49(a) and 49(b) are diagrams for illustrating a context model.
Figure 49A:
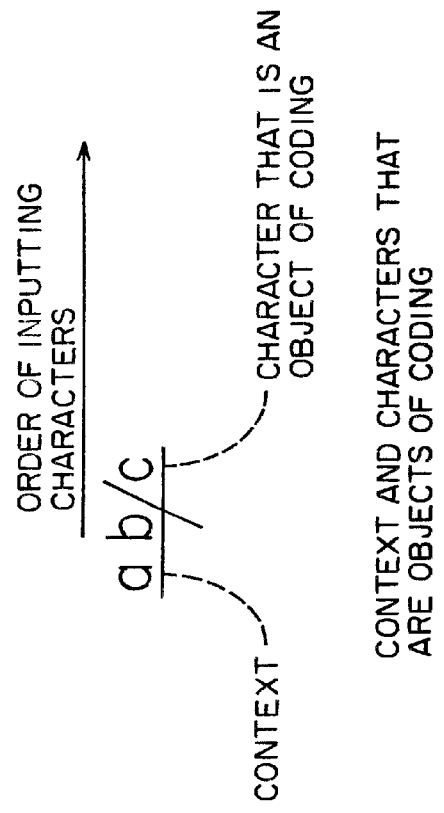
Figure 50:
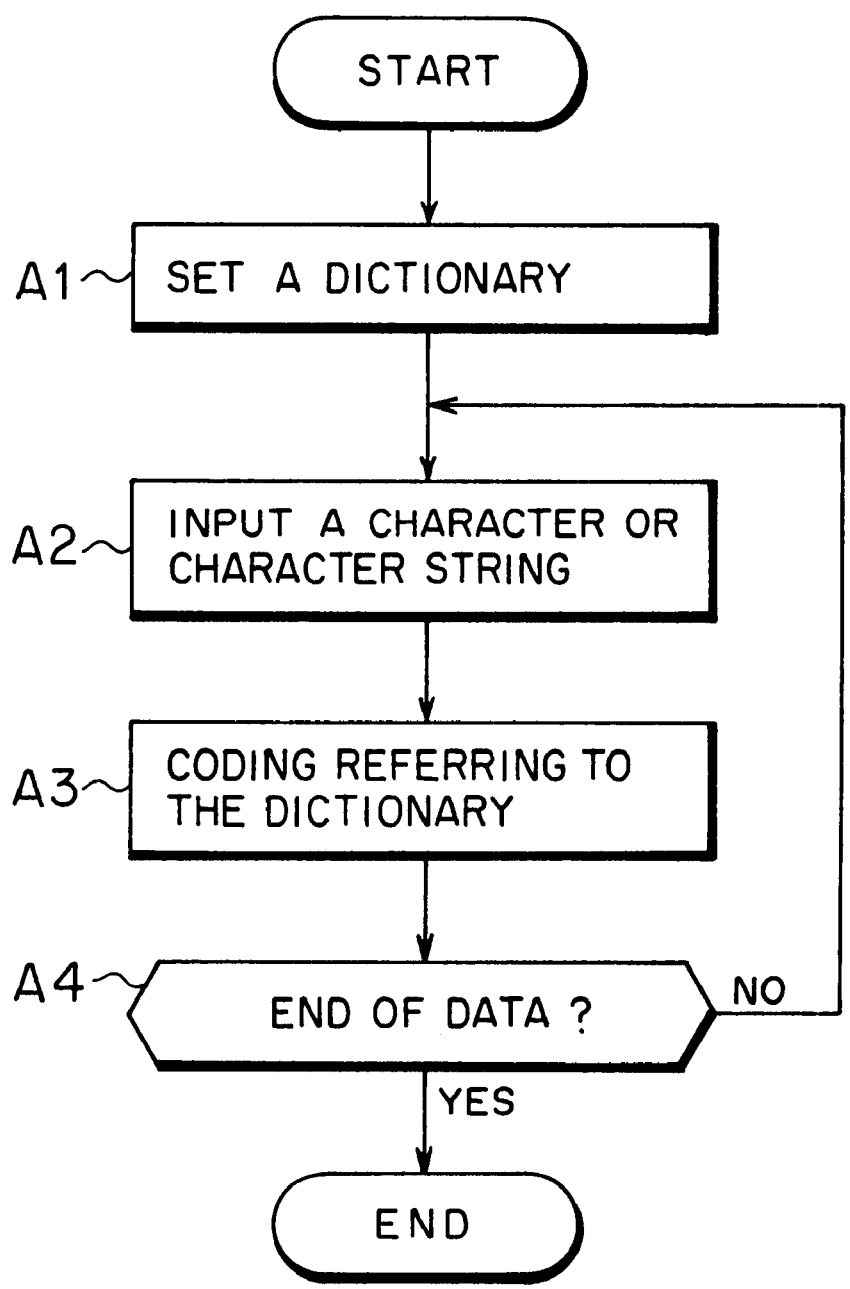
FIG. 50 is a flowchart for illustrating a static coding.
Figure 51:
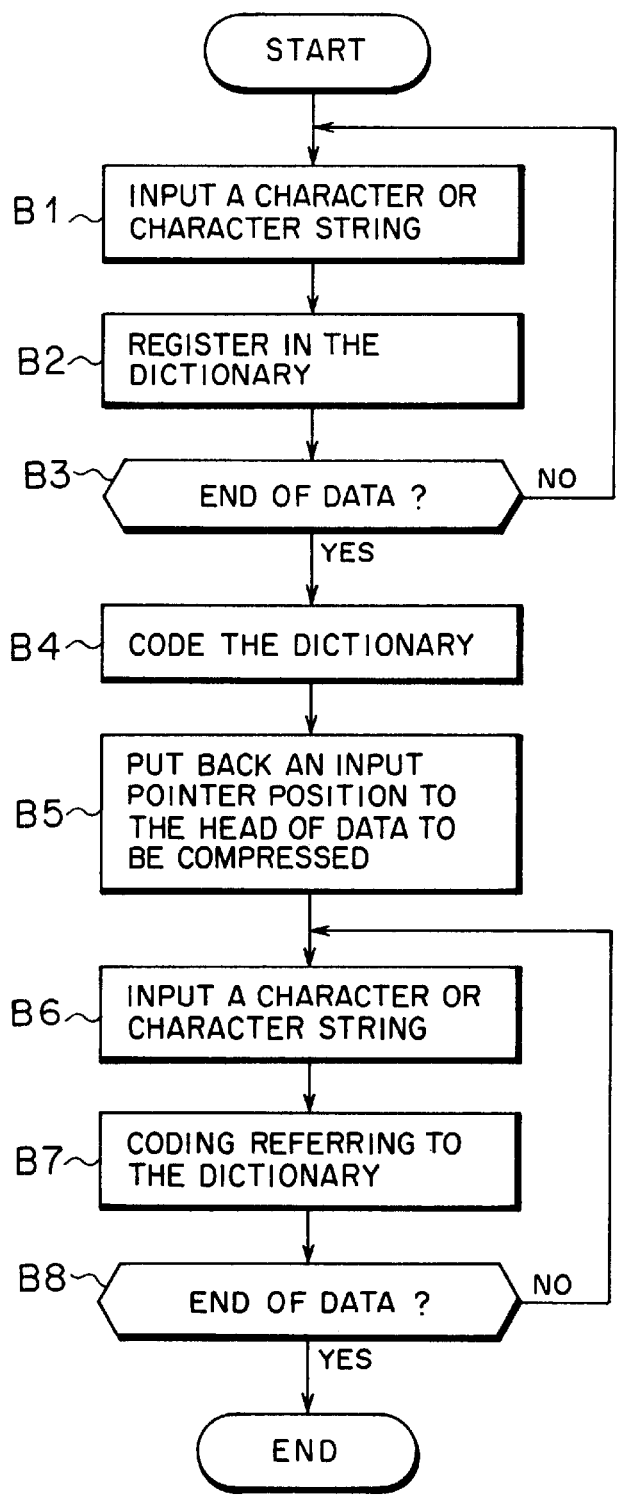
FIG. 51 is a flowchart for illustrating a semi-adaptive coding.
Figure 52:
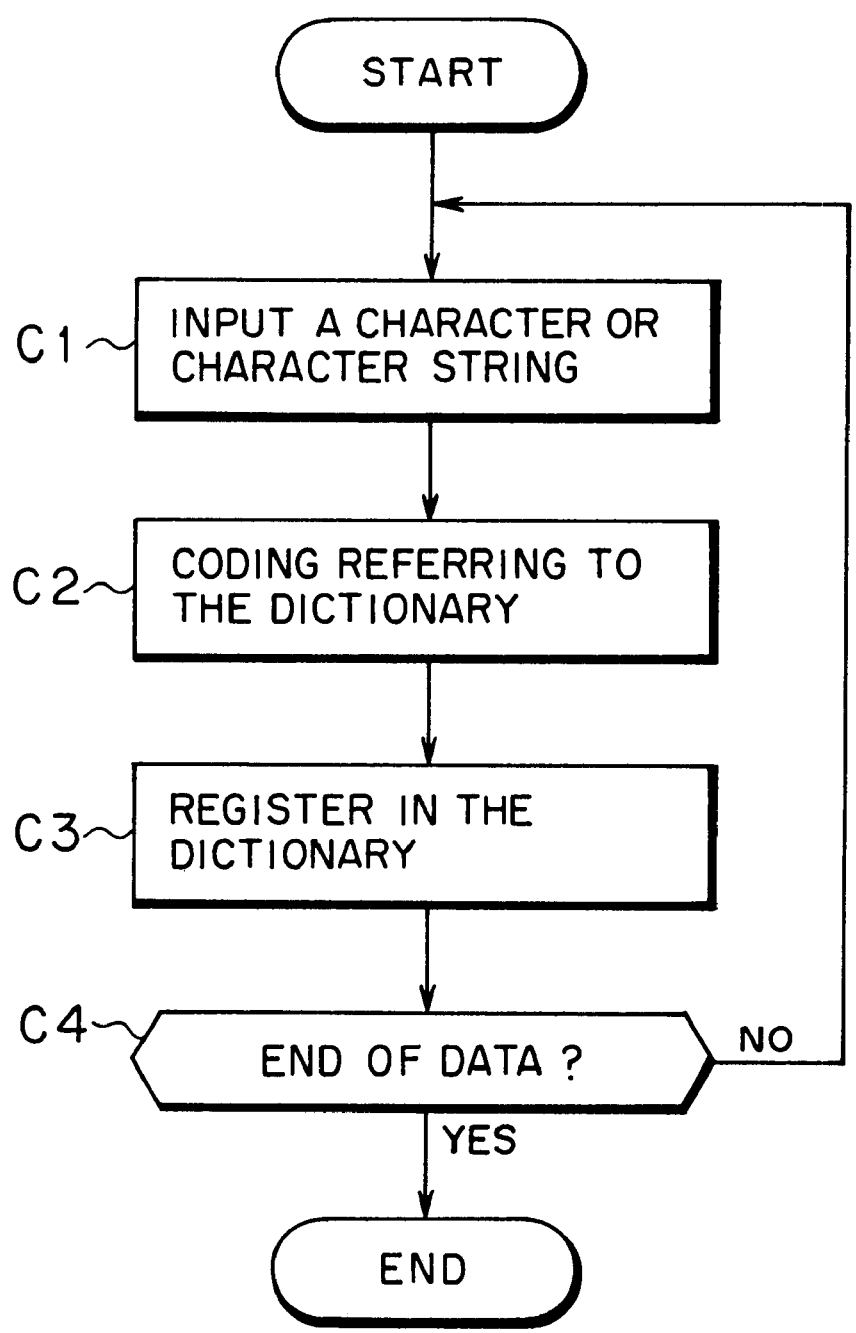
FIG. 52 is a flowchart for illustrating an adaptive coding.

The data compressing apparatus 1 in each of the above embodiments and modifications may be applied to not only compressing (coding) of data to be compressed by file, but also to a case where, as shown in FIG. 47, for example, a file contents change detecting-dividing unit 41 and a compressed file spooling unit 42 divide a file to be compressed and hold the divided files, the data compressing apparatus 1 compresses the files, then a coded file spooling unit 43 and a file archiving unit 44 collect each of the coded files, thereby obtaining file in which different kinds of files are archived.

In each of the embodiments and modification, the data compressing apparatus 1 and the data decompressing apparatus are configured by the personal computer 1 as an apparatus exclusively used for compression and by the personal computer 3 as an apparatus exclusively used for decompression, respectively. However, it is alternatively possible to provide a function of the data compressing apparatus 1 as a data compressing unit and a function of the data decompressing apparatus 3 as a data decompressing unit to the personal computer 1 or 3 so as to configure the personal computer 1 or 3 as a data compressing and decompressing apparatus.

In such case, if the above dictionary storing unit 11 and 31 (11C and 31C) are commonly used by the data compressing unit and the data decompressing unit, it is possible to largely decrease a memory area for holding (storing) the above compressing dictionary and the decompressing dictionary so as to reduce a size of the apparatus. By commonly using each dictionary, the data decompressing unit can decode compressed data according to the same dictionary as a dictionary used in the data compressing unit so that the compressed data can be more accurately decoded.

Each of the above embodiment has been described by way of an example where data to be compressed is mainly character data such as text file data. However, this invention is not limited to this example, but the data to be compressed may be other data such as image data or the like.

It should be noted that this invention is not limited to the above embodiments, but may be modified in various ways without departing from the scope of this invention.

What is claimed is:

1. A data compressing apparatus for coding inputted data to be compressed, comprising:

a compressing dictionary storing unit for storing a compressing dictionary usable to compress said inputted data;

a compressing dictionary use or non-use deciding unit for deciding whether said compressing dictionary is to be used or not when said inputted data is considered for coding; and a coding unit for coding said inputted data on the basis of said compressing dictionary when said compressing dictionary use or non-use deciding unit decides said compressing dictionary is to be used and outputting the coded data, and outputting the same inputted data without coding when said compressing dictionary use or non-use deciding unit decides said compressing dictionary is not to be used.

2. The data compressing apparatus according to claim 1 further comprising:

a compressed data dividing unit for dividing said data to be compressed into predetermined character data groups;

wherein said coding unit codes said data to be compressed by said character data group obtained by said compressed data dividing unit.

3. The data compressing apparatus according to claim 2, wherein if said data to be compressed is document-form data, said compressed data dividing unit comprises:

a word dictionary storing unit for storing a word dictionary in which desired words are registered as said character data groups occurring in said document-form data; and a word dividing unit for dividing said data to be compressed into words on the basis of said words registered in said word dictionary in said word dictionary storing unit.

4. The data compressing apparatus according to claim 2, wherein if said data to be compressed is document-form data, said compressed data dividing unit comprises:

a word category dictionary storing unit for storing a word category dictionary in which a desired word as each of said character data groups occurring in said document-form data and category information on said word are registered;

a word dividing unit for dividing said data to be compressed into words on the basis of said words registered in said word category dictionary in said word category dictionary storing unit; and a category information adding unit for adding said category information corresponding to each of said words obtained by said word dividing unit on the basis of said category information registered in said word category dictionary.

5. The data compressing apparatus according to claim 1 further comprising:
a characteristic extracting unit for extracting character data inherent to said data to be compressed as characteristic data of said data to be compressed; and
a compressing inherent dictionary creating unit for assigning a predetermined code to each of said characteristic data extracted by said characteristic extracting unit to create a compressing inherent dictionary inherent to said data to be compressed;
wherein said coding unit codes said data to be compressed on the basis of said compressing inherent dictionary created by said compressing inherent dictionary creating unit and said compressing dictionary in said compressing dictionary storing unit.

6. The data compressing apparatus according to claim 5 further comprising:
an inherent dictionary information outputting unit for outputting information on said compressing inherent dictionary to a decompressing side for said data to be compressed.

7. The data compressing apparatus according to claim 1 further comprising:
a compressing dictionary updating unit for updating said compressing dictionary on the basis of data to be compressed having been coded by code in said coding unit;
wherein said coding unit codes said data to be compressed on the basis of said compressing dictionary updated by said compressing dictionary updating unit.

8. The data compressing apparatus according to claim 1, wherein said compressing dictionary use or non-use deciding unit decides whether said compressing dictionary is to be used or not on the basis of data contents type information representing a type of data contents of said data to be compressed.

9. The data compressing apparatus according to claim 1, wherein said compressing dictionary use or non-use deciding unit decides whether said compressing dictionary is to be used or not according to whether specific character data occurs in said data to be compressed or not.

10. The data compressing apparatus according to claim 1, wherein said compressing dictionary use or non-use deciding unit decides whether said compressing dictionary is to be used or not according to occurrence frequency of specific character data in said data to be compressed.

11. The data compressing apparatus according to claim 1, wherein said compressing dictionary use or non-use deciding unit decides whether said compressing dictionary is to be used or not according to a quantity of compressed data having been coded by said coding unit.

12. The data compressing apparatus according to claim 1 further comprising:
a dictionary use or non-use information outputting unit for outputting information on use or non-use of said compressing dictionary decided by said compressing dictionary use or non-use deciding unit to a decompressing side for said data to be compressed.

13. A data compressing apparatus for coding inputted data to be compressed, comprising:
a compressing dictionary storing unit for storing plural different kinds of compressing dictionaries usable to compress inputted file data to be compressed;
a compressing dictionary selecting unit for selecting a compressing dictionary to be used among said plural different kinds of compressing dictionaries on the basis of an extension of a file name of the inputted file data; and
a coding unit for coding said inputted file data on the basis of said compressing dictionary selected by said compressing dictionary selecting unit.

14. The data compressing apparatus according to claim 13 further comprising:
a compressed data dividing unit for dividing said data to be compressed into predetermined character data groups;
wherein said coding unit codes said data to be compressed by said character data group obtained by said compressed data dividing unit on the basis of said compressing dictionary selected by said compressing dictionary selecting unit.

15. The data compressing apparatus according to claim 14, wherein if said data to be compressed is document-form data, said compressed data dividing unit comprises:
a word dictionary storing unit for storing a word dictionary in which desired words are registered as said character data groups occurring in said document-form data; and
a word dividing unit for dividing said data to be compressed into words on the basis of said words registered in said word dictionary in said word dictionary storing unit.

16. The data compressing apparatus according to claim 14, wherein if said data to be compressed is document-form data, said compressed data dividing unit comprises:
a word category dictionary storing unit for storing a word category dictionary in which a desired word as each of said character data groups occurring in said document-form data and category information on said word are registered;
a word dividing unit for dividing said data to be compressed into words on the basis of said words registered in said word category dictionary in said word category dictionary storing unit; and
a category information adding unit for adding said category information corresponding to each of said words obtained by said word dividing unit on the basis of said category information registered in said word category dictionary.

17. The data compressing apparatus according to claim 13 further comprising:
a characteristic extracting unit for extracting character data inherent to said data to be compressed as characteristic data of said data to be compressed; and
a compressing inherent dictionary creating unit for assigning a predetermined code to each of said characteristic data extracted by said characteristic extracting unit to create a compressing inherent dictionary inherent to said data to be compressed;
wherein said coding unit codes said data to be compressed on the basis of said compressing inherent dictionary created by said compressing inherent dictionary creating unit and said compressing dictionary selected by said compressing dictionary selecting unit.

18. The data compressing apparatus according to claim 17 further comprising:
an inherent dictionary information outputting unit for outputting information on said compressing inherent dictionary to a decompressing side for said data to be compressed.

19. The data compressing apparatus according to claim 13 further comprising:
   a compressing dictionary updating unit for updating said compressing dictionary on the basis of data to be compressed having been coded by code in said coding unit;
   wherein said coding unit codes said data to be compressed on the basis of said compressing dictionary updated by said compressing dictionary updating unit.

20. The data compressing apparatus according to claim 13 further comprising:
   a selected dictionary information outputting unit for outputting selected dictionary information on said compressing dictionary selected by said compressing dictionary selecting unit to a decompressing side for said data to be compressed.

21. A data compressing apparatus for coding inputted data to be compressed, comprising:
   a compressing dictionary storing unit for storing plural different kinds of compressing dictionaries usable to compress said inputted data;
   a compressing dictionary selecting unit for selecting a compressing dictionary including high-ranked character data of high occurrence frequency in said inputted data among said plural different kinds of compressing dictionaries; and
   a coding unit for coding said inputted data on the basis of said compressing dictionary selected by said compressing dictionary selecting unit.

22. The data compressing apparatus according to claim 21 further comprising:
   a compressed data dividing unit for dividing said data to be compressed into predetermined character data groups;
   wherein said coding unit codes said data to be compressed by said character data group obtained by said compressed data dividing unit on the basis of said compressing dictionary selected by said compressing dictionary selecting unit.

23. The data compressing apparatus according to claim 22, wherein if said data to be compressed is document-form data, said compressed data dividing unit comprises:
   a word dictionary storing unit for storing a word dictionary in which desired words as said character data groups occurring in said document-form data are registered; and
   a word dividing unit for dividing said data to be compressed into words on the basis of said words registered in said word dictionary in said word dictionary storing unit.

24. The data compressing apparatus according to claim 22, wherein if said data to be compressed is document-form data, said compressed data dividing unit comprises:
   a word category dictionary storing unit for storing a word category dictionary in which a desired word as each of said character data groups occurring in said document-form data and category information on said word are registered;
   a word dividing unit for dividing said data to be compressed into words on the basis of said words registered in said word category dictionary in said word category dictionary storing unit; and
   a category information adding unit for adding said category information corresponding to each of said words obtained by said word dividing unit on the basis of said category information registered in said word category dictionary.

25. The data compressing apparatus according to claim 21 further comprising:
   a characteristic extracting unit for extracting character data inherent to said data to be compressed as characteristic data of said data to be compressed; and
   a compressing inherent dictionary creating unit for assigning a predetermined code to each of said characteristic data extracted by said characteristic extracting unit to create a compressing inherent dictionary inherent to said data to be compressed;
   wherein said coding unit codes said data to be compressed on the basis of said compressing inherent dictionary created by said compressing inherent dictionary creating unit and said compressing dictionary selected by said compressing dictionary selecting unit.

26. The data compressing apparatus according to claim 25 further comprising:
   an inherent dictionary information outputting unit for outputting information on said compressing inherent dictionary to a decompressing side for said data to be compressed.

27. The data compressing apparatus according to claim 21 further comprising:
   a compressing dictionary updating unit for updating said compressing dictionary on the basis of data to be compressed having been coded by code in said coding unit;
   wherein said coding unit codes said data to be compressed on the basis of said compressing dictionary updated by said compressing dictionary updating unit.

28. The data compressing apparatus according to claim 21 further comprising:
   a selected dictionary information outputting unit for outputting selected dictionary information on said compressing dictionary selected by said compressing dictionary selecting unit to a decompressing side for said data to be compressed.

29. A data compressing apparatus for coding inputted data to be compressed, comprising:
   a compressing dictionary storing unit for storing plural different kinds of compressing dictionaries usable to compress said inputted data;
   a coding unit for coding said inputted data using any one of said plural different kinds of compressing dictionaries and outputting quantity information on a quantity of the coded data;
   a determining unit for determining whether the quantity of the coded data is smaller than an original quantity before the coding based on the quantity information from said coding unit; and
   a compressing dictionary selecting unit for selecting a compressing dictionary to be used among said plural different kinds of compressing dictionaries according to the determination of said determining unit.

30. The data compressing apparatus according to claim 29 further comprising:
   a compressed data dividing unit for dividing said data to be compressed into predetermined character data groups;
   wherein said coding unit codes said data to be compressed by said character data group obtained by said compressed data dividing unit on the basis of said compressing dictionary selected by said compressing dictionary selecting unit.

31. The data compressing apparatus according to claim 30, wherein if said data to be compressed is document-form data, said compressed data dividing unit comprises:

a word dictionary storing unit for storing a word dictionary in which desired words as said character data groups occurring in said document-form data are registered; and a word dividing unit for dividing said data to be compressed into words on the basis of said words registered in said word dictionary in said word dictionary storing unit.

32. The data compressing apparatus according to claim 30, wherein if said data to be compressed is document-form data, said compressed data dividing unit comprises:

a word category dictionary storing unit for storing a word category dictionary in which a desired word as each of said character data groups occurring in said document-form data and category information on said word are registered;

a word dividing unit for dividing said data to be compressed into words on the basis of said words registered in said word category dictionary in said word category dictionary storing unit; and a category information adding unit for adding said category information corresponding to each of said words obtained by said word dividing unit on the basis of said category information registered in said word category dictionary.

33. The data compressing apparatus according to claim 29 further comprising:

a characteristic extracting unit for extracting character data inherent to said data to be compressed as characteristic data of said data to be compressed; and a compressing inherent dictionary creating unit for assigning a predetermined code to each of said characteristic data extracted by said characteristic extracting unit to create a compressing inherent dictionary inherent to said data to be compressed;

wherein said coding unit codes said data to be compressed on the basis of said compressing inherent dictionary created by said compressing inherent dictionary creating unit and said compressing dictionary selected by said compressing dictionary selecting unit.

34. The data compressing apparatus according to claim 33 further comprising:

an inherent dictionary information outputting unit for outputting information on said compressing inherent dictionary to a decompressing side for said data to be compressed.

35. The data compressing apparatus according to claim 29 further comprising:

a compressing dictionary updating unit for updating said compressing dictionary on the basis of data to be compressed having been coded by code in said coding unit;

wherein said coding unit codes said data to be compressed on the basis of said compressing dictionary updated by said compressing dictionary updating unit.

36. The data compressing apparatus according to claim 29 further comprising:

a selected dictionary information outputting unit for outputting selected dictionary information on said compressing dictionary selected by said compressing dictionary selecting unit to a decompressing side for said data to be compressed.

37. A data decompressing apparatus for decoding inputted data to be decompressed, comprising:

a decompressing dictionary storing unit for storing a decompressing dictionary usable to decompress said inputted data;

decompressing dictionary use or non-use deciding unit for deciding whether said decompressing dictionary is to be used or not when said inputted data is considered for decoding; and a decoding unit for decoding said inputted data on the basis of said decompressing dictionary when said decompressing dictionary use or non-use deciding unit decides said decompressing dictionary is to be used and outputting the decoded data, and outputting the same inputted data without decoding when said decompressing dictionary use or non-use deciding unit decides said decompressing dictionary is not to be used.

38. The data decompressing apparatus according to claim 37, wherein said decoding unit decodes said compressed data by predetermined character data group on the basis of said decompressing dictionary.

39. The data decompressing apparatus according to claim 38, wherein if original data of said compressed data before compression is document-form data, said character data group is a desired word in said document-form data.

40. The data decompressing apparatus according to claim 39, wherein said decoding unit decodes said compressed data on the basis of category information on said word.

41. The data decompressing apparatus according to claim 37 further comprising:

a decompressing inherent dictionary storing unit for storing a dictionary having character data inherent to data to be compressed that is said compressed data before compressed as characteristic data of said compressed data, in which a predetermined code is assigned to each of said characteristic data as decompressing dictionary;

wherein said decoding unit decodes said compressed data on the basis of said decompressing inherent dictionary in said decompressing inherent dictionary storing unit and said decompressing dictionary in said decompressing dictionary storing unit.

42. The data decompressing apparatus according to claim 41, wherein said decompressing inherent dictionary storing unit receives information on a compressing inherent dictionary created by extracting character data inherent to said data to be compressed as characteristic data of said data to be compressed and assigning a predetermined code to each of said characteristic data from a compressing side having generated said compressed data to store said decompressing inherent dictionary.

43. The data decompressing apparatus according to claim 37 further comprising:

a decompressing dictionary updating unit for updating said decompressing dictionary on the basis of a result of decoding by said decoding unit;

wherein said decoding unit decodes said compressed data on the basis of said decompressing dictionary updated by said decompressing dictionary updating unit.

44. The data decompressing apparatus according to claim 37, wherein said decompressing dictionary use or non-use deciding unit decides whether said decompressing dictionary is to be used or not according to information on use or non-use of a compressing dictionary received from a compressing side having generated said compressed data.

45. A data decompressing apparatus for decoding compressed data to be decompressed, comprising:

a decompressing dictionary storing unit for storing plural different kinds of decompressing dictionaries usable to decompress compressed file data;

a decompressing dictionary selecting unit for receiving selected dictionary information on a compressing dictionary selected on the basis of an extension of a file name of the file data from a compressing side having generated said compressed file data to select a decompressing dictionary to be used among said plural different kinds of decompressing dictionaries on the basis of said received selected dictionary information; and a decoding unit for decoding said compressed file data on the basis of said decompressing dictionary selected by said decompressing dictionary selecting unit.

46. The data decompressing apparatus according to claim 45, wherein said decoding unit decodes said compressed data by predetermined character data group on the basis of said decompressing dictionary selected by said decompressing dictionary selecting unit.

47. The data decompressing apparatus according to claim 46, wherein if data to be compressed that is said compressed data before compressed is document-form data, said character data group is a desired word in said document-form data.

48. The data decompressing apparatus according to claim 47, wherein said decoding unit decodes said compressed data on the basis of category information on said word.

49. The data decompressing apparatus according to claim 45 further comprising:

a decompressing inherent dictionary storing unit for storing a dictionary having character data inherent to data to be compressed that is said compressed data before compressed as characteristic data of said compressed data, in which a predetermined code is assigned to each of said characteristic data as decompressing dictionary;

wherein said decoding unit decodes said compressed data on the basis of said decompressing inherent dictionary in said decompressing inherent dictionary storing unit and said decompressing dictionary selected by said decompressing dictionary selecting unit.

50. The data decompressing apparatus according to claim 49, wherein said decompressing inherent dictionary storing unit receives information on a compressing inherent dictionary created by extracting character data inherent to said data to be compressed as characteristic data of said data to be compressed and assigning a predetermined code to each of said characteristic data from a compressing side having generated said compressed data to store said decompressing inherent dictionary.

51. The data decompressing apparatus according to claim 45 further comprising:

a decompressing dictionary updating unit for updating said decompressing dictionary on the basis of a result of decoding by said decoding unit;

wherein said decoding unit decodes said compressed data on the basis of said decompressing dictionary updated by said decompressing dictionary updating unit.

52. A data decompressing apparatus for decoding compressed data to be decompressed, comprising:

a decompressing dictionary storing unit for storing plural different kinds of decompressing dictionaries usable to decompress said compressed data;

a decompressing dictionary selecting unit for receiving selected dictionary information on a compressing dictionary selected as a compressing dictionary including high-ranked character data of high occurrence frequency in data to be compressed from a compressing side having generated said compressed data to select a decompressing dictionary to be used among said plural different kinds of decompressing dictionaries on the basis of said received selected dictionary information; and a decoding unit for decoding said compressed data on the basis of said decompressing dictionary selected by said decompressing dictionary selecting unit.

53. The data decompressing apparatus according to claim 52, wherein said decoding unit decodes said compressed data by predetermined character data group on the basis of said decompressing dictionary selected by said decompressing dictionary selecting unit.

54. The data decompressing apparatus according to claim 53, wherein if data to be compressed that is said compressed data before compressed is document-form data, said character data group is a desired word in said document-form data.

55. The data decompressing apparatus according to claim 54, wherein said decoding unit decodes said compressed data on the basis of category information on said word.

56. The data decompressing apparatus according to claim 52 further comprising:

a decompressing inherent dictionary storing unit for storing a dictionary having character data inherent to data to be compressed that is said compressed data before compressed as characteristic data of said compressed data, in which a predetermined code is assigned to each of said characteristic data as decompressing dictionary;

wherein said decoding unit decodes said compressed data on the basis of said decompressing inherent dictionary in said decompressing inherent dictionary storing unit and said decompressing dictionary in said decompressing dictionary storing unit.

57. The data decompressing apparatus according to claim 56, wherein said decompressing inherent dictionary storing unit receives information on a compressing inherent dictionary created by extracting character data inherent to said data to be compressed as characteristic data of said data to be compressed and assigning a predetermined code to each of said characteristic data from a compressing side having generated said compressed data to store said decompressing inherent dictionary.

58. The data decompressing apparatus according to claim 52 further comprising:

a decompressing dictionary updating unit for updating said decompressing dictionary on the basis of a result of decoding by said decoding unit;

wherein said decoding unit decodes said compressed data on the basis of said decompressing dictionary updated by said decompressing dictionary updating unit.

59. A data decompressing apparatus for decoding compressed data to be decompressed, comprising:

a decompressing dictionary storing unit for storing plural different kinds of dictionaries usable to decompress said compressed data;

a decompressing dictionary selecting unit for receiving selected dictionary information on a compressing dictionary selected according to a determination of whether a quantity of compressed data is smaller than an original quantity before compressing from a compressing side having generated said compressed data to select a decompressing dictionary to be used among said plural different kinds of decompressing dictionaries on the basis of said received selected dictionary information: and a decoding unit for decoding said compressed data on the basis of said decompressing dictionary selected by said decompressing dictionary selecting unit.

60. The data decompressing apparatus according to claim 59, wherein said decoding unit decodes said compressed data by predetermined character data group on the basis of said decompressing dictionary selected by said decompressing dictionary selecting unit.

61. The data decompressing apparatus according to claim 60, wherein if data to be compressed that is said compressed data before compressed is document-form data, said character data group is a desired word in said document-form data.

62. The data decompressing apparatus according to claim 61, wherein said decoding unit decodes said compressed data on the basis of category information on said word.

63. The data decompressing apparatus according to claim 59 further comprising:
   a decompressing inherent dictionary storing unit for storing a dictionary having character data inherent to data to be compressed that is said compressed data before compressed as characteristic data of said compressed data, in which a predetermined code is assigned to each of said characteristic data as decompressing dictionary;
   wherein said decoding unit decodes said compressed data on the basis of said decompressing inherent dictionary in said decompressing inherent dictionary storing unit and said decompressing dictionary selected by said decompressing dictionary selecting unit.

64. The data decompressing apparatus according to claim 63, wherein said decompressing inherent dictionary storing unit receives information on a compressing inherent dictionary created by extracting character data inherent to said data to be compressed as characteristic data of said data to be compressed and assigning a predetermined code to each of said characteristic data from a compressing side having generated said compressed data to store said decompressing inherent dictionary.

65. The data decompressing apparatus according to claim 59 further comprising:
   a decompressing dictionary updating unit for updating said decompressing dictionary on the basis of a result of decoding by said decoding unit;
   wherein said decoding unit decodes said compressed data on the basis of said decompressing dictionary updated by said decompressing dictionary updating unit.

66. A data compressing method for coding inputted data to be compressed, comprising:
   deciding at a deciding stage whether a compressing dictionary is to be used or not when said inputted data is considered for coding, based on a portion of the inputted data and a portion of the compressing dictionary;
   coding said inputted data to produce coded data on the basis of said compressing dictionary when it has been decided at said deciding stage that said compressing dictionary is to be used, and outputting the coded data; and
   outputting the same inputted data without coding when decided at said deciding stage that said compressing dictionary is not to be used for coding.

67. A data compressing method for coding inputted data to be compressed, comprising:
   selecting a compressing dictionary to be used among plural different kinds of compressing dictionaries on the basis of an extension of a file name of inputted file data to be compressed: and
   coding said inputted file data on the basis of said selected compressing dictionary.

68. A data compressing method for coding inputted data to be compressed, comprising:
   selecting a compressing dictionary including high-ranked N character data of high occurrence frequency in said inputted data among plural different kinds of compressing dictionaries; and
   coding said inputted data to be compressed on the basis of said selected compressing dictionary.

69. A data compressing method for coding inputted data to be compressed, comprising:
   coding said inputted data and outputting information of a quantity of the coded data;
   determining whether the quantity of the coded data is smaller than an original quantity before the coding; and
   selecting a compressing dictionary to be used among plural different kinds of compressing dictionaries according to whether the quantity of the coded data is smaller than the original quantity before the coding.

70. A data decompressing method for decoding inputted data to be decompressed, comprising:
   receiving dictionary use or non-use information on whether a decompressing dictionary is to be used or not when said inputted data is considered for decoding from a compressing side;
   deciding whether said decompressing dictionary is to be used according to said received dictionary use or non-use information;
   decoding said inputted data to produce coded data on the basis of said selected decompressing dictionary when it has been decided that said decompressing dictionary is to be used, and outputting the decoded inputted data; and
   outputting the same inputted data without decoding when decided said decompressing dictionary is not to be used at said deciding.

71. A data decompressing method for decoding compressed data to be decompressed, comprising:
   receiving selected dictionary information on a compressing dictionary selected on the basis of an extension of a file name of file data to be compressed from a compressing side having generated compressed file data;
   selecting a decompressing dictionary to be used among plural different kinds of decompressing dictionaries on the basis of said received selected dictionary information; and
   decoding said compressed file data on the basis of said selected decompressing dictionary.

72. A data decompressing method for decoding compressed data to decompress the same comprising:
   receiving selected dictionary information on a compressing dictionary selected as a compressing dictionary including specific character data of high occurrence frequency in data to be compressed from a compressing side having generated said compressed data;
   selecting a decompressing dictionary to be used among plural different kinds of decompressing dictionaries on the basis of said selected dictionary information received at said receiving; and
   decoding said compressed data on the basis of said selected decompressing dictionary.

73. A data decompressing method for decoding compressed data to be decompressed, comprising:
   receiving selected dictionary information on a compressing dictionary selected according to a determination of whether a quantity of compressed data is smaller than an original quantity before compressing from a compressing side having generated said compressed data;

selecting a decompressing dictionary to be used among plural different kinds of decompressing dictionaries on the basis of said selected dictionary information received at said receiving; and decoding said compressed data on the basis of said selected decompressing dictionary.

74. A data compressing or decompressing dictionary creating apparatus for creating a dictionary used when data to be compressed is compressed or compressed data is decompressed comprising:

a data dividing unit for dividing data for creating a dictionary into predetermined character data groups;

an occurrence frequency counting unit for counting an occurrence frequency of each of said character data groups obtained by said data dividing unit;

a high occurrence frequency character data group detecting unit for detecting a character data group whose occurrence frequency is higher than predetermined frequency on the basis of said occurrence frequency of each of said character data groups counted by said occurrence frequency counting unit;

a code assigning unit for assigning a predetermined code to said high occurrence frequency character group detected by said high occurrence frequency character group; and a dictionary generating unit for combining said high occurrence frequency character group with said code and outputting a combination thereof, thereby generating said dictionary;

wherein if said data for creating a dictionary is document-form data, said character group is a desired word in said document-form data, and said code assigning unit adds part-of-speech information of said word to said word.

75. A recording medium readable by a computer in which a data compressing program for coding inputted data to be compressed is recorded characterized in that said data compressing program makes said computer function as:

a compressing dictionary storing unit for storing a compressing dictionary usable to compress said inputted data;

a compressing dictionary use or non-use deciding unit for deciding whether said compressing dictionary is to be used or not when said inputted data is considered for coding; and a coding unit for coding said inputted data on the basis of said compressing dictionary when said compressing dictionary use or non-use deciding unit decides said compressing dictionary is to be used and outputting the coded data, and outputting the same inputted data without coding when said compressing dictionary use or non-use deciding unit decides said compressing dictionary is not to be used.

76. A recording medium readable by a computer in which a data compressing program for coding inputted data to be compressed is recorded characterized in that said data compressing program makes said computer function as:

a compressing dictionary storing unit for storing plural different kinds of compressing dictionaries usable to compress inputted file data to be compressed;

a compressing dictionary selecting unit for selecting a compressing dictionary to be used among said plural different kinds of compressing dictionaries on the basis of an extension of a file name of the file data; and a coding unit of coding said inputted file data on the basis of said compressing dictionary selected by said compressing dictionary selecting unit.

77. A recording medium readable by a computer in which a data compressing program for coding inputted data to be compressed is recorded characterized in that said data compressing program makes said computer function as:

a compressing dictionary storing unit for storing plural different kinds of compressing dictionaries usable to compress said inputted data;

a compressing dictionary selecting unit for selecting a compressing dictionary including high-ranked character data of high occurrence frequency in said inputted data among said plural different kinds of compressing dictionaries; and a coding unit for coding said inputted data on the basis of said compressing dictionary selected by said compressing dictionary selecting unit.

78. A recording medium readable by a computer in which a data compressing program for coding inputted data to be compressed is recorded characterized in that said data compressing program makes said computer function as:

a compressing dictionary storing unit for storing plural different kinds of compressing dictionaries usable to compress said inputted data;

a coding unit for coding said inputted data using any one of said plural different kinds of compressing dictionaries and outputting quantity information on a quantity of the coded data;

a determining unit for determining whether the quantity of the coded data is smaller than an original quantity before the coding based on the quantity information from said coding unit; and a compressing dictionary selecting unit for selecting a compressing dictionary to be used among said plural different kinds of compressing dictionaries according to the determination of said determining unit.

79. A recording medium readable by a computer in which a data decompressing program for decoding inputted data to be decompressed characterized in that said data decompressing program makes said computer function as:

a decompressing dictionary storing unit for storing a decompressing dictionary usable to decompress said inputted data;

a decompressing dictionary use or non-use deciding unit for deciding whether said decompressing dictionary is to be used or not when said inputted data is considered for decoding; and a decoding unit for decoding said inputted data on the basis of said compressing dictionary when said decompressing dictionary use or non-use deciding unit decided said decompressing dictionary is to be used and outputting the decoded data, and outputting the same inputted data without decoding when said decompressing dictionary use or non-use deciding unit decides said decompressing dictionary is not to be used.

80. A recording medium readable by a computer in which a data decompressing program for decoding compressed data to be decompressed characterized in that said data decompressing program makes said computer function as:

a decompressing dictionary storing unit for storing plural different kinds of decompressing dictionaries usable to decompress compressed file data to be decompressed;

a decompressing dictionary selecting unit for receiving selected dictionary information on a compressing dictionary selected on the basis of an extension of a file name of the file data from a compressing side having generated said compressed file data to select a decompressing dictionary to be used among said plural different kinds of decompressing dictionaries on the basis of said received selected dictionary information; and a decoding unit for decoding said compressed file data on the basis of said decompressing dictionary selected by said decompressing dictionary selecting unit.

81. A recording medium readable by a computer in which a data decompressing program for decoding compressed data to be decompressed characterized in that said data decompressing program makes said computer function as:

a decompressing dictionary storing unit for storing plural different kinds of decompressing dictionaries usable to decompress said compressed data;

a decompressing dictionary selecting unit for receiving selected dictionary information on a compressing dictionary selected as a compressing dictionary including high-ranked character data frequently occurring in data to be compressed from a compressing side having generated said compressed data to select a decompressing dictionary to be used among said plural different kinds of decompressing dictionaries on the basis of said received selected dictionary information; and a decoding unit for decoding said compressed data on the basis of said decompressing dictionary selected by said decompressing dictionary selecting unit.

82. A recording medium readable by a computer in which a data decompressing program for decoding compressed data to be decompressed characterized in that said data decompressing program makes said computer function as:

a decompressing dictionary storing unit for storing plural different kinds of decompressing dictionaries usable to decompress said compressed data;

a decompressing dictionary selecting unit for receiving selected dictionary information on a compressing dictionary selected according to a determination of whether a quantity of compressed data is smaller than an original quantity before compressing from a compressing side having generated said compressed data to select a decompressing dictionary to be used among said plural different kinds of decompressing dictionaries in the basis of said received selected dictionary information; and a decoding unit for decoding said compressed data on the basis of said decompressing dictionary selected by said decompressing dictionary selecting unit.

* * * * *